United States Patent
Jayanth et al.

(10) Patent No.: US 10,458,404 B2
(45) Date of Patent: *Oct. 29, 2019

(54) COMPRESSOR SENSOR MODULE

(71) Applicant: Emerson Climate Technologies, Inc., Sidney, OH (US)

(72) Inventors: Nagaraj Jayanth, Sidney, OH (US); Troy W. Renken, Camarillo, CA (US)

(73) Assignee: Emerson Climate Technologies, Inc., Sidney, OH (US)

( * ) Notice: Subject to any disclaimer, the term of this patent is extended or adjusted under 35 U.S.C. 154(b) by 558 days.

This patent is subject to a terminal disclaimer.

(21) Appl. No.: 14/949,090

(22) Filed: Nov. 23, 2015

(65) Prior Publication Data

US 2016/0076536 A1 Mar. 17, 2016

Related U.S. Application Data

(63) Continuation of application No. 13/770,123, filed on Feb. 19, 2013, now Pat. No. 9,194,894, which is a
(Continued)

(51) Int. Cl.
*F04B 51/00* (2006.01)
*G01R 21/133* (2006.01)
(Continued)

(52) U.S. Cl.
CPC .............. *F04B 51/00* (2013.01); *F04B 35/04* (2013.01); *F04B 39/121* (2013.01);
(Continued)

(58) Field of Classification Search
CPC ........ F04B 51/00; F04B 39/121; F04B 35/04; F04B 49/065; F04B 2203/021;
(Continued)

(56) References Cited

U.S. PATENT DOCUMENTS 2,054,542 A   9/1936  Hoelle
2,296,822 A   9/1942  Wolfert
(Continued)

FOREIGN PATENT DOCUMENTS

CA   1147440 A1   5/1983
CA   2528778 A1   12/2004
(Continued)

OTHER PUBLICATIONS

U.S. Appl. No. 15/450,404, Wallis et al.
(Continued)

*Primary Examiner* — Patrick Assouad
*Assistant Examiner* — Haidong Zhang
(74) *Attorney, Agent, or Firm* — Harness, Dickey & Pierce, P.L.C.

(57) ABSTRACT

A sensor module for a compressor having an electric motor connected to a power supply is provided. The sensor module includes: a first input connected to a first voltage sensor that generates a voltage signal corresponding to a voltage of the power supply; a second input connected to a first current sensor that generates a current signal corresponding to a current of the power supply; and a processor connected to the first and second inputs. The processor monitors the first and second inputs and, based on voltage measurements from the first input and current measurements from the second input, detects at least one of: (i) an unexpected variation of electric power from the power supply; and (ii) a mechanical malfunction. The processor is disposed within an electrical enclosure of the compressor, the electrical enclosure being configured to house electrical terminals for connecting the power supply to the electric motor.

25 Claims, 23 Drawing Sheets

Related U.S. Application Data continuation of application No. 12/261,643, filed on Oct. 30, 2008, now Pat. No. 9,140,728.

(60) Provisional application No. 60/984,902, filed on Nov. 2, 2007.

(51) Int. Cl.

| | |
|---|---|
| *F04B 49/06* | (2006.01) |
| *H02H 7/08* | (2006.01) |
| *F04D 27/00* | (2006.01) |
| *F04B 35/04* | (2006.01) |
| *F04B 39/12* | (2006.01) |
| *F04D 27/02* | (2006.01) |
| *G01R 21/00* | (2006.01) |

(52) U.S. Cl.
CPC .......... *F04B 49/065* (2013.01); *F04D 27/001* (2013.01); *F04D 27/02* (2013.01); *G01R 21/00* (2013.01); *G01R 21/133* (2013.01); *H02H 7/0822* (2013.01); *F04B 2203/0201* (2013.01); *F04B 2203/0202* (2013.01); *F04B 2203/0208* (2013.01)

(58) Field of Classification Search
CPC ..... F04B 2203/0208; F04B 2203/0202; G01R 21/133; G01R 21/00; F04D 27/001; F04D 27/02; H02H 7/0822
See application file for complete search history.

(56) References Cited

U.S. PATENT DOCUMENTS

| | | |
|---|---|---|
| 2,631,050 A | 3/1953 | Haeberlein |
| 2,804,839 A | 9/1957 | Hallinan |
| 2,961,606 A | 11/1960 | Mead |
| 2,962,702 A | 11/1960 | Derr et al. |
| 2,978,879 A | 4/1961 | Heidorn |
| 3,027,865 A | 4/1962 | Kautz et al. |
| 3,047,696 A | 7/1962 | Heidorn |
| 3,082,951 A | 3/1963 | Kayan |
| 3,107,843 A | 10/1963 | Finn |
| 3,170,304 A | 2/1965 | Hale |
| 3,232,519 A | 2/1966 | Long |
| 3,278,111 A | 10/1966 | Parker |
| 3,327,197 A | 6/1967 | Marquis |
| 3,400,374 A | 9/1968 | Schumann |
| 3,513,662 A | 5/1970 | Golber |
| 3,581,281 A | 5/1971 | Martin et al. |
| 3,585,451 A | 6/1971 | Day, III |
| 3,653,783 A | 4/1972 | Sauder |
| 3,660,718 A | 5/1972 | Pinckaers |
| 3,665,399 A | 5/1972 | Zehr et al. |
| 3,680,324 A | 8/1972 | Garland |
| 3,697,953 A | 10/1972 | Schoenwitz |
| 3,707,851 A | 1/1973 | McAshan, Jr. |
| 3,729,949 A | 5/1973 | Talbot |
| 3,735,377 A | 5/1973 | Kaufman |
| 3,742,302 A | 6/1973 | Neill |
| 3,742,303 A | 6/1973 | Dageford |
| 3,767,328 A | 10/1973 | Ladusaw |
| 3,777,240 A | 12/1973 | Neill |
| 3,783,681 A | 1/1974 | Hirt et al. |
| 3,820,074 A | 6/1974 | Toman |
| 3,882,305 A | 5/1975 | Johnstone |
| 3,924,972 A | 12/1975 | Szymaszek |
| 3,927,712 A | 12/1975 | Nakayama |
| 3,935,519 A | 1/1976 | Pfarrer et al. |
| 3,950,962 A | 4/1976 | Odashima |
| 3,960,011 A | 6/1976 | Renz et al. |
| 3,978,382 A | 8/1976 | Pfarrer et al. |
| 3,998,068 A | 12/1976 | Chirnside |
| 4,006,460 A | 2/1977 | Hewitt et al. |
| 4,014,182 A | 3/1977 | Granryd |
| 4,018,584 A | 4/1977 | Mullen |
| 4,019,172 A | 4/1977 | Srodes |
| 4,024,725 A | 5/1977 | Uchida et al. |
| 4,027,289 A | 5/1977 | Toman |
| 4,034,570 A | 7/1977 | Anderson et al. |
| 4,038,061 A | 7/1977 | Anderson et al. |
| 4,045,973 A | 9/1977 | Anderson et al. |
| 4,046,532 A | 9/1977 | Nelson |
| RE29,450 E | 10/1977 | Goldsby et al. |
| 4,060,716 A | 11/1977 | Pekrul et al. |
| 4,066,869 A | 1/1978 | Apaloo et al. |
| 4,090,248 A | 5/1978 | Swanson et al. |
| 4,102,150 A | 7/1978 | Kountz |
| 4,102,394 A | 7/1978 | Botts |
| 4,104,888 A | 8/1978 | Reedy et al. |
| 4,105,063 A | 8/1978 | Bergt |
| 4,112,703 A | 9/1978 | Kountz |
| 4,132,086 A | 1/1979 | Kountz |
| 4,136,730 A | 1/1979 | Kinsey |
| 4,137,057 A | 1/1979 | Piet et al. |
| 4,137,725 A | 2/1979 | Martin |
| 4,142,375 A | 3/1979 | Abe et al. |
| 4,143,707 A | 3/1979 | Lewis et al. |
| 4,146,085 A | 3/1979 | Wills |
| RE29,966 E | 4/1979 | Nussbaum |
| 4,151,725 A | 5/1979 | Kountz et al. |
| 4,153,003 A | 5/1979 | Willis |
| 4,156,350 A | 5/1979 | Elliott et al. |
| 4,161,106 A | 7/1979 | Savage et al. |
| 4,165,619 A | 8/1979 | Girard |
| 4,171,622 A | 10/1979 | Yamaguchi et al. |
| 4,173,871 A | 11/1979 | Brooks |
| 4,178,988 A | 12/1979 | Cann et al. |
| RE30,242 E | 4/1980 | del Toro et al. |
| 4,197,717 A | 4/1980 | Schumacher |
| 4,205,381 A | 5/1980 | Games et al. |
| 4,209,994 A | 7/1980 | Mueller et al. |
| 4,211,089 A | 7/1980 | Mueller et al. |
| 4,217,761 A | 8/1980 | Cornaire et al. |
| 4,220,010 A | 9/1980 | Mueller et al. |
| 4,227,862 A | 10/1980 | Andrew et al. |
| 4,232,530 A | 11/1980 | Mueller |
| 4,233,818 A | 11/1980 | Lastinger |
| 4,236,379 A | 12/1980 | Mueller |
| 4,244,182 A | 1/1981 | Behr |
| 4,246,763 A | 1/1981 | Mueller et al. |
| 4,248,051 A | 2/1981 | Darcy et al. |
| 4,251,988 A | 2/1981 | Allard et al. |
| 4,257,795 A | 3/1981 | Shaw |
| 4,259,847 A | 4/1981 | Pearse, Jr. |
| 4,267,702 A | 5/1981 | Houk |
| 4,270,174 A | 5/1981 | Karlin et al. |
| 4,271,898 A | 6/1981 | Freeman |
| 4,281,358 A | 7/1981 | Plouffe et al. |
| 4,284,849 A | 8/1981 | Anderson et al. |
| 4,286,438 A | 9/1981 | Clarke |
| 4,290,480 A | 9/1981 | Sulkowski |
| 4,296,727 A | 10/1981 | Bryan |
| 4,301,660 A | 11/1981 | Mueller et al. |
| 4,306,293 A | 12/1981 | Marathe |
| 4,307,775 A | 12/1981 | Saunders et al. |
| 4,308,725 A | 1/1982 | Chiyoda |
| 4,311,188 A | 1/1982 | Kojima et al. |
| 4,319,461 A | 3/1982 | Shaw |
| 4,321,529 A | 3/1982 | Simmonds et al. |
| 4,325,223 A | 4/1982 | Cantley |
| 4,328,678 A | 5/1982 | Kono et al. |
| 4,328,680 A | 5/1982 | Stamp, Jr. et al. |
| 4,333,316 A | 6/1982 | Stamp, Jr. et al. |
| 4,333,317 A | 6/1982 | Sawyer |
| 4,336,001 A | 6/1982 | Andrew et al. |
| 4,338,790 A | 7/1982 | Saunders et al. |
| 4,338,791 A | 7/1982 | Stamp, Jr. et al. |
| 4,345,162 A | 8/1982 | Hammer et al. |
| 4,346,755 A | 8/1982 | Alley et al. |
| 4,350,021 A | 9/1982 | Lundstrom |
| 4,350,023 A | 9/1982 | Kuwabara et al. |
| 4,351,163 A | 9/1982 | Johannsen |
| 4,356,703 A | 11/1982 | Vogel |

(56) References Cited

U.S. PATENT DOCUMENTS

| | | |
|---|---|---|
| 4,361,273 A | 11/1982 | Levine et al. |
| 4,365,983 A | 12/1982 | Abraham et al. |
| 4,370,098 A | 1/1983 | McClain et al. |
| 4,372,119 A | 2/1983 | Gillbrand et al. |
| 4,381,549 A | 4/1983 | Stamp, Jr. et al. |
| 4,382,367 A | 5/1983 | Roberts |
| 4,384,462 A | 5/1983 | Overman et al. |
| 4,387,368 A | 6/1983 | Day, III et al. |
| 4,387,578 A | 6/1983 | Paddock |
| 4,390,058 A | 6/1983 | Otake et al. |
| 4,390,321 A | 6/1983 | Langlois et al. |
| 4,390,922 A | 6/1983 | Pelliccia |
| 4,395,886 A | 8/1983 | Mayer |
| 4,395,887 A | 8/1983 | Sweetman |
| 4,399,548 A | 8/1983 | Castleberry |
| 4,402,054 A | 8/1983 | Osborne et al. |
| 4,406,133 A | 9/1983 | Saunders et al. |
| 4,407,138 A | 10/1983 | Mueller |
| 4,408,660 A | 10/1983 | Sutoh et al. |
| 4,412,788 A | 11/1983 | Shaw et al. |
| 4,415,896 A | 11/1983 | Allgood |
| 4,418,388 A | 11/1983 | Allgor et al. |
| 4,420,947 A | 12/1983 | Yoshino |
| 4,425,010 A | 1/1984 | Bryant et al. |
| 4,429,578 A | 2/1984 | Darrel et al. |
| 4,432,232 A | 2/1984 | Brantley et al. |
| 4,434,390 A | 2/1984 | Elms |
| 4,441,329 A | 4/1984 | Dawley |
| 4,448,038 A | 5/1984 | Barbier |
| 4,449,375 A | 5/1984 | Briccetti |
| 4,451,929 A | 5/1984 | Yoshida |
| 4,460,123 A | 7/1984 | Beverly |
| 4,463,571 A | 8/1984 | Wiggs |
| 4,463,574 A | 8/1984 | Spethmann et al. |
| 4,463,576 A | 8/1984 | Burnett et al. |
| 4,465,229 A | 8/1984 | Kompelien |
| 4,467,230 A | 8/1984 | Rovinsky |
| 4,467,385 A | 8/1984 | Bandoli et al. |
| 4,467,613 A | 8/1984 | Behr et al. |
| 4,470,092 A | 9/1984 | Lombardi |
| 4,470,266 A | 9/1984 | Briccetti et al. |
| 4,474,024 A | 10/1984 | Eplett et al. |
| 4,474,542 A | 10/1984 | Kato et al. |
| 4,479,389 A | 10/1984 | Anderson, III et al. |
| 4,484,452 A | 11/1984 | Houser, Jr. |
| 4,489,551 A | 12/1984 | Watanabe et al. |
| 4,490,986 A | 1/1985 | Paddock |
| 4,494,383 A | 1/1985 | Nagatomo et al. |
| 4,495,779 A | 1/1985 | Tanaka et al. |
| 4,496,296 A | 1/1985 | Arai et al. |
| 4,497,031 A | 1/1985 | Froehling et al. |
| 4,498,310 A | 2/1985 | Imanishi et al. |
| 4,499,739 A | 2/1985 | Matsuoka et al. |
| 4,502,084 A | 2/1985 | Hannett |
| 4,502,833 A | 3/1985 | Hibino et al. |
| 4,502,842 A | 3/1985 | Currier et al. |
| 4,502,843 A | 3/1985 | Martin |
| 4,505,125 A | 3/1985 | Baglione |
| 4,506,518 A | 3/1985 | Yoshikawa et al. |
| 4,507,934 A | 4/1985 | Tanaka et al. |
| 4,510,547 A | 4/1985 | Rudich, Jr. |
| 4,510,576 A | 4/1985 | MacArthur et al. |
| 4,512,161 A | 4/1985 | Logan et al. |
| 4,516,407 A | 5/1985 | Watabe |
| 4,517,468 A | 5/1985 | Kemper et al. |
| 4,520,674 A | 6/1985 | Canada et al. |
| 4,523,435 A | 6/1985 | Lord |
| 4,523,436 A | 6/1985 | Schedel et al. |
| 4,527,247 A | 7/1985 | Kaiser et al. |
| 4,527,399 A | 7/1985 | Lord |
| 4,535,607 A | 8/1985 | Mount |
| 4,538,420 A | 9/1985 | Nelson |
| 4,538,422 A | 9/1985 | Mount et al. |
| 4,539,820 A | 9/1985 | Zinsmeyer |
| 4,540,040 A | 9/1985 | Fukumoto et al. |
| 4,545,210 A | 10/1985 | Lord |
| 4,545,214 A | 10/1985 | Kinoshita |
| 4,548,549 A | 10/1985 | Murphy et al. |
| 4,549,403 A | 10/1985 | Lord et al. |
| 4,549,404 A | 10/1985 | Lord |
| 4,550,770 A | 11/1985 | Nussdorfer et al. |
| 4,553,400 A | 11/1985 | Branz |
| 4,555,057 A | 11/1985 | Foster |
| 4,555,910 A | 12/1985 | Sturges |
| 4,557,317 A | 12/1985 | Harmon, Jr. |
| 4,558,181 A | 12/1985 | Blanchard et al. |
| 4,561,260 A | 12/1985 | Nishi et al. |
| 4,563,624 A | 1/1986 | Yu |
| 4,563,877 A | 1/1986 | Harnish |
| 4,563,878 A | 1/1986 | Baglione |
| 4,567,733 A | 2/1986 | Mecozzi |
| 4,568,909 A | 2/1986 | Whynacht |
| 4,574,871 A | 3/1986 | Parkinson et al. |
| 4,575,318 A | 3/1986 | Blain |
| 4,577,977 A | 3/1986 | Pejsa |
| 4,580,947 A | 4/1986 | Shibata et al. |
| 4,583,373 A | 4/1986 | Shaw |
| 4,589,060 A | 5/1986 | Zinsmeyer |
| 4,593,367 A | 6/1986 | Slack et al. |
| 4,598,764 A | 7/1986 | Beckey |
| 4,602,484 A | 7/1986 | Bendikson |
| 4,603,556 A | 8/1986 | Suefuji et al. |
| 4,604,036 A | 8/1986 | Sutou et al. |
| 4,611,470 A | 9/1986 | Enstrom |
| 4,612,775 A | 9/1986 | Branz et al. |
| 4,614,089 A | 9/1986 | Dorsey |
| 4,617,804 A | 10/1986 | Fukushima et al. |
| 4,620,286 A | 10/1986 | Smith et al. |
| 4,620,424 A | 11/1986 | Tanaka et al. |
| 4,621,502 A | 11/1986 | Ibrahim et al. |
| 4,626,753 A | 12/1986 | Letterman |
| 4,627,245 A | 12/1986 | Levine |
| 4,627,483 A | 12/1986 | Harshbarger, III et al. |
| 4,627,484 A | 12/1986 | Harshbarger, Jr. et al. |
| 4,630,572 A | 12/1986 | Evans |
| 4,630,670 A | 12/1986 | Wellman et al. |
| 4,642,034 A | 2/1987 | Terauchi |
| 4,642,782 A | 2/1987 | Kemper et al. |
| 4,644,479 A | 2/1987 | Kemper et al. |
| 4,646,532 A | 3/1987 | Nose |
| 4,648,044 A | 3/1987 | Hardy et al. |
| 4,649,515 A | 3/1987 | Thompson et al. |
| 4,649,710 A | 3/1987 | Inoue et al. |
| 4,653,280 A | 3/1987 | Hansen et al. |
| 4,653,285 A | 3/1987 | Pohl |
| 4,655,688 A | 4/1987 | Bohn et al. |
| 4,660,386 A | 4/1987 | Hansen et al. |
| 4,662,184 A | 5/1987 | Pohl et al. |
| 4,674,292 A | 6/1987 | Ohya et al. |
| 4,677,830 A | 7/1987 | Sumikawa et al. |
| 4,680,940 A | 7/1987 | Vaughn |
| 4,682,473 A | 7/1987 | Rogers, III |
| 4,684,060 A | 8/1987 | Adams et al. |
| 4,685,615 A | 8/1987 | Hart |
| 4,686,835 A | 8/1987 | Alsenz |
| 4,689,967 A | 9/1987 | Han et al. |
| 4,697,431 A | 10/1987 | Alsenz |
| 4,698,978 A | 10/1987 | Jones |
| 4,698,981 A | 10/1987 | Kaneko et al. |
| 4,701,824 A | 10/1987 | Beggs et al. |
| 4,703,325 A | 10/1987 | Chamberlin et al. |
| 4,706,152 A | 11/1987 | DeFilippis et al. |
| 4,706,469 A | 11/1987 | Oguni et al. |
| 4,712,648 A | 12/1987 | Mattes et al. |
| 4,713,717 A | 12/1987 | Pejouhy et al. |
| 4,715,190 A | 12/1987 | Han et al. |
| 4,715,792 A | 12/1987 | Nishizawa et al. |
| 4,716,582 A | 12/1987 | Blanchard et al. |
| 4,716,957 A | 1/1988 | Thompson et al. |
| 4,720,980 A | 1/1988 | Howland |
| 4,722,018 A | 1/1988 | Pohl |
| 4,722,019 A | 1/1988 | Pohl |
| 4,724,678 A | 2/1988 | Pohl |
| 4,735,054 A | 4/1988 | Beckey |

(56) References Cited

U.S. PATENT DOCUMENTS

| | | |
|---|---|---|
| 4,735,060 A | 4/1988 | Alsenz |
| 4,744,223 A | 5/1988 | Umezu |
| 4,745,765 A | 5/1988 | Pettitt |
| 4,745,766 A | 5/1988 | Bahr |
| 4,745,767 A | 5/1988 | Ohya et al. |
| 4,750,332 A | 6/1988 | Jenski et al. |
| 4,750,672 A | 6/1988 | Beckey et al. |
| 4,751,501 A | 6/1988 | Gut |
| 4,751,825 A | 6/1988 | Voorhis et al. |
| 4,754,410 A | 6/1988 | Leech et al. |
| 4,755,957 A | 7/1988 | White et al. |
| 4,765,150 A | 8/1988 | Persem |
| 4,768,346 A | 9/1988 | Mathur |
| 4,768,348 A | 9/1988 | Noguchi |
| 4,783,752 A | 11/1988 | Kaplan et al. |
| 4,787,213 A | 11/1988 | Gras et al. |
| 4,790,142 A | 12/1988 | Beckey |
| 4,796,142 A | 1/1989 | Libert |
| 4,796,466 A | 1/1989 | Farmer |
| 4,798,055 A | 1/1989 | Murray et al. |
| 4,805,118 A | 2/1989 | Rishel |
| 4,807,445 A | 2/1989 | Matsuoka et al. |
| 4,829,779 A | 5/1989 | Munson et al. |
| 4,831,560 A | 5/1989 | Zaleski |
| 4,831,832 A | 5/1989 | Alsenz |
| 4,831,833 A | 5/1989 | Duenes et al. |
| 4,835,706 A | 5/1989 | Asahi |
| 4,835,980 A | 6/1989 | Oyanagi et al. |
| 4,838,037 A | 6/1989 | Wood |
| 4,841,734 A | 6/1989 | Torrence |
| 4,843,575 A | 6/1989 | Crane |
| 4,845,956 A | 7/1989 | Berntsen et al. |
| 4,848,099 A | 7/1989 | Beckey et al. |
| 4,848,100 A | 7/1989 | Barthel et al. |
| 4,850,198 A | 7/1989 | Helt et al. |
| 4,850,204 A | 7/1989 | Bos et al. |
| 4,852,363 A | 8/1989 | Kampf et al. |
| 4,853,693 A | 8/1989 | Eaton-Williams |
| 4,856,286 A | 8/1989 | Sulfstede et al. |
| 4,858,676 A | 8/1989 | Bolfik et al. |
| 4,866,635 A | 9/1989 | Kahn et al. |
| 4,866,944 A | 9/1989 | Yamazaki |
| 4,869,073 A | 9/1989 | Kawai et al. |
| 4,873,836 A | 10/1989 | Thompson |
| 4,875,589 A | 10/1989 | Lacey et al. |
| 4,878,355 A | 11/1989 | Beckey et al. |
| 4,881,184 A | 11/1989 | Abegg, III et al. |
| 4,882,747 A | 11/1989 | Williams |
| 4,882,908 A | 11/1989 | White |
| 4,884,412 A | 12/1989 | Sellers et al. |
| 4,885,707 A | 12/1989 | Nichol et al. |
| 4,885,914 A | 12/1989 | Pearman |
| 4,887,436 A | 12/1989 | Enomoto et al. |
| 4,887,857 A | 12/1989 | VanOmmeren |
| 4,889,280 A | 12/1989 | Grald et al. |
| 4,893,480 A | 1/1990 | Matsui et al. |
| 4,899,551 A | 2/1990 | Weintraub |
| 4,903,500 A | 2/1990 | Hanson |
| 4,903,759 A | 2/1990 | Lapeyrouse |
| 4,904,993 A | 2/1990 | Sato |
| 4,909,041 A | 3/1990 | Jones |
| 4,909,076 A | 3/1990 | Busch et al. |
| 4,910,966 A | 3/1990 | Levine et al. |
| 4,913,625 A | 4/1990 | Gerlowski |
| 4,916,633 A | 4/1990 | Tychonievich et al. |
| 4,916,909 A | 4/1990 | Mathur et al. |
| 4,916,912 A | 4/1990 | Levine et al. |
| 4,918,690 A | 4/1990 | Markkula, Jr. et al. |
| 4,918,932 A | 4/1990 | Gustafson et al. |
| 4,924,404 A | 5/1990 | Reinke, Jr. |
| 4,924,418 A | 5/1990 | Bachman et al. |
| 4,928,750 A | 5/1990 | Nurczyk |
| 4,932,588 A | 6/1990 | Fedter et al. |
| 4,939,909 A | 7/1990 | Tsuchiyama et al. |
| 4,943,003 A | 7/1990 | Shimizu et al. |
| 4,944,160 A | 7/1990 | Malone et al. |
| 4,945,491 A | 7/1990 | Rishel |
| 4,948,040 A | 8/1990 | Kobayashi et al. |
| 4,949,550 A | 8/1990 | Hanson |
| 4,953,784 A | 9/1990 | Yasufuku et al. |
| 4,959,970 A | 10/1990 | Meckler |
| 4,964,060 A | 10/1990 | Hartsog |
| 4,964,125 A | 10/1990 | Kim |
| 4,966,006 A | 10/1990 | Thuesen et al. |
| 4,967,567 A | 11/1990 | Proctor et al. |
| 4,970,496 A | 11/1990 | Kirkpatrick |
| 4,974,427 A | 12/1990 | Diab |
| 4,974,665 A | 12/1990 | Zillner, Jr. |
| 4,975,024 A | 12/1990 | Heckel |
| 4,977,751 A | 12/1990 | Hanson |
| 4,985,857 A | 1/1991 | Bajpai et al. |
| 4,987,748 A | 1/1991 | Meckler |
| 4,990,057 A | 2/1991 | Rollins |
| 4,990,893 A | 2/1991 | Kiluk |
| 4,991,770 A | 2/1991 | Bird et al. |
| 5,000,009 A | 3/1991 | Clanin |
| 5,005,365 A | 4/1991 | Lynch |
| 5,009,074 A | 4/1991 | Goubeaux et al. |
| 5,009,075 A | 4/1991 | Okoren |
| 5,009,076 A | 4/1991 | Winslow |
| 5,018,357 A | 5/1991 | Livingstone et al. |
| 5,018,665 A | 5/1991 | Sulmone |
| RE33,620 E | 6/1991 | Persem |
| 5,022,234 A | 6/1991 | Goubeaux et al. |
| 5,039,009 A | 8/1991 | Baldwin et al. |
| 5,042,264 A | 8/1991 | Dudley |
| 5,051,720 A | 9/1991 | Kittirutsunetorn |
| 5,054,294 A | 10/1991 | Dudley |
| 5,056,036 A | 10/1991 | Van Bork |
| 5,056,329 A | 10/1991 | Wilkinson |
| 5,058,388 A | 10/1991 | Shaw et al. |
| 5,062,278 A | 11/1991 | Sugiyama |
| 5,065,593 A | 11/1991 | Dudley et al. |
| 5,067,099 A | 11/1991 | McCown et al. |
| RE33,775 E | 12/1991 | Behr et al. |
| 5,070,468 A | 12/1991 | Niinomi et al. |
| 5,071,065 A | 12/1991 | Aalto et al. |
| 5,073,091 A | 12/1991 | Burgess et al. |
| 5,073,862 A | 12/1991 | Carlson |
| 5,076,067 A | 12/1991 | Prenger et al. |
| 5,076,494 A | 12/1991 | Ripka |
| 5,077,983 A | 1/1992 | Dudley |
| 5,083,438 A | 1/1992 | McMullin |
| 5,086,385 A | 2/1992 | Launey et al. |
| 5,088,297 A | 2/1992 | Maruyama et al. |
| 5,094,086 A | 3/1992 | Shyu |
| 5,095,712 A | 3/1992 | Narreau |
| 5,095,715 A | 3/1992 | Dudley |
| 5,099,654 A | 3/1992 | Baruschke et al. |
| 5,103,391 A | 4/1992 | Barrett |
| 5,107,500 A | 4/1992 | Wakamoto et al. |
| 5,109,222 A | 4/1992 | Welty |
| 5,109,676 A | 5/1992 | Waters et al. |
| 5,109,700 A | 5/1992 | Hicho |
| 5,109,916 A | 5/1992 | Thompson |
| 5,115,406 A | 5/1992 | Zatezalo et al. |
| 5,115,643 A | 5/1992 | Hayata et al. |
| 5,115,644 A | 5/1992 | Alsenz |
| 5,115,967 A | 5/1992 | Wedekind |
| 5,118,260 A | 6/1992 | Fraser, Jr. |
| 5,119,466 A | 6/1992 | Suzuki |
| 5,119,637 A | 6/1992 | Bard et al. |
| 5,121,610 A | 6/1992 | Atkinson et al. |
| 5,123,017 A | 6/1992 | Simpkins et al. |
| 5,123,252 A | 6/1992 | Hanson |
| 5,123,253 A | 6/1992 | Hanson et al. |
| 5,123,255 A | 6/1992 | Ohizumi |
| 5,125,067 A | 6/1992 | Erdman |
| 5,127,232 A | 7/1992 | Paige et al. |
| 5,131,237 A | 7/1992 | Valbjorn |
| 5,136,855 A | 8/1992 | Lenarduzzi |
| 5,140,394 A | 8/1992 | Cobb, III et al. |
| 5,141,407 A | 8/1992 | Ramsey et al. |
| 5,142,877 A | 9/1992 | Shimizu |

(56) References Cited

U.S. PATENT DOCUMENTS

| | | |
|---|---|---|
| 5,150,584 A | 9/1992 | Tomasov et al. |
| 5,156,539 A | 10/1992 | Anderson et al. |
| 5,167,494 A | 12/1992 | Inagaki et al. |
| 5,170,935 A | 12/1992 | Federspiel et al. |
| 5,170,936 A | 12/1992 | Kubo et al. |
| 5,181,389 A | 1/1993 | Hanson et al. |
| 5,186,014 A | 2/1993 | Runk |
| 5,197,666 A | 3/1993 | Wedekind |
| 5,199,855 A | 4/1993 | Nakajima et al. |
| 5,200,872 A | 4/1993 | D'Entremont et al. |
| 5,200,987 A | 4/1993 | Gray |
| 5,201,862 A | 4/1993 | Pettitt |
| 5,203,178 A | 4/1993 | Shyu |
| 5,203,179 A | 4/1993 | Powell |
| 5,209,076 A | 5/1993 | Kauffman et al. |
| 5,209,400 A | 5/1993 | Winslow et al. |
| 5,219,041 A | 6/1993 | Greve |
| 5,224,354 A | 7/1993 | Ito et al. |
| 5,224,835 A | 7/1993 | Oltman |
| 5,226,472 A | 7/1993 | Benevelli et al. |
| 5,228,300 A | 7/1993 | Shim |
| 5,228,304 A | 7/1993 | Ryan |
| 5,228,307 A | 7/1993 | Koce |
| 5,230,223 A | 7/1993 | Hullar et al. |
| 5,231,844 A | 8/1993 | Park |
| 5,233,841 A | 8/1993 | Jyrek |
| 5,235,526 A | 8/1993 | Saffell |
| 5,237,830 A | 8/1993 | Grant |
| 5,241,664 A | 8/1993 | Ohba et al. |
| 5,241,833 A | 9/1993 | Ohkoshi |
| 5,243,827 A | 9/1993 | Hagita et al. |
| 5,243,829 A | 9/1993 | Bessler |
| 5,245,833 A | 9/1993 | Mei et al. |
| 5,248,244 A | 9/1993 | Ho et al. |
| 5,251,453 A | 10/1993 | Stanke et al. |
| 5,251,454 A | 10/1993 | Yoon |
| 5,255,977 A | 10/1993 | Eimer et al. |
| 5,257,506 A | 11/1993 | DeWolf et al. |
| 5,262,704 A | 11/1993 | Farr |
| 5,265,434 A | 11/1993 | Alsenz |
| 5,269,458 A | 12/1993 | Sol |
| 5,271,556 A | 12/1993 | Helt et al. |
| 5,274,571 A | 12/1993 | Hesse et al. |
| 5,276,630 A | 1/1994 | Baldwin et al. |
| 5,279,458 A | 1/1994 | DeWolf et al. |
| 5,282,728 A | 2/1994 | Swain |
| 5,284,026 A | 2/1994 | Powell |
| 5,285,646 A | 2/1994 | TaeDuk |
| 5,289,362 A | 2/1994 | Liebl et al. |
| 5,290,154 A | 3/1994 | Kotlarek et al. |
| 5,291,752 A | 3/1994 | Alvarez et al. |
| 5,299,504 A | 4/1994 | Abele |
| 5,303,112 A | 4/1994 | Zulaski et al. |
| 5,303,560 A | 4/1994 | Hanson et al. |
| 5,311,451 A | 5/1994 | Barrett |
| 5,311,562 A | 5/1994 | Palusamy et al. |
| 5,316,448 A | 5/1994 | Ziegler et al. |
| 5,320,506 A | 6/1994 | Fogt |
| 5,333,460 A | 8/1994 | Lewis et al. |
| 5,335,507 A | 8/1994 | Powell |
| 5,336,058 A | 8/1994 | Yokoyama |
| 5,337,576 A | 8/1994 | Dorfman et al. |
| 5,347,476 A | 9/1994 | McBean, Sr. |
| 5,351,037 A | 9/1994 | Martell et al. |
| 5,362,206 A | 11/1994 | Westerman et al. |
| 5,362,211 A | 11/1994 | Iizuka et al. |
| 5,368,446 A | 11/1994 | Rode |
| 5,369,958 A | 12/1994 | Kasai et al. |
| 5,381,669 A | 1/1995 | Bahel et al. |
| 5,381,692 A | 1/1995 | Winslow et al. |
| 5,388,176 A | 2/1995 | Dykstra et al. |
| 5,395,042 A | 3/1995 | Riley et al. |
| 5,410,230 A | 4/1995 | Bessler et al. |
| 5,414,792 A | 5/1995 | Shorey |
| 5,415,008 A | 5/1995 | Bessler |
| 5,416,781 A | 5/1995 | Ruiz |
| 5,423,190 A | 6/1995 | Friedland |
| 5,423,192 A | 6/1995 | Young et al. |
| 5,426,952 A | 6/1995 | Bessler |
| 5,431,026 A | 7/1995 | Jaster |
| 5,432,500 A | 7/1995 | Scripps |
| 5,435,145 A | 7/1995 | Jaster |
| 5,440,890 A | 8/1995 | Bahel et al. |
| 5,440,891 A | 8/1995 | Hindmon, Jr. et al. |
| 5,440,895 A | 8/1995 | Bahel et al. |
| 5,446,677 A | 8/1995 | Jensen et al. |
| 5,450,359 A | 9/1995 | Sharma et al. |
| 5,452,291 A | 9/1995 | Eisenhandler et al. |
| 5,454,229 A | 10/1995 | Hanson et al. |
| 5,457,965 A | 10/1995 | Blair et al. |
| 5,460,006 A | 10/1995 | Torimitsu |
| 5,467,011 A | 11/1995 | Hunt |
| 5,467,264 A | 11/1995 | Rauch et al. |
| 5,469,045 A | 11/1995 | Dove et al. |
| 5,475,986 A | 12/1995 | Bahel et al. |
| 5,478,212 A | 12/1995 | Sakai et al. |
| 5,481,481 A | 1/1996 | Frey et al. |
| 5,481,884 A | 1/1996 | Scoccia |
| 5,483,141 A | 1/1996 | Uesugi |
| 5,491,978 A | 2/1996 | Young et al. |
| 5,495,722 A | 3/1996 | Manson et al. |
| 5,499,512 A | 3/1996 | Jurewicz et al. |
| 5,509,786 A | 4/1996 | Mizutani et al. |
| 5,511,387 A | 4/1996 | Tinsler |
| 5,512,883 A | 4/1996 | Lane, Jr. |
| 5,515,267 A | 5/1996 | Alsenz |
| 5,515,692 A | 5/1996 | Sterber et al. |
| 5,519,301 A | 5/1996 | Yoshida et al. |
| 5,519,337 A | 5/1996 | Casada |
| 5,528,908 A | 6/1996 | Bahel et al. |
| 5,533,347 A | 7/1996 | Ott et al. |
| 5,535,136 A | 7/1996 | Standifer |
| 5,535,597 A | 7/1996 | An |
| 5,546,015 A | 8/1996 | Okabe |
| 5,546,073 A | 8/1996 | Duff et al. |
| 5,546,756 A | 8/1996 | Ali |
| 5,546,757 A | 8/1996 | Whipple, III |
| 5,548,966 A | 8/1996 | Tinsler |
| 5,555,195 A | 9/1996 | Jensen et al. |
| 5,562,426 A | 10/1996 | Watanabe et al. |
| 5,563,490 A | 10/1996 | Kawaguchi et al. |
| 5,564,280 A | 10/1996 | Schilling et al. |
| 5,566,084 A | 10/1996 | Cmar |
| 5,570,085 A | 10/1996 | Bertsch |
| 5,570,258 A | 10/1996 | Manning |
| 5,572,643 A | 11/1996 | Judson |
| 5,577,905 A | 11/1996 | Momber et al. |
| 5,579,648 A | 12/1996 | Hanson et al. |
| 5,581,229 A | 12/1996 | Hunt |
| 5,586,445 A | 12/1996 | Bessler |
| 5,586,446 A | 12/1996 | Torimitsu |
| 5,590,830 A | 1/1997 | Kettler et al. |
| 5,592,058 A | 1/1997 | Archer et al. |
| 5,592,824 A | 1/1997 | Sogabe et al. |
| 5,596,507 A | 1/1997 | Jones et al. |
| 5,600,960 A | 2/1997 | Schwedler et al. |
| 5,602,749 A | 2/1997 | Vosburgh |
| 5,602,757 A | 2/1997 | Haseley et al. |
| 5,602,761 A | 2/1997 | Spoerre et al. |
| 5,610,339 A | 3/1997 | Haseley et al. |
| 5,611,674 A | 3/1997 | Bass et al. |
| 5,613,841 A | 3/1997 | Bass et al. |
| 5,616,829 A | 4/1997 | Balaschak et al. |
| 5,623,834 A | 4/1997 | Bahel et al. |
| 5,628,201 A | 5/1997 | Bahel et al. |
| 5,630,325 A | 5/1997 | Bahel et al. |
| 5,635,896 A | 6/1997 | Tinsley et al. |
| 5,641,270 A | 6/1997 | Sgourakes et al. |
| 5,643,482 A | 7/1997 | Sandelman et al. |
| 5,650,936 A | 7/1997 | Loucks et al. |
| 5,651,263 A | 7/1997 | Nonaka et al. |
| 5,655,379 A | 8/1997 | Jaster et al. |
| 5,655,380 A | 8/1997 | Calton |
| 5,656,765 A | 8/1997 | Gray |

(56) References Cited

U.S. PATENT DOCUMENTS

| | | |
|---|---|---|
| 5,666,815 A | 9/1997 | Aloise |
| 5,682,949 A | 11/1997 | Ratcliffe et al. |
| 5,684,463 A | 11/1997 | Diercks et al. |
| 5,689,963 A | 11/1997 | Bahel et al. |
| 5,691,692 A | 11/1997 | Herbstritt |
| 5,694,010 A | 12/1997 | Oomura et al. |
| 5,696,501 A | 12/1997 | Ouellette et al. |
| 5,699,670 A | 12/1997 | Jurewicz et al. |
| 5,706,007 A | 1/1998 | Fragnito et al. |
| 5,707,210 A | 1/1998 | Ramsey et al. |
| 5,711,785 A | 1/1998 | Maxwell |
| 5,713,724 A | 2/1998 | Centers et al. |
| 5,714,931 A | 2/1998 | Petite et al. |
| 5,715,704 A | 2/1998 | Cholkeri et al. |
| 5,718,822 A | 2/1998 | Richter |
| 5,724,571 A | 3/1998 | Woods |
| 5,729,474 A | 3/1998 | Hildebrand et al. |
| 5,737,931 A | 4/1998 | Ueno et al. |
| 5,741,120 A | 4/1998 | Bass et al. |
| 5,743,109 A | 4/1998 | Schulak |
| 5,745,114 A | 4/1998 | King et al. |
| 5,749,238 A | 5/1998 | Schmidt |
| 5,751,916 A | 5/1998 | Kon et al. |
| 5,752,385 A | 5/1998 | Nelson |
| 5,754,450 A | 5/1998 | Solomon et al. |
| 5,754,732 A | 5/1998 | Vlahu |
| 5,757,664 A | 5/1998 | Rogers et al. |
| 5,757,892 A | 5/1998 | Blanchard et al. |
| 5,761,083 A | 6/1998 | Brown, Jr. et al. |
| 5,764,509 A | 6/1998 | Gross et al. |
| 5,772,214 A | 6/1998 | Stark |
| 5,772,403 A | 6/1998 | Allison et al. |
| 5,782,101 A | 7/1998 | Dennis |
| 5,784,232 A | 7/1998 | Farr |
| 5,790,898 A | 8/1998 | Kishima et al. |
| 5,795,381 A | 8/1998 | Holder |
| 5,798,941 A | 8/1998 | McLeister |
| 5,802,860 A | 9/1998 | Barrows |
| 5,805,856 A | 9/1998 | Hanson |
| 5,807,336 A | 9/1998 | Russo et al. |
| 5,808,441 A | 9/1998 | Nehring |
| 5,810,908 A | 9/1998 | Gray et al. |
| 5,812,061 A | 9/1998 | Simons |
| 5,825,597 A | 10/1998 | Young |
| 5,827,963 A | 10/1998 | Selegatto et al. |
| 5,839,094 A | 11/1998 | French |
| 5,839,291 A | 11/1998 | Chang et al. |
| 5,841,654 A | 11/1998 | Verissimo et al. |
| 5,860,286 A | 1/1999 | Tulpule |
| 5,861,807 A | 1/1999 | Leyden et al. |
| 5,867,998 A | 2/1999 | Guertin |
| 5,869,960 A | 2/1999 | Brand |
| 5,873,257 A | 2/1999 | Peterson |
| 5,875,430 A | 2/1999 | Koether |
| 5,875,638 A | 3/1999 | Tinsler |
| 5,884,494 A | 3/1999 | Okoren et al. |
| 5,887,786 A | 3/1999 | Sandelman |
| 5,900,801 A | 5/1999 | Heagle et al. |
| 5,904,049 A | 5/1999 | Jaster et al. |
| 5,918,200 A | 6/1999 | Tsutsui et al. |
| 5,924,295 A | 7/1999 | Park |
| 5,924,486 A | 7/1999 | Ehlers et al. |
| 5,926,103 A | 7/1999 | Petite |
| 5,926,531 A | 7/1999 | Petite |
| 5,930,773 A | 7/1999 | Crooks et al. |
| 5,934,087 A | 8/1999 | Watanabe et al. |
| 5,939,974 A | 8/1999 | Heagle et al. |
| 5,946,922 A | 9/1999 | Viard et al. |
| 5,947,693 A | 9/1999 | Yang |
| 5,947,701 A | 9/1999 | Hugenroth |
| 5,949,677 A | 9/1999 | Ho |
| 5,950,443 A | 9/1999 | Meyer et al. |
| 5,953,490 A | 9/1999 | Wiklund et al. |
| 5,956,658 A | 9/1999 | McMahon |
| 5,971,712 A | 10/1999 | Kann |
| 5,975,854 A | 11/1999 | Culp, III et al. |
| 5,984,645 A | 11/1999 | Cummings |
| 5,986,571 A | 11/1999 | Flick |
| 5,987,903 A | 11/1999 | Bathla |
| 5,988,986 A | 11/1999 | Brinken et al. |
| 5,995,347 A | 11/1999 | Rudd et al. |
| 5,995,351 A | 11/1999 | Katsumata et al. |
| 6,006,142 A | 12/1999 | Seem et al. |
| 6,006,171 A | 12/1999 | Vines et al. |
| 6,011,368 A | 1/2000 | Kalpathi et al. |
| 6,013,108 A | 1/2000 | Karolys et al. |
| 6,017,192 A | 1/2000 | Clack et al. |
| 6,020,702 A | 2/2000 | Farr |
| 6,023,420 A | 2/2000 | McCormick et al. |
| 6,026,651 A | 2/2000 | Sandelman |
| 6,028,522 A | 2/2000 | Petite |
| 6,035,661 A | 3/2000 | Sunaga et al. |
| 6,038,871 A | 3/2000 | Gutierrez et al. |
| 6,041,605 A | 3/2000 | Heinrichs |
| 6,041,609 A | 3/2000 | Hornsleth et al. |
| 6,041,856 A | 3/2000 | Thrasher et al. |
| 6,042,344 A | 3/2000 | Lifson |
| 6,044,062 A | 3/2000 | Brownrigg et al. |
| 6,047,557 A | 4/2000 | Pham et al. |
| 6,050,098 A | 4/2000 | Meyer et al. |
| 6,050,780 A | 4/2000 | Hasegawa et al. |
| 6,052,731 A | 4/2000 | Holdsworth et al. |
| 6,057,771 A | 5/2000 | Lakra |
| 6,065,946 A | 5/2000 | Lathrop |
| 6,068,447 A | 5/2000 | Foege |
| 6,070,110 A | 5/2000 | Shah et al. |
| 6,075,530 A | 6/2000 | Lucas et al. |
| 6,077,051 A | 6/2000 | Centers et al. |
| 6,081,750 A | 6/2000 | Hoffberg et al. |
| 6,082,495 A | 7/2000 | Steinbarger et al. |
| 6,082,971 A | 7/2000 | Gunn et al. |
| 6,085,530 A | 7/2000 | Barito |
| 6,088,659 A | 7/2000 | Kelley et al. |
| 6,088,688 A | 7/2000 | Crooks et al. |
| 6,092,370 A | 7/2000 | Tremoulet, Jr. et al. |
| 6,092,378 A | 7/2000 | Das et al. |
| 6,092,992 A | 7/2000 | Imblum et al. |
| 6,095,674 A | 8/2000 | Verissimo et al. |
| 6,098,893 A | 8/2000 | Berglund et al. |
| 6,102,665 A | 8/2000 | Centers et al. |
| 6,110,260 A | 8/2000 | Kubokawa |
| 6,119,949 A | 9/2000 | Lindstrom |
| 6,122,603 A | 9/2000 | Budike, Jr. |
| 6,125,642 A | 10/2000 | Seener et al. |
| 6,128,583 A | 10/2000 | Dowling |
| 6,128,953 A | 10/2000 | Mizukoshi |
| 6,129,527 A | 10/2000 | Donahoe et al. |
| 6,138,461 A | 10/2000 | Park et al. |
| 6,142,741 A | 11/2000 | Nishihata et al. |
| 6,144,888 A | 11/2000 | Lucas et al. |
| 6,145,328 A | 11/2000 | Choi |
| 6,147,601 A | 11/2000 | Sandelman et al. |
| 6,152,375 A | 11/2000 | Robison |
| 6,152,376 A | 11/2000 | Sandelman et al. |
| 6,153,942 A | 11/2000 | Roseman et al. |
| 6,153,993 A | 11/2000 | Oomura et al. |
| 6,154,488 A | 11/2000 | Hunt |
| 6,157,310 A | 12/2000 | Milne et al. |
| 6,158,230 A | 12/2000 | Katsuki |
| 6,160,477 A | 12/2000 | Sandelman et al. |
| 6,169,979 B1 | 1/2001 | Johnson |
| 6,172,476 B1 | 1/2001 | Tolbert, Jr. et al. |
| 6,174,136 B1 | 1/2001 | Kilayko et al. |
| 6,176,683 B1 | 1/2001 | Yang |
| 6,176,686 B1 | 1/2001 | Wallis et al. |
| 6,177,884 B1 | 1/2001 | Hunt et al. |
| 6,178,362 B1 | 1/2001 | Woolard et al. |
| 6,179,214 B1 | 1/2001 | Key et al. |
| 6,190,442 B1 | 2/2001 | Redner |
| 6,191,545 B1 | 2/2001 | Kawabata et al. |
| 6,192,282 B1 | 2/2001 | Smith et al. |
| 6,199,018 B1 | 3/2001 | Quist et al. |
| 6,211,782 B1 | 4/2001 | Sandelman et al. |
| 6,213,731 B1 | 4/2001 | Doepker et al. |

(56) References Cited

U.S. PATENT DOCUMENTS

| | | |
|---|---|---|
| 6,215,405 B1 | 4/2001 | Handley et al. |
| 6,216,956 B1 | 4/2001 | Ehlers et al. |
| 6,218,953 B1 | 4/2001 | Petite |
| 6,223,543 B1 | 5/2001 | Sandelman |
| 6,223,544 B1 | 5/2001 | Seem |
| 6,228,155 B1 | 5/2001 | Tai |
| 6,230,501 B1 | 5/2001 | Bailey, Sr. et al. |
| 6,233,327 B1 | 5/2001 | Petite |
| 6,234,019 B1 | 5/2001 | Caldeira |
| 6,240,733 B1 | 6/2001 | Brandon et al. |
| 6,240,736 B1 | 6/2001 | Fujita et al. |
| 6,244,061 B1 | 6/2001 | Takagi et al. |
| 6,249,516 B1 | 6/2001 | Brownrigg et al. |
| 6,260,004 B1 | 7/2001 | Hays et al. |
| 6,266,968 B1 | 7/2001 | Redlich |
| 6,268,664 B1 | 7/2001 | Rolls et al. |
| 6,272,868 B1 | 8/2001 | Grabon et al. |
| 6,276,901 B1 | 8/2001 | Farr et al. |
| 6,279,332 B1 | 8/2001 | Yeo et al. |
| 6,290,043 B1 | 9/2001 | Ginder et al. |
| 6,293,114 B1 | 9/2001 | Kamemoto |
| 6,293,767 B1 | 9/2001 | Bass |
| 6,302,654 B1 | 10/2001 | Millet et al. |
| 6,304,934 B1 | 10/2001 | Pimenta et al. |
| 6,320,275 B1 | 11/2001 | Okamoto et al. |
| 6,324,854 B1 | 12/2001 | Jayanth |
| 6,327,541 B1 | 12/2001 | Pitchford et al. |
| 6,332,327 B1 | 12/2001 | Street et al. |
| 6,334,093 B1 | 12/2001 | More |
| 6,349,883 B1 | 2/2002 | Simmons et al. |
| 6,350,111 B1 | 2/2002 | Perevozchikov et al. |
| 6,359,410 B1 | 3/2002 | Randolph |
| 6,360,551 B1 | 3/2002 | Renders |
| 6,366,889 B1 | 4/2002 | Zaloom |
| 6,368,065 B1 | 4/2002 | Hugenroth et al. |
| 6,375,439 B1 | 4/2002 | Missio |
| 6,378,315 B1 | 4/2002 | Gelber et al. |
| 6,381,971 B2 | 5/2002 | Honda |
| 6,385,510 B1 | 5/2002 | Hoog et al. |
| 6,389,823 B1 | 5/2002 | Loprete et al. |
| 6,390,779 B1 | 5/2002 | Cunkelman |
| 6,391,102 B1 | 5/2002 | Bodden et al. |
| 6,393,848 B2 | 5/2002 | Roh et al. |
| 6,397,606 B1 | 6/2002 | Roh et al. |
| 6,397,612 B1 | 6/2002 | Kernkamp et al. |
| 6,406,265 B1 | 6/2002 | Hahn et al. |
| 6,406,266 B1 | 6/2002 | Hugenroth et al. |
| 6,408,228 B1 | 6/2002 | Seem et al. |
| 6,408,258 B1 | 6/2002 | Richer |
| 6,412,293 B1 | 7/2002 | Pham et al. |
| 6,414,594 B1 | 7/2002 | Guerlain |
| 6,430,238 B1 | 8/2002 | Petite |
| 6,433,791 B2 | 8/2002 | Selli et al. |
| 6,437,691 B1 | 8/2002 | Sandelman et al. |
| 6,437,692 B1 | 8/2002 | Petite et al. |
| 6,438,981 B1 | 8/2002 | Whiteside |
| 6,442,953 B1 | 9/2002 | Trigiani et al. |
| 6,449,972 B2 | 9/2002 | Pham et al. |
| 6,450,771 B1 | 9/2002 | Centers et al. |
| 6,451,210 B1 | 9/2002 | Sivavec et al. |
| 6,453,687 B2 | 9/2002 | Sharood et al. |
| 6,454,177 B1 | 9/2002 | Sasao et al. |
| 6,454,538 B1 | 9/2002 | Witham et al. |
| 6,456,928 B1 | 9/2002 | Johnson |
| 6,457,319 B1 | 10/2002 | Ota et al. |
| 6,457,948 B1 | 10/2002 | Pham |
| 6,460,731 B2 | 10/2002 | Estelle et al. |
| 6,462,654 B1 | 10/2002 | Sandelman et al. |
| 6,463,747 B1 | 10/2002 | Temple |
| 6,466,971 B1 | 10/2002 | Humpleman et al. |
| 6,467,280 B2 | 10/2002 | Pham et al. |
| 6,471,486 B1 | 10/2002 | Centers et al. |
| 6,474,084 B2 | 11/2002 | Gauthier et al. |
| 6,484,520 B2 | 11/2002 | Kawaguchi et al. |
| 6,487,457 B1 | 11/2002 | Hull et al. |
| 6,490,506 B1 | 12/2002 | March |
| 6,492,923 B1 | 12/2002 | Inoue et al. |
| 6,497,554 B2 | 12/2002 | Yang et al. |
| 6,501,240 B2 | 12/2002 | Ueda et al. |
| 6,501,629 B1 | 12/2002 | Marriott |
| 6,502,409 B1 | 1/2003 | Gatling et al. |
| 6,505,087 B1 | 1/2003 | Lucas et al. |
| 6,505,475 B1 | 1/2003 | Zugibe et al. |
| 6,510,350 B1 | 1/2003 | Steen, III et al. |
| 6,522,974 B2 | 2/2003 | Sitton |
| 6,523,130 B1 | 2/2003 | Hickman et al. |
| 6,526,766 B1 | 3/2003 | Hiraoka et al. |
| 6,529,590 B1 | 3/2003 | Centers |
| 6,529,839 B1 | 3/2003 | Uggerud et al. |
| 6,533,552 B2 | 3/2003 | Centers et al. |
| 6,535,123 B2 | 3/2003 | Sandelman et al. |
| 6,535,270 B1 | 3/2003 | Murayama |
| 6,535,859 B1 | 3/2003 | Yablonowski et al. |
| 6,537,034 B2 | 3/2003 | Park et al. |
| 6,542,062 B1 | 4/2003 | Herrick |
| 6,549,135 B2 | 4/2003 | Singh et al. |
| 6,551,069 B2 | 4/2003 | Narney, II et al. |
| 6,553,774 B1 | 4/2003 | Ishio et al. |
| 6,558,126 B1 | 5/2003 | Hahn et al. |
| 6,560,976 B2 | 5/2003 | Jayanth |
| 6,571,280 B1 | 5/2003 | Hubacher |
| 6,571,566 B1 | 6/2003 | Temple et al. |
| 6,571,586 B1 | 6/2003 | Ritson et al. |
| 6,574,561 B2 | 6/2003 | Alexander et al. |
| 6,577,959 B1 | 6/2003 | Chajec et al. |
| 6,577,962 B1 | 6/2003 | Afshari |
| 6,578,373 B1 | 6/2003 | Barbier |
| 6,583,720 B1 | 6/2003 | Quigley |
| 6,591,620 B2 | 7/2003 | Kikuchi et al. |
| 6,595,475 B2 | 7/2003 | Svabek et al. |
| 6,595,757 B2 | 7/2003 | Shen |
| 6,598,056 B1 | 7/2003 | Hull et al. |
| 6,601,397 B2 | 8/2003 | Pham et al. |
| 6,604,093 B1 | 8/2003 | Etzion et al. |
| 6,609,070 B1 | 8/2003 | Lueck |
| 6,609,078 B2 | 8/2003 | Starling et al. |
| 6,615,594 B2 | 9/2003 | Jayanth et al. |
| 6,616,415 B1 | 9/2003 | Renken et al. |
| 6,618,578 B1 | 9/2003 | Petite |
| 6,618,709 B1 | 9/2003 | Sneeringer |
| 6,621,443 B1 | 9/2003 | Selli et al. |
| 6,622,925 B2 | 9/2003 | Carner et al. |
| 6,622,926 B1 | 9/2003 | Sartain et al. |
| 6,628,764 B1 | 9/2003 | Petite |
| 6,629,420 B2 | 10/2003 | Renders |
| 6,630,749 B1 | 10/2003 | Takagi et al. |
| 6,631,298 B1 | 10/2003 | Pagnano et al. |
| 6,636,893 B1 | 10/2003 | Fong |
| 6,643,567 B2 | 11/2003 | Kolk et al. |
| 6,644,848 B1 | 11/2003 | Clayton et al. |
| 6,647,735 B2 | 11/2003 | Street et al. |
| 6,658,345 B2 | 12/2003 | Miller |
| 6,658,373 B2 | 12/2003 | Rossi et al. |
| 6,662,584 B1 | 12/2003 | Whiteside |
| 6,662,653 B1 | 12/2003 | Scaliante et al. |
| 6,671,586 B2 | 12/2003 | Davis et al. |
| 6,675,591 B2 | 1/2004 | Singh et al. |
| 6,679,072 B2 | 1/2004 | Pham et al. |
| 6,681,582 B2 | 1/2004 | Suzuki et al. |
| 6,684,349 B2 | 1/2004 | Gullo et al. |
| 6,685,438 B2 | 2/2004 | Yoo et al. |
| 6,698,218 B2 | 3/2004 | Goth et al. |
| 6,701,725 B2 | 3/2004 | Rossi et al. |
| 6,708,083 B2 | 3/2004 | Orthlieb et al. |
| 6,708,508 B2 | 3/2004 | Demuth et al. |
| 6,709,244 B2 | 3/2004 | Pham |
| 6,711,470 B1 | 3/2004 | Hartenstein et al. |
| 6,711,911 B1 | 3/2004 | Grabon et al. |
| 6,717,513 B1 | 4/2004 | Sandelman et al. |
| 6,721,770 B1 | 4/2004 | Morton et al. |
| 6,725,182 B2 | 4/2004 | Pagnano et al. |
| 6,732,538 B2 | 5/2004 | Trigiani et al. |
| 6,745,107 B1 | 6/2004 | Miller |
| 6,747,557 B1 | 6/2004 | Petite et al. |

(56) References Cited

U.S. PATENT DOCUMENTS

| | | |
|---|---|---|
| 6,757,665 B1 | 6/2004 | Unsworth et al. |
| 6,758,050 B2 | 7/2004 | Jayanth et al. |
| 6,758,051 B2 | 7/2004 | Jayanth et al. |
| 6,760,207 B2 | 7/2004 | Wyatt et al. |
| 6,772,096 B2 | 8/2004 | Murakami et al. |
| 6,772,598 B1 | 8/2004 | Rinehart |
| 6,775,995 B1 | 8/2004 | Bahel et al. |
| 6,784,807 B2 | 8/2004 | Petite et al. |
| 6,785,592 B1 | 8/2004 | Smith et al. |
| 6,786,473 B1 | 9/2004 | Alles |
| 6,799,951 B2 | 10/2004 | Lifson et al. |
| 6,804,993 B2 | 10/2004 | Selli |
| 6,811,380 B2 | 11/2004 | Kim |
| 6,813,897 B1 | 11/2004 | Bash et al. |
| 6,816,811 B2 | 11/2004 | Seem |
| 6,823,680 B2 | 11/2004 | Jayanth |
| 6,829,542 B1 | 12/2004 | Reynolds et al. |
| 6,832,120 B1 | 12/2004 | Frank et al. |
| 6,832,898 B2 | 12/2004 | Yoshida et al. |
| 6,836,737 B2 | 12/2004 | Petite et al. |
| 6,837,922 B2 | 1/2005 | Gorin |
| 6,839,790 B2 | 1/2005 | Barros De Almeida et al. |
| 6,854,345 B2 | 2/2005 | Alves et al. |
| 6,862,498 B2 | 3/2005 | Davis et al. |
| 6,868,678 B2 | 3/2005 | Mei et al. |
| 6,868,686 B2 | 3/2005 | Ueda et al. |
| 6,869,272 B2 | 3/2005 | Odachi et al. |
| 6,870,486 B2 | 3/2005 | Souza et al. |
| 6,885,949 B2 | 4/2005 | Selli |
| 6,889,173 B2 | 5/2005 | Singh |
| 6,891,838 B1 | 5/2005 | Petite et al. |
| 6,892,546 B2 | 5/2005 | Singh et al. |
| 6,897,772 B1 | 5/2005 | Scheffler et al. |
| 6,900,738 B2 | 5/2005 | Crichlow |
| 6,901,066 B1 | 5/2005 | Helgeson |
| 6,904,385 B1 | 6/2005 | Budike, Jr. |
| 6,914,533 B2 | 7/2005 | Petite |
| 6,914,893 B2 | 7/2005 | Petite |
| 6,922,155 B1 | 7/2005 | Evans et al. |
| 6,931,445 B2 | 8/2005 | Davis |
| 6,934,862 B2 | 8/2005 | Sharood et al. |
| 6,952,658 B2 | 10/2005 | Greulich et al. |
| 6,953,630 B2 | 10/2005 | Wells |
| 6,956,344 B2 | 10/2005 | Robertson et al. |
| 6,964,558 B2 | 11/2005 | Hahn et al. |
| 6,966,759 B2 | 11/2005 | Hahn et al. |
| 6,968,295 B1 | 11/2005 | Carr |
| 6,973,410 B2 | 12/2005 | Seigel |
| 6,973,793 B2 | 12/2005 | Douglas et al. |
| 6,973,794 B2 | 12/2005 | Street et al. |
| 6,976,366 B2 | 12/2005 | Starling et al. |
| 6,978,225 B2 | 12/2005 | Retlich et al. |
| 6,981,384 B2 | 1/2006 | Dobmeier et al. |
| 6,983,321 B2 | 1/2006 | Trinon et al. |
| 6,983,889 B2 | 1/2006 | Alles |
| 6,986,469 B2 | 1/2006 | Gauthier et al. |
| 6,987,450 B2 | 1/2006 | Marino et al. |
| 6,990,821 B2 | 1/2006 | Singh et al. |
| 6,992,452 B1 | 1/2006 | Sachs et al. |
| 6,996,441 B1 | 2/2006 | Tobias |
| 6,997,390 B2 | 2/2006 | Alles |
| 6,998,807 B2 | 2/2006 | Phillips et al. |
| 6,998,963 B2 | 2/2006 | Flen et al. |
| 6,999,996 B2 | 2/2006 | Sunderland |
| 7,000,422 B2 | 2/2006 | Street et al. |
| 7,003,378 B2 | 2/2006 | Poth |
| 7,009,510 B1 | 3/2006 | Douglass et al. |
| 7,010,925 B2 | 3/2006 | Sienel et al. |
| 7,019,667 B2 | 3/2006 | Petite et al. |
| 7,024,665 B2 | 4/2006 | Ferraz et al. |
| 7,024,870 B2 | 4/2006 | Singh et al. |
| 7,030,752 B2 | 4/2006 | Tyroler |
| 7,031,880 B1 | 4/2006 | Seem et al. |
| 7,035,693 B2 | 4/2006 | Cassiolato et al. |
| 7,039,532 B2 | 5/2006 | Hunter |
| 7,042,180 B2 | 5/2006 | Terry et al. |
| 7,042,350 B2 | 5/2006 | Patrick et al. |
| 7,043,339 B2 | 5/2006 | Maeda et al. |
| 7,043,459 B2 | 5/2006 | Peevey |
| 7,047,753 B2 | 5/2006 | Street et al. |
| 7,053,766 B2 | 5/2006 | Fisler et al. |
| 7,053,767 B2 | 5/2006 | Petite et al. |
| 7,054,271 B2 | 5/2006 | Brownrigg et al. |
| 7,062,580 B2 | 6/2006 | Donaires |
| 7,062,830 B2 | 6/2006 | Alles |
| 7,063,537 B2 | 6/2006 | Selli et al. |
| 7,072,797 B2 | 7/2006 | Gorinevsky |
| 7,075,327 B2 | 7/2006 | Dimino et al. |
| 7,079,810 B2 | 7/2006 | Petite et al. |
| 7,079,967 B2 | 7/2006 | Rossi et al. |
| 7,082,380 B2 | 7/2006 | Wiebe et al. |
| 7,089,125 B2 | 8/2006 | Sonderegger |
| 7,091,847 B2 | 8/2006 | Capowski et al. |
| 7,092,767 B2 | 8/2006 | Pagnano et al. |
| 7,092,794 B1 | 8/2006 | Hill et al. |
| 7,096,153 B2 | 8/2006 | Guralnik et al. |
| 7,102,490 B2 | 9/2006 | Flen et al. |
| 7,103,511 B2 | 9/2006 | Petite |
| 7,110,843 B2 | 9/2006 | Pagnano et al. |
| 7,110,898 B2 | 9/2006 | Montijo et al. |
| 7,113,376 B2 | 9/2006 | Nomura et al. |
| 7,114,343 B2 | 10/2006 | Kates |
| 7,123,020 B2 | 10/2006 | Hill et al. |
| 7,123,458 B2 | 10/2006 | Mohr et al. |
| 7,124,728 B2 | 10/2006 | Carey et al. |
| 7,126,465 B2 | 10/2006 | Faltesek |
| 7,130,170 B2 | 10/2006 | Wakefield et al. |
| 7,130,832 B2 | 10/2006 | Bannai et al. |
| 7,134,295 B2 | 11/2006 | Maekawa |
| 7,137,550 B1 | 11/2006 | Petite |
| 7,142,125 B2 | 11/2006 | Larson et al. |
| 7,145,438 B2 | 12/2006 | Flen et al. |
| 7,145,462 B2 | 12/2006 | Dewing et al. |
| 7,159,408 B2 | 1/2007 | Sadegh et al. |
| 7,162,884 B2 | 1/2007 | Alles |
| 7,163,158 B2 | 1/2007 | Rossi et al. |
| 7,171,372 B2 | 1/2007 | Daniel et al. |
| 7,174,728 B2 | 2/2007 | Jayanth |
| 7,180,412 B2 | 2/2007 | Bonicatto et al. |
| 7,184,861 B2 | 2/2007 | Petite |
| 7,188,482 B2 | 3/2007 | Sadegh et al. |
| 7,188,779 B2 | 3/2007 | Alles |
| 7,201,006 B2 | 4/2007 | Kates |
| 7,207,496 B2 | 4/2007 | Alles |
| 7,209,840 B2 | 4/2007 | Petite et al. |
| 7,212,887 B2 | 5/2007 | Shah et al. |
| 7,222,493 B2 | 5/2007 | Jayanth et al. |
| 7,224,740 B2 | 5/2007 | Hunt |
| 7,225,193 B2 | 5/2007 | Mets et al. |
| 7,227,450 B2 | 6/2007 | Garvy et al. |
| 7,228,691 B2 | 6/2007 | Street et al. |
| 7,230,528 B2 | 6/2007 | Kates |
| 7,234,313 B2 | 6/2007 | Bell et al. |
| 7,236,765 B2 | 6/2007 | Bonicatto et al. |
| 7,244,294 B2 | 7/2007 | Kates |
| 7,246,014 B2 | 7/2007 | Forth et al. |
| 7,255,285 B2 | 8/2007 | Troost et al. |
| 7,257,501 B2 | 8/2007 | Zhan et al. |
| 7,260,505 B2 | 8/2007 | Felke et al. |
| 7,261,762 B2 | 8/2007 | Kang et al. |
| 7,263,073 B2 | 8/2007 | Petite et al. |
| 7,263,446 B2 | 8/2007 | Morin et al. |
| 7,266,812 B2 | 9/2007 | Pagnano |
| 7,270,278 B2 | 9/2007 | Street et al. |
| 7,274,995 B2 | 9/2007 | Zhan et al. |
| 7,275,377 B2 | 10/2007 | Kates |
| 7,286,945 B2 | 10/2007 | Zhan et al. |
| 7,290,398 B2 | 11/2007 | Wallace et al. |
| 7,290,989 B2 | 11/2007 | Jayanth |
| 7,295,128 B2 | 11/2007 | Petite |
| 7,295,896 B2 | 11/2007 | Norbeck |
| 7,317,952 B2 | 1/2008 | Bhandiwad et al. |
| 7,328,192 B1 | 2/2008 | Stengard et al. |
| 7,330,886 B2 | 2/2008 | Childers et al. |

(56) References Cited

U.S. PATENT DOCUMENTS

| | | |
|---|---|---|
| 7,331,187 B2 | 2/2008 | Kates |
| 7,336,168 B2 | 2/2008 | Kates |
| 7,337,191 B2 | 2/2008 | Haeberle et al. |
| 7,343,750 B2 | 3/2008 | Lifson et al. |
| 7,343,751 B2 | 3/2008 | Kates |
| 7,346,463 B2 | 3/2008 | Petite et al. |
| 7,346,472 B1 | 3/2008 | Moskowitz et al. |
| 7,349,824 B2 | 3/2008 | Seigel |
| 7,350,112 B2 | 3/2008 | Fox et al. |
| 7,351,274 B2 | 4/2008 | Helt et al. |
| 7,352,545 B2 | 4/2008 | Wyatt et al. |
| 7,363,200 B2 | 4/2008 | Lu |
| 7,376,712 B1 | 5/2008 | Granatelli et al. |
| 7,377,118 B2 | 5/2008 | Esslinger |
| 7,383,030 B2 | 6/2008 | Brown et al. |
| 7,383,158 B2 | 6/2008 | Krocker et al. |
| 7,392,661 B2 | 7/2008 | Alles |
| 7,397,907 B2 | 7/2008 | Petite |
| 7,400,240 B2 | 7/2008 | Shrode et al. |
| 7,412,842 B2 | 8/2008 | Pham |
| 7,414,525 B2 | 8/2008 | Costea et al. |
| 7,421,351 B2 | 9/2008 | Navratil |
| 7,421,374 B2 | 9/2008 | Zhan et al. |
| 7,421,850 B2 | 9/2008 | Street et al. |
| 7,424,343 B2 | 9/2008 | Kates |
| 7,424,345 B2 | 9/2008 | Norbeck |
| 7,424,527 B2 | 9/2008 | Petite |
| 7,432,824 B2 | 10/2008 | Flen et al. |
| 7,433,854 B2 | 10/2008 | Joseph et al. |
| 7,434,742 B2 | 10/2008 | Mueller et al. |
| 7,437,150 B1 | 10/2008 | Morelli et al. |
| 7,440,560 B1 | 10/2008 | Barry |
| 7,440,767 B2 | 10/2008 | Ballay et al. |
| 7,443,313 B2 | 10/2008 | Davis et al. |
| 7,444,251 B2 | 10/2008 | Nikovski et al. |
| 7,445,665 B2 | 11/2008 | Hsieh et al. |
| 7,447,603 B2 | 11/2008 | Bruno |
| 7,447,609 B2 | 11/2008 | Guralnik et al. |
| 7,451,606 B2 | 11/2008 | Harrod |
| 7,454,439 B1 | 11/2008 | Gansner et al. |
| 7,458,223 B2 | 12/2008 | Pham |
| 7,468,661 B2 | 12/2008 | Petite et al. |
| 7,469,546 B2 | 12/2008 | Kates |
| 7,474,992 B2 | 1/2009 | Ariyur |
| 7,480,501 B2 | 1/2009 | Petite |
| 7,483,810 B2 | 1/2009 | Jackson et al. |
| 7,484,376 B2 | 2/2009 | Pham |
| 7,490,477 B2 | 2/2009 | Singh et al. |
| 7,491,034 B2 | 2/2009 | Jayanth |
| 7,503,182 B2 | 3/2009 | Bahel et al. |
| 7,510,126 B2 | 3/2009 | Rossi et al. |
| 7,523,619 B2 | 4/2009 | Kojima et al. |
| 7,528,711 B2 | 5/2009 | Kates |
| 7,533,070 B2 | 5/2009 | Guralnik et al. |
| 7,537,172 B2 | 5/2009 | Rossi et al. |
| 7,552,030 B2 | 6/2009 | Guralnik et al. |
| 7,552,596 B2 | 6/2009 | Galante et al. |
| 7,555,364 B2 | 6/2009 | Poth et al. |
| 7,574,333 B2 | 8/2009 | Lu |
| 7,580,812 B2 | 8/2009 | Ariyur et al. |
| 7,594,407 B2 | 9/2009 | Singh et al. |
| 7,596,959 B2 | 10/2009 | Singh et al. |
| 7,606,683 B2 | 10/2009 | Bahel et al. |
| 7,631,508 B2 | 12/2009 | Braun et al. |
| 7,636,901 B2 | 12/2009 | Munson et al. |
| 7,644,591 B2 | 1/2010 | Singh et al. |
| 7,648,077 B2 | 1/2010 | Rossi et al. |
| 7,648,342 B2 | 1/2010 | Jayanth |
| 7,650,425 B2 | 1/2010 | Davis et al. |
| 7,660,700 B2 | 2/2010 | Moskowitz et al. |
| 7,660,774 B2 | 2/2010 | Mukherjee et al. |
| 7,664,613 B2 | 2/2010 | Hansen |
| 7,665,315 B2 | 2/2010 | Singh et al. |
| 7,686,872 B2 | 3/2010 | Kang |
| 7,693,809 B2 | 4/2010 | Gray |
| 7,697,492 B2 | 4/2010 | Petite |
| 7,703,694 B2 | 4/2010 | Mueller et al. |
| 7,704,052 B2 | 4/2010 | Iimura et al. |
| 7,706,320 B2 | 4/2010 | Davis et al. |
| 7,726,583 B2 | 6/2010 | Maekawa |
| 7,734,451 B2 | 6/2010 | MacArthur et al. |
| 7,738,999 B2 | 6/2010 | Petite |
| 7,739,378 B2 | 6/2010 | Petite |
| 7,742,393 B2 | 6/2010 | Bonicatto et al. |
| 7,752,853 B2 | 7/2010 | Singh et al. |
| 7,752,854 B2 | 7/2010 | Singh et al. |
| 7,756,086 B2 | 7/2010 | Petite et al. |
| 7,791,468 B2 | 9/2010 | Bonicatto et al. |
| 7,844,366 B2 | 11/2010 | Singh |
| 7,845,179 B2 | 12/2010 | Singh et al. |
| 7,848,827 B2 | 12/2010 | Chen |
| 7,848,900 B2 | 12/2010 | Steinberg et al. |
| 7,877,218 B2 | 1/2011 | Bonicatto et al. |
| 7,878,006 B2 | 2/2011 | Pham |
| 7,885,959 B2 | 2/2011 | Horowitz et al. |
| 7,885,961 B2 | 2/2011 | Horowitz et al. |
| 7,905,098 B2 | 3/2011 | Pham |
| 7,908,116 B2 | 3/2011 | Steinberg et al. |
| 7,908,117 B2 | 3/2011 | Steinberg et al. |
| 7,922,914 B1 | 4/2011 | Verdegan et al. |
| 7,937,623 B2 | 5/2011 | Ramacher et al. |
| 7,949,494 B2 | 5/2011 | Moskowitz et al. |
| 7,949,615 B2 | 5/2011 | Ehlers et al. |
| 7,963,454 B2 | 6/2011 | Sullivan et al. |
| 7,978,059 B2 | 7/2011 | Petite et al. |
| 7,987,679 B2 | 8/2011 | Tanaka et al. |
| 8,000,314 B2 | 8/2011 | Brownrigg et al. |
| 8,013,732 B2 | 9/2011 | Petite et al. |
| 8,018,182 B2 | 9/2011 | Roehm et al. |
| 8,019,567 B2 | 9/2011 | Steinberg et al. |
| 8,029,608 B1 | 10/2011 | Breslin |
| 8,031,455 B2 | 10/2011 | Paik et al. |
| 8,031,650 B2 | 10/2011 | Petite et al. |
| 8,034,170 B2 | 10/2011 | Kates |
| 8,041,539 B2 | 10/2011 | Guralnik et al. |
| 8,046,107 B2 | 10/2011 | Zugibe et al. |
| 8,061,417 B2 | 11/2011 | Gray |
| 8,064,412 B2 | 11/2011 | Petite |
| 8,065,886 B2 | 11/2011 | Singh et al. |
| 8,131,497 B2 | 3/2012 | Steinberg et al. |
| 8,131,506 B2 | 3/2012 | Steinberg et al. |
| 8,150,720 B2 | 4/2012 | Singh et al. |
| 8,156,208 B2 | 4/2012 | Bornhoevd et al. |
| 8,171,136 B2 | 5/2012 | Petite |
| 8,214,175 B2 | 7/2012 | Moskowitz et al. |
| 8,228,648 B2 | 7/2012 | Jayanth et al. |
| 8,239,922 B2 | 8/2012 | Sullivan et al. |
| 8,279,565 B2 | 10/2012 | Hall et al. |
| 8,328,524 B2 | 12/2012 | Iimura et al. |
| 8,380,556 B2 | 2/2013 | Singh et al. |
| 8,393,169 B2 | 3/2013 | Pham |
| 8,474,278 B2 | 7/2013 | Pham |
| 8,475,136 B2 | 7/2013 | Jayanth |
| 8,590,325 B2 | 11/2013 | Pham |
| 8,625,244 B2 | 1/2014 | Paik et al. |
| 8,964,338 B2 | 2/2015 | Wallis et al. |
| 9,046,900 B2 | 6/2015 | Kates |
| 9,121,407 B2 | 9/2015 | Pham |
| 9,140,728 B2 | 9/2015 | Jayanth et al. |
| 9,168,315 B1 | 10/2015 | Scaringe et al. |
| 9,194,894 B2 | 11/2015 | Jayanth et al. |
| 9,304,521 B2 | 4/2016 | Kates |
| 9,310,094 B2 | 4/2016 | Kates |
| 9,310,439 B2 | 4/2016 | Pham et al. |
| 9,590,413 B2 | 3/2017 | Wallis et al. |
| 9,690,307 B2 | 6/2017 | Kates |
| 9,765,979 B2 | 9/2017 | Alsaleem et al. |
| 2001/0005320 A1 | 6/2001 | Ueda et al. |
| 2001/0023596 A1 | 9/2001 | Fujita et al. |
| 2001/0054291 A1 | 12/2001 | Roh et al. |
| 2001/0054293 A1 | 12/2001 | Gustafson et al. |
| 2002/0000092 A1 | 1/2002 | Sharood et al. |
| 2002/0013679 A1 | 1/2002 | Petite |
| 2002/0016639 A1 | 2/2002 | Smith et al. |

(56) References Cited

U.S. PATENT DOCUMENTS

| | | |
|---|---|---|
| 2002/0017057 A1 | 2/2002 | Weder |
| 2002/0018724 A1 | 2/2002 | Millet et al. |
| 2002/0020175 A1 | 2/2002 | Street et al. |
| 2002/0029575 A1 | 3/2002 | Okamoto |
| 2002/0031101 A1 | 3/2002 | Petite et al. |
| 2002/0035495 A1 | 3/2002 | Spira et al. |
| 2002/0040280 A1 | 4/2002 | Morgan |
| 2002/0059803 A1 | 5/2002 | Jayanth |
| 2002/0064463 A1 | 5/2002 | Park et al. |
| 2002/0067999 A1 | 6/2002 | Suitou et al. |
| 2002/0082747 A1 | 6/2002 | Kramer |
| 2002/0082924 A1 | 6/2002 | Koether |
| 2002/0095269 A1 | 7/2002 | Natalini et al. |
| 2002/0103655 A1 | 8/2002 | Boies et al. |
| 2002/0108384 A1 | 8/2002 | Higashiyama |
| 2002/0113877 A1 | 8/2002 | Welch |
| 2002/0117992 A1 | 8/2002 | Hirono et al. |
| 2002/0118106 A1 | 8/2002 | Brenn |
| 2002/0127120 A1 | 9/2002 | Hahn et al. |
| 2002/0138217 A1 | 9/2002 | Shen et al. |
| 2002/0143482 A1 | 10/2002 | Karanam et al. |
| 2002/0152298 A1 | 10/2002 | Kikta et al. |
| 2002/0157408 A1 | 10/2002 | Egawa et al. |
| 2002/0161545 A1 | 10/2002 | Starling et al. |
| 2002/0163436 A1 | 11/2002 | Singh et al. |
| 2002/0170299 A1 | 11/2002 | Jayanth et al. |
| 2002/0173929 A1 | 11/2002 | Seigel |
| 2002/0189267 A1 | 12/2002 | Singh et al. |
| 2002/0193890 A1 | 12/2002 | Pouchak |
| 2002/0198629 A1 | 12/2002 | Ellis |
| 2003/0004660 A1 | 1/2003 | Hunter |
| 2003/0004765 A1 | 1/2003 | Wiegand |
| 2003/0005710 A1 | 1/2003 | Singh et al. |
| 2003/0006884 A1 | 1/2003 | Hunt |
| 2003/0014218 A1 | 1/2003 | Trigiani et al. |
| 2003/0019221 A1 | 1/2003 | Rossi et al. |
| 2003/0036810 A1 | 2/2003 | Petite |
| 2003/0037555 A1 | 2/2003 | Street et al. |
| 2003/0050737 A1 | 3/2003 | Osann |
| 2003/0050824 A1 | 3/2003 | Suermondt et al. |
| 2003/0051490 A1 | 3/2003 | Jayanth |
| 2003/0055603 A1 | 3/2003 | Rossi et al. |
| 2003/0055663 A1 | 3/2003 | Struble |
| 2003/0061825 A1 | 4/2003 | Sullivan |
| 2003/0063983 A1 | 4/2003 | Ancel et al. |
| 2003/0070438 A1 | 4/2003 | Kikuchi et al. |
| 2003/0070544 A1 | 4/2003 | Mulvaney et al. |
| 2003/0074285 A1 | 4/2003 | Hoffman et al. |
| 2003/0077179 A1 | 4/2003 | Collins et al. |
| 2003/0078677 A1 | 4/2003 | Hull et al. |
| 2003/0078742 A1* | 4/2003 | VanderZee ........... G01R 21/006 702/60 |
| 2003/0089493 A1 | 5/2003 | Takano et al. |
| 2003/0094004 A1 | 5/2003 | Pham et al. |
| 2003/0108430 A1 | 6/2003 | Yoshida et al. |
| 2003/0115890 A1 | 6/2003 | Jayanth et al. |
| 2003/0135786 A1 | 7/2003 | Vollmar et al. |
| 2003/0137396 A1 | 7/2003 | Durej et al. |
| 2003/0150924 A1 | 8/2003 | Peter |
| 2003/0150926 A1 | 8/2003 | Rosen |
| 2003/0150927 A1 | 8/2003 | Rosen |
| 2003/0171851 A1 | 9/2003 | Brickfield et al. |
| 2003/0183085 A1 | 10/2003 | Alexander |
| 2003/0191606 A1 | 10/2003 | Fujiyama et al. |
| 2003/0199247 A1 | 10/2003 | Striemer |
| 2003/0205143 A1 | 11/2003 | Cheng |
| 2003/0213851 A1 | 11/2003 | Burd et al. |
| 2003/0216837 A1 | 11/2003 | Reich et al. |
| 2003/0216888 A1 | 11/2003 | Ridolfo |
| 2003/0233172 A1 | 12/2003 | Granqvist et al. |
| 2004/0016241 A1* | 1/2004 | Street ..................... F25B 49/02 62/129 |
| 2004/0016244 A1 | 1/2004 | Street et al. |
| 2004/0016251 A1 | 1/2004 | Street et al. |
| 2004/0016253 A1 | 1/2004 | Street et al. |
| 2004/0019584 A1 | 1/2004 | Greening et al. |
| 2004/0024495 A1 | 2/2004 | Sunderland |
| 2004/0026522 A1 | 2/2004 | Keen et al. |
| 2004/0037706 A1* | 2/2004 | Hahn ..................... F04C 23/00 417/26 |
| 2004/0042904 A1 | 3/2004 | Kim |
| 2004/0047406 A1 | 3/2004 | Hunt |
| 2004/0049715 A1 | 3/2004 | Jaw |
| 2004/0059691 A1 | 3/2004 | Higgins |
| 2004/0068390 A1 | 4/2004 | Saunders |
| 2004/0078695 A1 | 4/2004 | Bowers et al. |
| 2004/0079093 A1 | 4/2004 | Gauthier et al. |
| 2004/0093879 A1 | 5/2004 | Street et al. |
| 2004/0095237 A1 | 5/2004 | Chen et al. |
| 2004/0111186 A1 | 6/2004 | Rossi et al. |
| 2004/0117166 A1 | 6/2004 | Cassiolato |
| 2004/0133314 A1 | 7/2004 | Ehlers et al. |
| 2004/0133367 A1 | 7/2004 | Hart |
| 2004/0140772 A1 | 7/2004 | Gullo et al. |
| 2004/0140812 A1 | 7/2004 | Scallante et al. |
| 2004/0144106 A1 | 7/2004 | Douglas et al. |
| 2004/0153437 A1 | 8/2004 | Buchan |
| 2004/0159113 A1 | 8/2004 | Singh et al. |
| 2004/0183687 A1 | 9/2004 | Petite et al. |
| 2004/0184627 A1 | 9/2004 | Kost et al. |
| 2004/0184928 A1 | 9/2004 | Millet et al. |
| 2004/0184929 A1 | 9/2004 | Millet et al. |
| 2004/0184930 A1 | 9/2004 | Millet et al. |
| 2004/0184931 A1 | 9/2004 | Millet et al. |
| 2004/0187502 A1 | 9/2004 | Jayanth et al. |
| 2004/0191073 A1 | 9/2004 | Iimura et al. |
| 2004/0199480 A1 | 10/2004 | Unsworth et al. |
| 2004/0210419 A1 | 10/2004 | Wiebe et al. |
| 2004/0213384 A1 | 10/2004 | Alles et al. |
| 2004/0230582 A1 | 11/2004 | Pagnano et al. |
| 2004/0230899 A1 | 11/2004 | Pagnano et al. |
| 2004/0239266 A1 | 12/2004 | Lee et al. |
| 2004/0261431 A1 | 12/2004 | Singh et al. |
| 2005/0043923 A1 | 2/2005 | Forster et al. |
| 2005/0053471 A1 | 3/2005 | Hong et al. |
| 2005/0056031 A1 | 3/2005 | Jeong |
| 2005/0066675 A1 | 3/2005 | Manole et al. |
| 2005/0073532 A1 | 4/2005 | Scott et al. |
| 2005/0086341 A1 | 4/2005 | Enga et al. |
| 2005/0100449 A1 | 5/2005 | Hahn et al. |
| 2005/0103036 A1 | 5/2005 | Maekawa |
| 2005/0125439 A1 | 6/2005 | Nourbakhsh et al. |
| 2005/0126190 A1 | 6/2005 | Lifson et al. |
| 2005/0131624 A1 | 6/2005 | Gaessler et al. |
| 2005/0149570 A1 | 7/2005 | Sasaki et al. |
| 2005/0154495 A1 | 7/2005 | Shah |
| 2005/0159924 A1 | 7/2005 | Shah et al. |
| 2005/0166610 A1 | 8/2005 | Jayanth |
| 2005/0169636 A1 | 8/2005 | Aronson et al. |
| 2005/0172647 A1 | 8/2005 | Thybo et al. |
| 2005/0195775 A1 | 9/2005 | Petite et al. |
| 2005/0196285 A1* | 9/2005 | Jayanth ................. F04C 23/008 417/44.11 |
| 2005/0198063 A1 | 9/2005 | Thomas et al. |
| 2005/0201397 A1 | 9/2005 | Petite |
| 2005/0204756 A1 | 9/2005 | Dobmeier et al. |
| 2005/0207741 A1 | 9/2005 | Shah et al. |
| 2005/0214148 A1 | 9/2005 | Ogawa et al. |
| 2005/0222715 A1 | 10/2005 | Ruhnke et al. |
| 2005/0228607 A1 | 10/2005 | Simons |
| 2005/0229612 A1 | 10/2005 | Hrejsa et al. |
| 2005/0229777 A1 | 10/2005 | Brown et al. |
| 2005/0232781 A1 | 10/2005 | Herbert et al. |
| 2005/0235660 A1 | 10/2005 | Pham |
| 2005/0235661 A1 | 10/2005 | Pham |
| 2005/0235662 A1 | 10/2005 | Pham |
| 2005/0235663 A1 | 10/2005 | Pham |
| 2005/0235664 A1 | 10/2005 | Pham |
| 2005/0247194 A1 | 11/2005 | Kang et al. |
| 2005/0251293 A1 | 11/2005 | Seigel |
| 2005/0252220 A1 | 11/2005 | Street et al. |
| 2005/0262856 A1 | 12/2005 | Street et al. |
| 2005/0262923 A1 | 12/2005 | Kates |
| 2005/0279110 A1 | 12/2005 | Zeng et al. |

(56) References Cited

U.S. PATENT DOCUMENTS

| | | |
|---|---|---|
| 2006/0010898 A1 | 1/2006 | Suharno et al. |
| 2006/0015777 A1 | 1/2006 | Loda |
| 2006/0020426 A1 | 1/2006 | Singh |
| 2006/0021362 A1 | 2/2006 | Sadegh et al. |
| 2006/0032245 A1 | 2/2006 | Kates |
| 2006/0032246 A1 | 2/2006 | Kates |
| 2006/0032247 A1 | 2/2006 | Kates |
| 2006/0032248 A1 | 2/2006 | Kates |
| 2006/0032379 A1 | 2/2006 | Kates |
| 2006/0036349 A1 | 2/2006 | Kates |
| 2006/0041335 A9 | 2/2006 | Rossi et al. |
| 2006/0042276 A1 | 3/2006 | Doll et al. |
| 2006/0071089 A1 | 4/2006 | Kates |
| 2006/0071666 A1 | 4/2006 | Unsworth et al. |
| 2006/0074917 A1 | 4/2006 | Chand et al. |
| 2006/0097063 A1 | 5/2006 | Zeevi |
| 2006/0098576 A1 | 5/2006 | Brownrigg et al. |
| 2006/0117773 A1 | 6/2006 | Street et al. |
| 2006/0123807 A1 | 6/2006 | Sullivan et al. |
| 2006/0129339 A1 | 6/2006 | Bruno |
| 2006/0130500 A1 | 6/2006 | Gauthier et al. |
| 2006/0137364 A1 | 6/2006 | Braun et al. |
| 2006/0137368 A1 | 6/2006 | Kang et al. |
| 2006/0138866 A1 | 6/2006 | Bergmann et al. |
| 2006/0140209 A1 | 6/2006 | Cassiolato et al. |
| 2006/0151037 A1 | 7/2006 | Lepola et al. |
| 2006/0179854 A1 | 8/2006 | Esslinger |
| 2006/0182635 A1 | 8/2006 | Jayanth |
| 2006/0185373 A1 | 8/2006 | Butler et al. |
| 2006/0196196 A1 | 9/2006 | Kates |
| 2006/0196197 A1 | 9/2006 | Kates |
| 2006/0201168 A1 | 9/2006 | Kates |
| 2006/0222507 A1 | 10/2006 | Jayanth |
| 2006/0229739 A1 | 10/2006 | Morikawa |
| 2006/0235650 A1 | 10/2006 | Vinberg et al. |
| 2006/0238388 A1* | 10/2006 | Jayanth .................. F04B 49/10 341/51 |
| 2006/0242200 A1 | 10/2006 | Horowitz et al. |
| 2006/0244641 A1 | 11/2006 | Jayanth et al. |
| 2006/0256488 A1 | 11/2006 | Benzing et al. |
| 2006/0259276 A1 | 11/2006 | Rossi et al. |
| 2006/0271589 A1 | 11/2006 | Horowitz et al. |
| 2006/0271623 A1 | 11/2006 | Horowitz et al. |
| 2006/0280627 A1 | 12/2006 | Jayanth |
| 2007/0002505 A1 | 1/2007 | Watanabe et al. |
| 2007/0006124 A1 | 1/2007 | Ahmed et al. |
| 2007/0027735 A1 | 2/2007 | Rokos |
| 2007/0067512 A1 | 3/2007 | Donaires et al. |
| 2007/0089434 A1 | 4/2007 | Singh et al. |
| 2007/0089435 A1 | 4/2007 | Singh et al. |
| 2007/0089438 A1 | 4/2007 | Singh et al. |
| 2007/0089439 A1 | 4/2007 | Singh et al. |
| 2007/0089440 A1 | 4/2007 | Singh et al. |
| 2007/0101750 A1 | 5/2007 | Pham et al. |
| 2007/0159978 A1 | 7/2007 | Anglin et al. |
| 2007/0186569 A1 | 8/2007 | Street et al. |
| 2007/0204635 A1 | 9/2007 | Tanaka et al. |
| 2007/0204921 A1 | 9/2007 | Alles |
| 2007/0205296 A1 | 9/2007 | Bell et al. |
| 2007/0229305 A1 | 10/2007 | Bonicatto et al. |
| 2007/0239894 A1 | 10/2007 | Thind et al. |
| 2008/0000241 A1 | 1/2008 | Larsen et al. |
| 2008/0015797 A1 | 1/2008 | Kates |
| 2008/0016888 A1 | 1/2008 | Kates |
| 2008/0033674 A1 | 2/2008 | Nikovski et al. |
| 2008/0051945 A1 | 2/2008 | Kates |
| 2008/0058970 A1 | 3/2008 | Perumalsamy et al. |
| 2008/0078289 A1 | 4/2008 | Sergi et al. |
| 2008/0109185 A1 | 5/2008 | Cheung et al. |
| 2008/0110189 A1 | 5/2008 | Alston et al. |
| 2008/0114569 A1 | 5/2008 | Seigel |
| 2008/0121729 A1 | 5/2008 | Gray |
| 2008/0183424 A1 | 7/2008 | Seem |
| 2008/0186898 A1 | 8/2008 | Petite |
| 2008/0209925 A1 | 9/2008 | Pham |
| 2008/0216494 A1 | 9/2008 | Pham et al. |
| 2008/0216495 A1 | 9/2008 | Kates |
| 2008/0223051 A1 | 9/2008 | Kates |
| 2008/0234869 A1 | 9/2008 | Yonezawa et al. |
| 2008/0319688 A1 | 12/2008 | Kim |
| 2009/0007777 A1 | 1/2009 | Cohen et al. |
| 2009/0030555 A1 | 1/2009 | Gray |
| 2009/0037142 A1 | 2/2009 | Kates |
| 2009/0038010 A1 | 2/2009 | Ma et al. |
| 2009/0055465 A1 | 2/2009 | DePue et al. |
| 2009/0057424 A1 | 3/2009 | Sullivan et al. |
| 2009/0057428 A1 | 3/2009 | Geadelmann et al. |
| 2009/0068947 A1 | 3/2009 | Petite |
| 2009/0071175 A1 | 3/2009 | Pham |
| 2009/0072985 A1 | 3/2009 | Patel et al. |
| 2009/0093916 A1 | 4/2009 | Parsonnet et al. |
| 2009/0094998 A1 | 4/2009 | McSweeney et al. |
| 2009/0096605 A1 | 4/2009 | Petite et al. |
| 2009/0099699 A1 | 4/2009 | Steinberg et al. |
| 2009/0106601 A1 | 4/2009 | Ngai et al. |
| 2009/0112672 A1 | 4/2009 | Flamig et al. |
| 2009/0114309 A1 | 5/2009 | Sakai et al. |
| 2009/0119036 A1 | 5/2009 | Jayanth et al. |
| 2009/0125151 A1 | 5/2009 | Steinberg et al. |
| 2009/0125257 A1 | 5/2009 | Jayanth et al. |
| 2009/0140880 A1 | 6/2009 | Flen et al. |
| 2009/0151374 A1 | 6/2009 | Kasahara |
| 2009/0187281 A1 | 7/2009 | Kates |
| 2009/0215424 A1 | 8/2009 | Petite |
| 2009/0241570 A1 | 10/2009 | Kuribayashi et al. |
| 2009/0296832 A1 | 12/2009 | Hunt |
| 2010/0011962 A1 | 1/2010 | Totsugi |
| 2010/0017465 A1 | 1/2010 | Brownrigg et al. |
| 2010/0039984 A1 | 2/2010 | Brownrigg |
| 2010/0070084 A1 | 3/2010 | Steinberg et al. |
| 2010/0070234 A1 | 3/2010 | Steinberg et al. |
| 2010/0111709 A1 | 5/2010 | Jayanth |
| 2010/0168924 A1 | 7/2010 | Tessier et al. |
| 2010/0169030 A1 | 7/2010 | Parlos |
| 2010/0179703 A1 | 7/2010 | Singh et al. |
| 2010/0191487 A1 | 7/2010 | Rada et al. |
| 2010/0194582 A1 | 8/2010 | Petite |
| 2010/0214709 A1 | 8/2010 | Hall et al. |
| 2010/0217550 A1 | 8/2010 | Crabtree et al. |
| 2010/0250054 A1 | 9/2010 | Petite |
| 2010/0257410 A1 | 10/2010 | Cottrell et al. |
| 2010/0265909 A1 | 10/2010 | Petite et al. |
| 2010/0293397 A1 | 11/2010 | Pham et al. |
| 2010/0312881 A1 | 12/2010 | Davis et al. |
| 2011/0004350 A1 | 1/2011 | Cheifetz et al. |
| 2011/0054842 A1 | 3/2011 | Kates |
| 2011/0071960 A1 | 3/2011 | Singh |
| 2011/0077896 A1 | 3/2011 | Steinberg et al. |
| 2011/0112814 A1 | 5/2011 | Clark |
| 2011/0121952 A1 | 5/2011 | Bonicatto et al. |
| 2011/0144944 A1 | 6/2011 | Pham |
| 2011/0166828 A1 | 7/2011 | Steinberg et al. |
| 2011/0212700 A1 | 9/2011 | Petite |
| 2011/0264324 A1 | 10/2011 | Petite et al. |
| 2011/0264409 A1 | 10/2011 | Jayanth et al. |
| 2011/0309953 A1 | 12/2011 | Petite et al. |
| 2011/0310929 A1 | 12/2011 | Petite et al. |
| 2011/0320050 A1 | 12/2011 | Petite et al. |
| 2012/0054242 A1 | 3/2012 | Ferrara et al. |
| 2012/0065935 A1 | 3/2012 | Steinberg et al. |
| 2012/0075092 A1 | 3/2012 | Petite et al. |
| 2012/0092154 A1 | 4/2012 | Petite |
| 2012/0143528 A1 | 6/2012 | Kates |
| 2012/0233478 A1 | 9/2012 | Mucignat et al. |
| 2012/0260804 A1 | 10/2012 | Kates |
| 2012/0265586 A1 | 10/2012 | Mammone |
| 2012/0271673 A1 | 10/2012 | Riley |
| 2013/0066479 A1 | 3/2013 | Shelly et al. |
| 2013/0156607 A1 | 6/2013 | Jayanth |
| 2013/0166231 A1 | 6/2013 | Jayanth et al. |
| 2013/0174588 A1 | 7/2013 | Pham |
| 2013/0176649 A1 | 7/2013 | Wallis et al. |
| 2013/0182285 A1 | 7/2013 | Matsuhara et al. |
| 2013/0287063 A1 | 10/2013 | Kates |

(56) References Cited

U.S. PATENT DOCUMENTS

| | | |
|---|---|---|
| 2013/0294933 A1 | 11/2013 | Pham |
| 2014/0000290 A1 | 1/2014 | Kates |
| 2014/0000291 A1 | 1/2014 | Kates |
| 2014/0000292 A1 | 1/2014 | Kates |
| 2014/0000293 A1 | 1/2014 | Kates |
| 2014/0000294 A1 | 1/2014 | Kates |
| 2014/0012422 A1 | 1/2014 | Kates |
| 2014/0069121 A1 | 3/2014 | Pham |
| 2014/0074730 A1 | 3/2014 | Arensmeier et al. |
| 2014/0084836 A1 | 3/2014 | Pham et al. |
| 2014/0229014 A1 | 8/2014 | Pham et al. |
| 2014/0260342 A1 | 9/2014 | Pham |
| 2014/0260390 A1 | 9/2014 | Pham |
| 2014/0262134 A1 | 9/2014 | Arensmeier et al. |
| 2014/0266755 A1 | 9/2014 | Arensmeier et al. |
| 2014/0297208 A1 | 10/2014 | Arensmeier |
| 2014/0299289 A1 | 10/2014 | Alsaleem et al. |
| 2015/0135748 A1 | 5/2015 | Alsaleem et al. |
| 2015/0155701 A1 | 6/2015 | Wallis et al. |
| 2015/0261230 A1 | 9/2015 | Kates |
| 2015/0367463 A1 | 12/2015 | Pham |
| 2016/0223238 A1 | 8/2016 | Kates |
| 2016/0226416 A1 | 8/2016 | Pham et al. |
| 2017/0308072 A1 | 10/2017 | Arensmeier |

FOREIGN PATENT DOCUMENTS

| | | |
|---|---|---|
| CA | 2567264 A1 | 7/2007 |
| CH | 173493 A | 11/1934 |
| CN | 1169619 A | 1/1998 |
| CN | 1354347 A | 6/2002 |
| CN | 1356472 | 7/2002 |
| CN | 1654893 A | 8/2005 |
| CN | 1742427 A | 3/2006 |
| CN | 1906453 A | 1/2007 |
| CN | 1922445 | 2/2007 |
| CN | 101048713 A | 10/2007 |
| CN | 101124436 A | 2/2008 |
| CN | 101156033 A | 4/2008 |
| CN | 101270908 A | 9/2008 |
| CN | 101361244 A | 2/2009 |
| CN | 101466193 A | 6/2009 |
| CN | 101506600 A | 8/2009 |
| CN | 101802521 A | 8/2010 |
| CN | 101821693 A | 9/2010 |
| CN | 102354206 A | 2/2012 |
| DE | 842351 C | 6/1952 |
| DE | 764179 C | 4/1953 |
| DE | 1144461 B | 2/1963 |
| DE | 1403516 A1 | 10/1968 |
| DE | 1403467 A1 | 10/1969 |
| DE | 3118638 A1 | 5/1982 |
| DE | 3133502 A1 | 6/1982 |
| DE | 3508353 A1 | 9/1985 |
| DE | 3422398 A1 | 12/1985 |
| DE | 29723145 U1 | 4/1998 |
| EP | 0060172 A1 | 9/1982 |
| EP | 0085246 A1 | 8/1983 |
| EP | 0124603 A1 | 11/1984 |
| EP | 0254253 A2 | 1/1988 |
| EP | 0346152 A2 | 12/1989 |
| EP | 0351272 A1 | 1/1990 |
| EP | 0351833 A2 | 1/1990 |
| EP | 0355255 A2 | 2/1990 |
| EP | 0398436 A1 | 11/1990 |
| EP | 0410330 A2 | 1/1991 |
| EP | 0419857 A2 | 4/1991 |
| EP | 0432085 A2 | 6/1991 |
| EP | 0453302 A1 | 10/1991 |
| EP | 0479421 A1 | 4/1992 |
| EP | 0557023 A1 | 8/1993 |
| EP | 0579374 A1 | 1/1994 |
| EP | 0660213 A2 | 6/1995 |
| EP | 0747598 A2 | 12/1996 |
| EP | 0877462 A2 | 11/1998 |
| EP | 0982497 A1 | 3/2000 |
| EP | 1008816 A2 | 6/2000 |
| EP | 1087142 A2 | 3/2001 |
| EP | 1087184 A2 | 3/2001 |
| EP | 1138949 A2 | 10/2001 |
| EP | 1139037 A1 | 10/2001 |
| EP | 1187021 A2 | 3/2002 |
| EP | 1209427 A1 | 5/2002 |
| EP | 1241417 A1 | 9/2002 |
| EP | 1245912 A2 | 10/2002 |
| EP | 1245913 A1 | 10/2002 |
| EP | 1393034 A1 | 3/2004 |
| EP | 1435002 A1 | 7/2004 |
| EP | 1487077 | 12/2004 |
| EP | 1541869 A1 | 6/2005 |
| EP | 2180270 A1 | 4/2010 |
| FR | 2472862 A1 | 7/1981 |
| FR | 2582430 A1 | 11/1986 |
| FR | 2589561 A1 | 5/1987 |
| FR | 2628558 A1 | 9/1989 |
| FR | 2660739 A1 | 10/1991 |
| GB | 2062919 A | 5/1981 |
| GB | 2064818 A | 6/1981 |
| GB | 2075774 A | 11/1981 |
| GB | 2116635 A | 9/1983 |
| GB | 2229295 | 9/1990 |
| GB | 2347217 A | 8/2000 |
| JP | 56010639 A | 2/1981 |
| JP | 59145392 A | 8/1984 |
| JP | 61046485 A | 3/1986 |
| JP | 62116844 A | 5/1987 |
| JP | 63061783 A | 3/1988 |
| JP | 63302238 A | 12/1988 |
| JP | 01014554 A | 1/1989 |
| JP | 02110242 A | 4/1990 |
| JP | 02294580 A | 12/1990 |
| JP | 04080578 A | 3/1992 |
| JP | 06058273 A | 3/1994 |
| JP | 08087229 A | 4/1996 |
| JP | 08284842 A | 10/1996 |
| JP | H08261541 A | 10/1996 |
| JP | 2000350490 A | 12/2000 |
| JP | 2002155868 A | 5/2002 |
| JP | 2003018883 A | 1/2003 |
| JP | 2003176788 A | 6/2003 |
| JP | 2004316504 A | 11/2004 |
| JP | 2005241089 A | 9/2005 |
| JP | 2005345096 A | 12/2005 |
| JP | 2006046219 A | 2/2006 |
| JP | 2006046519 A | 2/2006 |
| JP | 2006274807 A | 10/2006 |
| JP | 2009002651 A | 1/2009 |
| JP | 2009229184 A | 10/2009 |
| KR | 10-1998-0036844 A | 8/1998 |
| KR | 1020000000261 | 1/2000 |
| KR | 1020000025265 | 5/2000 |
| KR | 1020020041977 | 6/2002 |
| KR | 20030042857 A | 6/2003 |
| KR | 1020040021281 | 3/2004 |
| KR | 1020060020353 | 3/2006 |
| RU | 30009 U1 | 6/2003 |
| RU | 55218 U1 | 7/2006 |
| WO | WO-8601262 A1 | 2/1986 |
| WO | WO-8703988 A1 | 7/1987 |
| WO | WO-8705097 A1 | 8/1987 |
| WO | WO-8802527 A1 | 4/1988 |
| WO | WO-8806703 A1 | 9/1988 |
| WO | WO-9718636 A2 | 5/1997 |
| WO | WO-9748161 A1 | 12/1997 |
| WO | WO-9917066 A1 | 4/1999 |
| WO | WO-9965681 A1 | 12/1999 |
| WO | WO-0021047 A | 4/2000 |
| WO | WO-0169147 A1 | 9/2001 |
| WO | WO-0214968 A1 | 2/2002 |
| WO | WO-0249178 A2 | 6/2002 |
| WO | WO-0275227 A1 | 9/2002 |
| WO | WO-02/090840 A2 | 11/2002 |
| WO | WO-02/090913 A1 | 11/2002 |
| WO | WO-02090914 A1 | 11/2002 |

(56) References Cited

FOREIGN PATENT DOCUMENTS

| WO | WO-03031996 A1 | 4/2003 |
|---|---|---|
| WO | WO-03090000 A1 | 10/2003 |
| WO | WO-04049088 A1 | 6/2004 |
| WO | WO-2005022049 A2 | 3/2005 |
| WO | WO-2005065355 A2 | 7/2005 |
| WO | WO-05073686 A1 | 8/2005 |
| WO | WO-2005108882 A2 | 11/2005 |
| WO | WO-06023075 A2 | 3/2006 |
| WO | WO-2006025880 A1 | 3/2006 |
| WO | WO-2006091521 A2 | 8/2006 |
| WO | WO-2008010988 A1 | 1/2008 |
| WO | WO-2008079108 A1 | 7/2008 |
| WO | WO-08144864 A1 | 12/2008 |
| WO | WO-2009058356 A1 | 5/2009 |
| WO | WO-2009061370 A1 | 5/2009 |
| WO | WO-2012118550 A1 | 9/2012 |

OTHER PUBLICATIONS

Advisory Action regarding U.S. Appl. No. 14/080,473, dated Jan. 30, 2017.
Applicant-Initiated Interview Summary regarding U.S. Appl. No. 13/770,479, dated Dec. 9, 2016.
Louis Goodman et al. "Vertical Motion of Neutrally Buoyant Floats." Journal of Atmospheric and Oceanic Technology. vol. 7. Feb. 1990.
Office Action regarding U.S. Appl. No. 12/943,626, dated Nov. 4, 2016.
Office Action regarding U.S. Appl. No. 14/080,473, dated Nov. 16, 2016.
Office Action regarding U.S. Appl. No. 14/208,636, dated Jan. 26, 2017.
Office Action regarding U.S. Appl. No. 14/244,967, dated Jan. 20, 2017.
Search Report regarding European Patent Application No. 14780284.7, dated Nov. 2, 2016.
Search Report regarding European Patent Application No. 16187893.9, dated Jan. 19, 2017.
Office Action regarding Indian Patent Application No. 102/KOLNP/2009, dated Mar. 10, 2017.
Advisory Action regarding U.S. Appl. No. 14/208,636, dated Mar. 23, 2017.
Office Action regarding U.S. Appl. No. 13/770,479, dated Mar. 17, 2017.
Office Action regarding U.S. Appl. No. 14/080,473, dated Mar. 14, 2017.
Richard E. Lofftus, Jr. "System Charge and Performance Evaluation." HVAC/R Training, Vatterott College. Jan. 2007.
Search Report regarding European Patent Application No. 12752872.7, dated May 4, 2017.
Office Action regarding U.S. Appl. No. 14/300,782, dated Sep. 30, 2016.
Office Action regarding U.S. Appl. No. 14/255,519, dated Oct. 5, 2016.
Office Action regarding Australian Patent Application No. 2015255255, dated Sep. 8, 2016.
Office Action regarding Canadian Patent Application No. 2,908,362, dated Sep. 21, 2016.
Search Report regarding European Patent Application No. 14763232.7, dated Oct. 27, 2016.
Search Report regarding European Patent Application No. 14764311.8, dated Oct. 27, 2016.
Advisory Action and Examiner-Initiated Interview Summary regarding U.S. Appl. No. 13/770,479, dated May 23, 2017.
Interview Summary regarding U.S. Appl. No. 13/770,479, dated May 10, 2017.
Office Action regarding Canadian Patent Application No. 2,934,860, dated May 4, 2017.
Restriction Requirement regarding U.S. Appl. No. 14/607,782, dated Jun. 29, 2017.
Search Report regarding European Patent Application No. 10830696.0, dated Jul. 18, 2017.
Office Action regarding U.S. Appl. No. 14/193,568, dated Jun. 1, 2016.
Office Action regarding U.S. Appl. No. 14/617,451, dated Jun. 2, 2016.
Office Action regarding U.S. Appl. No. 14/080,473, dated Jun. 6, 2016.
Interview Summary regarding U.S. Appl. No. 12/054,011, dated Jan. 30, 2013.
Office Action regarding U.S. Appl. No. 14/193,568, dated Nov. 3, 2015.
Office Action regarding Australian Patent Application No. 2015207920, dated Dec. 4, 2013.
Office Action regarding Chinese Patent Application No. 201380005300.2, dated Jan. 4, 2016. Translation provided by Unitalen Attorneys at Law.
Examiner's Answer regarding U.S. Appl. No. 12/943,626, dated Sep. 19, 2017.
Office Action regarding Australian Patent Application No. 2014248049, dated Oct. 10, 2017.
Office Action regarding European Patent Application No. 07796879.0, dated Oct. 19, 2017.
Office Action regarding European Patent Application No. 07811712.4, dated Jul. 25, 2017.
Office Action regarding Indian Patent Application No. 456/MUMNP/2010, dated Oct. 3, 2017.
Office Action regarding U.S. Appl. No. 14/607,782, dated Sep. 21, 2017.
Advisory Action regarding U.S. Appl. No. 14/193,568, dated Aug. 10, 2016.
Interview Summary regarding U.S. Appl. No. 14/209,415, dated Jun. 20, 2016.
Interview Summary regarding U.S. Appl. No. 14/617,451, dated Jul. 28, 2016.
Office Action regarding Chinese Patent Application No. 201480016023.X, dated Jun. 22, 2016. Translation provided by Unitalen Attorneys at Law.
Office Action regarding U.S. Appl. No. 14/208,636, dated Aug. 4, 2016.
Office Action regarding U.S. Appl. No. 14/727,756, dated Aug. 22, 2016.
Search Report regarding European Patent Application No. 13841699.5, dated Jun. 30, 2016.
Office Action regarding U.S. Appl. No. 14/244,967, dated Aug. 29, 2016.
Office Action regarding Canadian Patent Application No. 2,904,734, dated Sep. 13, 2016.
Office Action regarding U.S. Appl. No. 13/770,479, dated Sep. 7, 2016.
Office Action regarding U.S. Appl. No. 15/096,196, dated Sep. 13, 2016.
"A Practical Example of a Building's Automatic Control," cited in First Office Action from the Patent Office of the People's Republic of China dated Jun. 29, 2007, regarding Application No. 200510005907.8, including translation by CCPIT Patent and Trademark Law Office.
"Air Conditioning Equipment and Diagnostic Primer," Field Diagnostic Services, Inc., Sep. 9, 2002.
"Manual for Freezing and Air Conditioning Technology," Fan Jili, Liaoning Science and Technology Press, Sep. 1995 (cited in First Office Action issued by the Chinese Patent Office regarding Application No. 200780030810.X dated Dec. 25, 2009).
"Product Performance Introduction of York Company," cited in First Office Action from the Patent Office of the People's Republic of China dated Jun. 29, 2007 regarding Application No. 200510005907.8, including translation by CCPIT Patent and Trademark Law Office.
"Small-type Freezing and Air Conditioning Operation," Chinese State Economy and Trading Committee, China Meteorological

(56) References Cited

OTHER PUBLICATIONS

Press, Mar. 2003 (cited in First Office Action issued by the Chinese Patent Office regarding Application No. 200780030810.X dated Dec. 25, 2009).
About CABA: CABA eBulletin, http://www.caba.org/aboutus/ebulletin/issue17/domosys.html, 2 pages.
Advanced Utility Metering: Period of Performance, Subcontractor Report, National Renewable Energy Laboratory, Sep. 2003, 59 pages.
Advisory Action and Interview Summary regarding U.S. Appl. No. 13/407,180, dated May 27, 2015.
Advisory Action Before the Filing of an Appeal Brief regarding U.S. Appl. No. 11/098,575, dated Nov. 16, 2009.
Advisory Action Before the Filing of an Appeal Brief regarding U.S. Appl. No. 11/098,575, dated Sep. 28, 2009.
Advisory Action Before the Filing of an Appeal Brief regarding U.S. Appl. No. 09/977,552, dated Nov. 10, 2005.
Advisory Action from related U.S. Appl. No. 13/784,890 dated Mar. 14, 2014.
Advisory Action regarding U.S. Appl. No. 12/261,643, dated Nov. 22, 2013.
Advisory Action regarding U.S. Appl. No. 13/269,188, dated Apr. 13, 2015.
Advisory Action regarding U.S. Appl. No. 11/214,179, dated Aug. 28, 2009.
Applicant-Initiated Interview Summary and Advisory Action regarding U.S. Appl. No. 13/369,067, dated Jul. 23, 2015.
Applicant-Initiated Interview Summary regarding U.S. Appl. No. 14/212,632, dated Sep. 2, 2015.
BChydro, "Power Factor" Guides to Energy Management: The GEM Series, Oct. 1999.
Building Control Unit (BCU) Installation and Operation Manual, Computer Process Controls, Jan. 28, 1998, 141 pages.
Building Environmental Control (BEC) Installation and Operation Manual, Computer Process Controls, Jan. 5, 1998.
Case Studies: Automated Meter Reading and Load Shed System, http://groupalpha.corn/CaseStudies2.html, Aug. 23, 2004, 1 page.
Communication from European Patent Office concerning Substantive Examination regarding European Patent Application No. 06790063.9, dated Jun. 6, 2011.
Cost Cutting Techniques Used by the Unscrupulous, http://www.kellyshvac.com/howto.html, Oct. 7, 2004, 3 pages.
Einstein RX-300 Refrigeration Controller Installation and Operation Manual, Computer Process Controls, Apr. 1, 1998, 329 pages.
Election/Restriction Requirement regarding U.S. Appl. No. 09/977,552, dated Jan. 25, 2007.
European Search Report for Application No. EP 12 182 243.1, dated Oct. 29, 2012.
European Search Report for EP 01 30 7547; dated Feb. 20, 2002; 1 Page.
European Search Report for EP 02 25 0266; dated May 17, 2002; 3 Pages.
European Search Report for EP 02 72 9050, dated Jun. 17, 2004, 2 pages.
European Search Report for EP 82306809.3; dated Apr. 28, 1983; 1 Page.
European Search Report for EP 91 30 3518; dated Jul. 22, 1991; 1 Page.
European Search Report for EP 93 30 4470; dated Oct. 26, 1993; 1 Page.
European Search Report for EP 94 30 3484; dated Apr. 3, 1997; 1 Page.
European Search Report for EP 96 30 4219; dated Dec. 1, 1998; 2 Pages.
European Search Report for EP 98 30 3525; dated May 28, 1999; 2 Pages.
European Search Report for EP 99 30 6052; dated Dec. 28, 1999; 3 Pages.
European Search Report regarding Application No. 04022784.5-2315 / 1500821, dated Aug. 14, 2012.
European Search Report regarding Application No. EP02729051, dated Feb. 17, 2005.
Examination Report received from Australian Government IP Australia dated Oct. 29, 2009 regarding patent application No. 2008202088.
Examiner Interview regarding U.S. Appl. No. 11/256,641, dated Sep. 16, 2008.
Examiner Interview Summary regarding U.S. Appl. No. 11/394,380, dated Jul. 29, 2010.
Examiner Interview Summary regarding U.S. Appl. No. 10/940,877, dated Dec. 8, 2008.
Examiner Interview Summary regarding U.S. Appl. No. 10/940,877, dated Mar. 2, 2007.
Examiner Interview Summary regarding U.S. Appl. No. 10/940,877, dated Mar. 25, 2008.
Examiner's Answer from related U.S. Appl. No. 13/784,890 dated Jul. 3, 2014.
Examiner's Answer regarding U.S. Appl. No. 09/977,552, dated Dec. 17, 2009.
Examiner's First Report on Australian Patent Application No. 2002259066, dated Mar. 1, 2006.
Examiner's First Report on Australian Patent Application No. 2007292917 dated Jan. 10, 2012.
Examiner's First Report on Australian Patent Application No. 2008319275, dated Jan. 31, 2011.
Examiner's Report No. 1 regarding Australian Patent Application No. 2013202431, dated Nov. 25, 2014.
Examiner's Report No. 2 regarding Australian Patent Application No. 2008325240, dated Mar. 5, 2012.
Examiner-Initiated Interview Summary regarding U.S. Appl. No. 11/214,179, dated Dec. 11, 2009.
Extended European Search Report regarding Application No. 07796879.0-1602 / 2041501 PCT/US2007016135, dated Jul. 14, 2014.
Extended European Search Report regarding European Application No. 08845689.2-1608/2207964, dated Jun. 19, 2015.
Extended European Search Report regarding European Application No. 08848538.8-1608 / 2220372, dated Jun. 19, 2015.
Faramarzi et al., "Performance Evaluation of Rooftop Air Conditioning Units at High Ambient Temperatures," 2004 ACEEE Summer Study on Energy Efficiency in Buildings—http://aceee.org/files/proceedings/2004/data/papers/SSO4_Panel3_Paper05.pdf.
Final Office Action and Interview Summary regarding U.S. Appl. No. 13/407,180, dated Mar. 13, 2015.
Final Office Action for U.S. Appl. No. 13/770,123 dated Dec. 22, 2014.
Final Office Action for U.S. Appl. No. 11/850,846, dated Aug. 13, 2012.
Final Office Action from related U.S. Appl. No. 13/269,188 dated May 23, 2013; 11 pages.
Final Office Action from related U.S. Appl. No. 13/369,067 dated May 1, 2014; 19 pages.
Final Office Action from related U.S. Appl. No. 13/767,479 dated Mar. 14, 2014; 6 pages.
Final Office Action from related U.S. Appl. No. 13/836,043 dated Mar. 12, 2014; 5 pages.
Final Office Action regarding U.S. Appl. No. 11/497,579, dated May 14, 2010.
Final Office Action regarding U.S. Appl. No. 11/497,644, dated Dec. 22, 2010.
Final Office Action regarding U.S. Appl. No. 11/850,846, dated Jan. 17, 2014.
Final Office Action regarding U.S. Appl. No. 13/770,123, dated Nov. 15, 2013.
Final Office Action regarding U.S. Appl. No. 13/784,890, dated Dec. 30, 2013.
Final Office Action regarding U.S. Appl. No. 13/932,611, dated May 28, 2014.
Final Office Action regarding U.S. Appl. No. 13/770,479, dated Sep. 4, 2015.
Final Office Action regarding U.S. Appl. No. 11/214,179, dated Jul. 21, 2011.
Final Office Action regarding U.S. Appl. No. 09/977,552, dated Oct. 22, 2008.

(56) References Cited

OTHER PUBLICATIONS

Final Office Action regarding U.S. Appl. No. 09/977,552, dated Apr. 26, 2004.
Final Office Action regarding U.S. Appl. No. 09/977,552, dated May 13, 2005.
Final Office Action regarding U.S. Appl. No. 09/977,552, dated Jun. 18, 2003.
Final Office Action regarding U.S. Appl. No. 09/977,552, dated Jul. 23, 2007.
Final Office Action regarding U.S. Appl. No. 10/061,964, dated Mar. 8, 2004.
Final Office Action regarding U.S. Appl. No. 10/940,877, dated Nov. 13, 2007.
Final Office Action regarding U.S. Appl. No. 10/940,877, dated Apr. 27, 2009.
Final Office Action regarding U.S. Appl. No. 10/940,877, dated May 2, 2006.
Final Office Action regarding U.S. Appl. No. 11/098,575, dated Jun. 17, 2010.
Final Office Action regarding U.S. Appl. No. 11/214,179, dated May 29, 2009.
Final Office Action regarding U.S. Appl. No. 11/256,641, dated Feb. 2, 2009.
Final Office Action regarding U.S. Appl. No. 11/337,918, dated Feb. 17, 2011.
Final Office action regarding U.S. Appl. No. 11/337,918, dated Feb. 4, 2010.
Final Office Action regarding U.S. Appl. No. 12/261,643, dated Jun. 27, 2012.
Final Office Action regarding U.S. Appl. No. 12/261,643, dated Sep. 16, 2013.
Final Office Action regarding U.S. Appl. No. 12/261,643, dated Jul. 7, 2011.
First Chinese Office Action regarding Application No. 201380005300.2, dated Apr. 30, 2015. Translation provided by Unitalen Attorneys at Law.
First Examination Communication regarding European Application No. EP02729051.9, dated Dec. 23, 2005.
First Examination Report regarding Australian Patent Application No. 2010319488, dated Jan. 10, 2013.
First Examination Report regarding Australian Patent Application No. 2012241185, dated Sep. 27, 2013.
First Office Action from the Patent Office of the People's Republic of China dated Jun. 8, 2007, Application No. 200480027753.6 and Translation provided by CCPIT.
First Office Action from the Patent Office of the People's Republic of China regarding Application No. 200510005907.8, dated Jun. 29, 2007.
First Office Action from the State Intellectual Property Office of the People's Republic of China regarding Chinese Patent Application No. 200890100287.3, dated Oct. 25, 2010. Translation provided by Unitalen Attorneys at Law.
First Office Action issued by the Chinese Patent Office dated May 30, 2008 regarding Application No. 200580013451.8, 8 Pages.
First Office Action received from the Chinese Patent Office dated Feb. 2, 2007 regarding Application No. 200480011463.2, translated by CCPIT Patent and Trademark Law Office.
First Office Action regarding Canadian Patent Application No. 2,777,349, dated Jul. 19, 2013.
First Office Action regarding Chinese Patent Application No. 200780032977.X, dated Sep. 27, 2010. English translation provided by Unitalen Attorneys at Law.
First Office Action regarding Chinese Patent Application No. 200910211779.0, dated May 3, 2012. English translation provided by Unitalen Attorneys at Law.
First Office Action regarding Chinese Patent Application No. 201010117657.8, dated Dec. 29, 2010. English translation provided by Unitalen Attorneys at Law.
First Office Action regarding Chinese Patent Application No. 201110349785.X, dated Nov. 21, 2013, and Search Report. English translation provided by Unitalen Attorneys at Law.
First Office Action regarding Chinese Patent Application No. 201280010796.8, dated Sep. 14, 2015. Translation provided by Unitalen Attorneys at Law.
First Official Report regarding Australian Patent Application No. 2007214381, dated Dec. 12, 2008.
Flow & Level Measurement: Mass Flowmeters, http://www.omega.com/literature/transactions/volume4/T9904-10-MASS.html, 2001, 19 pages.
Fourth Office Action from the State Intellectual Property Office of People's Republic of China regarding Chinese Patent Applicaiton No. 200510005907.8, dated Dec. 8, 2011. Translation provided by Unitalen Attorneys at Law.
Fourth Office Action regarding Chinese Patent Application No. 200910211779.0, dated Jan. 6, 2014. English translation provided by Unitalen Attorneys at Law.
Frequently Asked Questions, http://www.lipaedge.com/faq.asp, Copyright © 2001, 5 pages.
Haiad et al., "EER & SEER as Predictors of Seasonal Energy Performance ", Oct. 2004, Southern California Edison, http://www.doe2.com/download/DEER/SEER%2BProgThermostats/EER-SEER_CASE_ProjectSummary_Oct2004_V6a.pdf.
Home Comfort Zones, MyTemp Room-by-Room Zone Control, Nov. 2009.
Home Comfort Zones, MyTemp User Manual v4.3, May 2008.
Home Comfort Zones, Save Energy with MyTemp™ Zone Control, Dec. 2009.
Home Comfort Zones, Smart Controller™ MyTemp™ Room by Room Temperature Control and Energy Management, User Manual, Aug. 2007.
Honeywell, A7075A1000 HVAC Service Assistant, 2001.
Honeywell, Advanced Portable A/C Diagnostics, The HVAC Service Assistant, 2003.
Honeywell, Alerts and Delta T Diagnostics with Prestige® 2.0 IAQ Thermostat, 69/2678-02, Sep. 2011.
Honeywell, Excel 5000® System, Excel Building Supervisor—Integrated, 74/2034, Copyright© 1994, Rev. Nov. 1994, 12 pages
Honeywell, Excel 5000® System, Excel Building Supervisor, 74/2033-1, Copyright © 1996, Rev. Jun. 1996, 12 pages.
Honeywell, HVAC Service Assistant, TRGpro PalmTM OS Interface and HVAC Service Assistant A7075A1000, 2002.
Honeywell, Prestige System Installation Guide, THX9321/9421 Prestige® IAQ and RF EIM, 64/2490-03, Jul. 2011.
Honeywell, RedLINK™ Wireless Comfort Systems brochure, 50/1194, Sep. 2011.
HVAC Service Assistant, ACRx Efficiency and Capacity Estimating Technology, Field Diagnostics, 2004.
International Preliminary Examination Report regarding PCT/US02/13456, dated Sep. 15, 2003.
International Preliminary Report on Patentability for International Application No. PCT/US2008/009618, dated Mar. 24, 2010.
International Preliminary Report on Patentability for International Application No. PCT/US2008/012362, dated May 4, 2010.
International Preliminary Report on Patentability for International Application No. PCT/US2008/012364, dated May 4, 2010.
International Preliminary Report on Patentability regarding Application No. PCT/US2010/056315, dated May 24, 2012.
International Preliminary Report on Patentability regarding International Application No. PCT/US2007/019563 dated Mar. 10, 2009.
International Search Report and Written Opinion for related PCT Application No. PCT/US2014/028859, dated Aug. 22, 2014.
International Search Report and Written Opinion of the International Searching Authority regarding International Application No. PCT/US06/33702, dated Sep. 26, 2007.
International Search Report and Written Opinion of the ISA regarding International Application No. PCT/US2014/032927, ISA/KR dated Aug. 21, 2014.
International Search Report for International Application No. PCT/US07/019563, dated Jan. 15, 2008, 3 Pages.
International Search Report for International Application No. PCT/US2005/11154, dated Oct. 19, 2005.

(56) References Cited

OTHER PUBLICATIONS

International Search Report for International Application No. PCT/US2007/016135 dated Oct. 22, 2007.
International Search Report for International Application No. PCT/US2008/012362, dated Feb. 12, 2009.
International Search Report for International Application No. PCT/US2008/012364 dated Mar. 13, 2009.
International Search Report for PCT/US02/13459; ISA/US; dated Sep. 19, 2002.
International Search Report for PCT/US2012/026973, dated Sep. 3, 2012, 5 pages.
International Search Report for PCT/US2013/061389, dated Jan. 22, 2014, 7 pages.
International Search Report from PCT /US2008/060900, dated Aug. 4, 2008, 6 pages.
International Search Report from related PCT Application No. PCT/US2014/028074 dated Jun. 19, 2014.
International Search Report regarding Application No. PCT/US2010/036601, dated Dec. 29, 2010.
International Search Report regarding Application No. PCT/US2010/056315, dated Jun. 28, 2011.
International Search Report regarding Application No. PCT/US2013/021161, dated May 8, 2013.
International Search Report, Int'l. App. No. PCT/US 06/05917, dated Sep. 26, 2007.
International Search Report, International Application No. PCT/US02/13456, dated Aug. 22, 2002, 2 Pages.
International Search Report, International Application No. PCT/US04/13384; dated Aug. 1, 2004; 1 Page.
International Search Report, International Application No. PCT/US2004/027654, dated Aug. 25, 2004, 4 Pages.
International Search Report, International Application No. PCT/US2006/040964, dated Feb. 15, 2007, 2 Pages.
International Search Report; International Application No. PCT/IB96/01435; dated May 23, 1997; 1 Page.
International Search Report; International Application No. PCT/US98/18710; dated Jan. 26, 1999; 1 Page.
Interview Summary from related U.S. Appl. No. 12/054,011 dated Jan. 30, 2012.
Interview Summary regarding U.S. Appl. No. 11/497,644, dated May 4, 2010.
Interview Summary regarding U.S. Appl. No. 13/269,188, dated Mar. 18, 2015.
Interview Summary regarding U.S. Appl. No. 13/369,067, dated Jul. 16, 2015.
Interview Summary regarding U.S. Appl. No. 13/407,180, dated Jun. 11, 2015.
Interview Summary regarding U.S. Appl. No. 13/770,479, dated Jun. 16, 2015.
Interview Summary regarding U.S. Appl. No. 13/770,479, dated Nov. 25, 2015.
Interview Summary regarding U.S. Appl. No. 11/098,582, dated Apr. 27, 2010.
Interview Summary regarding U.S. Appl. No. 11/214,179, dated Jan. 30, 2009.
Interview Summary regarding U.S. Appl. No. 11/497,579, dated Jul. 15, 2010.
Issue Notification regarding U.S. Appl. No. 11/214,179, dated Mar. 14, 2012.
Jeffus, Larry, "Refrigeration and Air Conditioning: An Introduction to HVAC/R," Appendix C, pp. 1060-1063, Copyright 2004.
Jeffus, Larry, "Refrigeration and Air Conditioning: An Introduction to HVAC/R," Section II, Chapter 4, pp. 176-201, Copyright 2004.
Jeffus, Larry, "Refrigeration and Air Conditioning: An Introduction to HVAC/R," Section II, Chapter 5, pp. 239-245, Copyright 2004.
Jeffus, Larry, "Refrigeration and Air Conditioning: An Introduction to HVAC/R," Section II, Chapter 6, p. 322, Copyright 2004.
Jeffus, Larry, "Refrigeration and Air Conditioning: An Introduction to HVAC/R," Section IV, Chapter 9, pp. 494-504, Copyright 2004.

K. A. Manske et al.; Evaporative Condenser Control in Industrial Refrigeration Systems; University of Wisconsin—Madison, Mechanical Engineering Department; International Journal of Refrigeration, vol. 24, No. 7; pp. 676-691; 2001, 21 pages.
Li et al., "Development, Evaluation, and Demonstration of a Virtual Refrigerant Charge Sensor," Jan. 2009, HVAC&R Research, Oct. 27, 2008, 21 pages.
Liao et al., A Correlation of Optimal Heat Rejection Pressures in Transcritical Carbon Dioxide Cycles, Applied Thermal Engineering 20 (2000), Jul. 25, 1999, 831-841.
LIPA Launches Free, First-in-Nation Internet-Based Air Conditioner Control Program to Help LIPA and Its Customers Conserve Electricity & Save Money, Apr. 19, 2001, http://www.lipower.org/newscmter/pr/2001/april19_01.html, 3 pages.
Low-Cost Multi-Service Home Gateway Creates New Business Opportunities, Coactive Networks, Copyright 1998-1999, 7 pages.
Nickles, Donald, "Broadband Communications Over Power Transmission Lines," A Guest Lecture From the Dr. Shreekanth Mandaynam Engineering Frontiers Lecture Series, May 5, 2004, 21 pages.
Non Final Office Action for U.S. Appl. No. 13/407,180, dated Dec. 2, 2014.
Non Final Office Action for related U.S. Appl. No. 13/369,067 dated Aug. 12, 2014.
Non Final Office Action for related U.S. Appl. No. 13/835,621 dated Aug. 8, 2014.
Non Final Office Action from related U.S. Appl. No. 13/269,188 dated Aug. 14, 2012; 9 pages.
Non Final Office Action from related U.S. Appl. No. 13/269,188 dated Oct. 4, 2013; 11 pages.
Non Final Office Action from related U.S. Appl. No. 13/269,188 dated Feb. 20, 2014; 9 pages.
Non Final Office Action from related U.S. Appl. No. 13/269,188 dated Jul. 17, 2014; 10 pages.
Non Final Office Action from related U.S. Appl. No. 13/369,067 dated Jan. 16, 2014; 16 pages.
Non Final Office Action from related U.S. Appl. No. 13/767,479 dated Oct. 24, 2013; 8 pages.
Non Final Office Action from related U.S. Appl. No. 13/767,479 dated Jul. 23, 2014; 9 pages.
Non Final Office Action from related U.S. Appl. No. 13/835,621 dated Oct. 30, 2013; 8 pages.
Non Final Office Action from related U.S. Appl. No. 13/835,621 dated Apr. 2, 2014; 11 pages.
Non Final Office Action from related U.S. Appl. No. 13/835,742 dated Oct. 7, 2013; 9 pages.
Non Final Office Action from related U.S. Appl. No. 13/835,810 dated Nov. 15, 2013; 9 pages.
Non Final Office Action from related U.S. Appl. No. 13/836,043 dated Oct. 23, 2013; 8 pages.
Non Final Office Action from related U.S. Appl. No. 13/836,043 dated Jul. 11, 2014; 5 pages.
Non Final Office Action from related U.S. Appl. No. 13/836,244 dated Oct. 15, 2013; 11 pages.
Non Final Office Action from related U.S. Appl. No. 13/836,244 dated Feb. 20, 2014; 10 pages.
Non Final Office Action from related U.S. Appl. No. 13/836,453 dated Aug. 20, 2013; 8 pages.
Non-Final Office Action for U.S. Appl. No. 11/098,575 dated Jan. 27, 2010.
Non-Final Office Action for U.S. Appl. No. 11/776,879, dated Mar. 16, 2012.
Non-Final Office Action for U.S. Appl. No. 12/685,375, dated Aug. 6, 2012.
Non-Final Office Action for U.S. Appl. No. 13/030,549, dated Nov. 5, 2012.
Non-Final Office Action in U.S. Appl. No. 11/850,846, dated May 24, 2013.
Non-Final Office Action in U.S. Appl. No. 13/784,890, dated Jun. 11, 2013.
Non-Final Office Action in U.S. Appl. No. 12/685,375, dated Jan. 19, 2012.
Non-Final office Action regarding U.S. Appl. No. 11/850,846, dated Apr. 24, 2012.

(56) References Cited

OTHER PUBLICATIONS

Non-Final Office Action regarding U.S. Appl. No. 13/770,123, dated Jul. 3, 2013.
Non-Final Office Action regarding U.S. Appl. No. 13/932,611, dated Nov. 25, 2013.
Non-Final Office Action regarding U.S. Appl. No. 11/214,179, dated Jan. 24, 2011.
Non-Final Office Action regarding U.S. Appl. No. 11/214,179, dated Nov. 5, 2008.
Non-Final Office Action regarding U.S. Appl. No. 11/214,179, dated Jun. 8, 2010.
Non-Final Office Action regarding U.S. Appl. No. 12/261,643, dated Jan. 27, 2011.
Non-Final Office Action regarding U.S. Appl. No. 12/261,643, dated Mar. 12, 2013.
Non-Final Office Action regarding U.S. Appl. No. 12/943,626, dated Dec. 20, 2012.
Non-Final Office Action regarding U.S. Appl. No. 12/955,355, dated Sep. 11, 2012.
Non-Final Office Action regarding U.S. Appl. No. 13/176,021, dated May 8, 2012.
Non-Final Office Action regarding U.S. Appl. No. 13/435,543, dated Jun. 21, 2012.
Non-Final Office Action regarding U.S. Appl. No. 13/770,123, dated Jun. 11, 2014.
Non-Final Office Action regarding U.S. Appl. No. 13/770,479, dated Jan. 16, 2014.
Non-Final Office Action regarding U.S. Appl. No. 13/932,611, dated Jan. 30, 2015.
Notice of Allowance and Fee(s) Due regarding U.S. Appl. No. 12/789,562, dated Oct. 26, 2012.
Notice of Allowance and Fees Due and Notice of Allowability regarding U.S. Appl. No. 11/098,582, dated Feb. 24, 2009.
Notice of Allowance and Fees Due and Notice of Allowability regarding U.S. Appl. No. 11/098,582, dated Sep. 24, 2010.
Notice of Allowance and Fees Due and Notice of Allowability regarding U.S. Appl. No. 11/256,641, dated May 19, 2009.
Notice of Allowance and Fees Due regarding U.S. Appl. No. 12/261,643, dated Jun. 23, 2014.
Notice of Allowance and Fees Due regarding U.S. Appl. No. 12/943,626, dated Jun. 19, 2014.
Notice of Allowance and Fees Due regarding U.S. Appl. No. 13/737,566, dated Jun. 18, 2014.
Notice of Allowance and Fees Due regarding U.S. Appl. No. 13/737,566, dated Sep. 24, 2014.
Notice of Allowance and Fees Due, Interview Summary and Notice of Allowability regarding U.S. Appl. No. 11/214,179, dated Nov. 23, 2011.
Notice of Allowance and Interview Summary regarding U.S. Appl. No. 13/269,188, dated Aug. 26, 2015.
Notice of Allowance and Notice of Allowability regarding U.S. Appl. No. 10/286,419, dated Dec. 2, 2004.
Notice of Allowance and Notice of Allowability regarding U.S. Appl. No. 10/675,137, dated Dec. 16, 2005.
Notice of Allowance dated Dec. 21, 2007 from Related U.S. Appl. No. 11/417,609.
Notice of Allowance dated Dec. 3, 2007 from Related U.S. Appl. No. 11/130,562.
Notice of Allowance dated Feb. 12, 2007 from Related U.S. Appl. No. 11/130,871.
Notice of Allowance dated Jul. 13, 2006 from Related U.S. Appl. No. 11/130,601.
Notice of Allowance dated Jul. 25, 2007 from Related U.S. Appl. No. 10/916,223.
Notice of Allowance dated Jun. 11, 2007 from Related U.S. Appl. No. 10/916,222.
Notice of Allowance dated May 29, 2007 from Related U.S. Appl. No. 11/130,569.
Notice of Allowance dated Nov. 3, 2008 from Related U.S. Appl. No. 11/417,701.
Notice of Allowance dated Oct. 26, 2007 from Related U.S. Appl. No. 10/916,223.
Notice of Allowance for U.S. Appl. No. 13/835,742 dated Dec. 24, 2014.
Notice of Allowance for U.S. Appl. No. 13/835,810 dated Jan. 2, 2015.
Notice of Allowance for U.S. Appl. No. 13/836,043 dated Feb. 4, 2015.
Notice of Allowance for U.S. Appl. No. 13/836,453 dated Dec. 24, 2014.
Notice of Allowance for related U.S. Appl. No. 13/835,810 dated Aug. 5, 2014.
Notice of Allowance for related U.S. Appl. No. 13/836,043, dated Oct. 9, 2014.
Notice of Allowance for related U.S. Appl. No. 13/836,244, dated Oct. 30, 2014.
Notice of Allowance for U.S. Appl. No. 10/698,048, dated Sep. 1, 2005.
Notice of Allowance from related U.S. Appl. No. 13/835,742 dated Jan. 31, 2014; 7 pages.
Notice of Allowance from related U.S. Appl. No. 13/835,742 dated Jun. 2, 2014; 8 pages.
Notice of Allowance from related U.S. Appl. No. 13/835,810 dated Mar. 20, 2014; 9 pages.
Notice of Allowance from related U.S. Appl. No. 13/836,453 dated Jan. 14, 2014; 8 pages.
Notice of Allowance from related U.S. Appl. No. 13/836,453 dated Apr. 21, 2014; 8 pages.
Notice of Allowance from related U.S. Appl. No. 13/836,453 dated Aug. 4, 2014.
Notice of Allowance from related U.S. Appl. No. 13/836,244 dated Jul. 2, 2014; 8 pages.
Notice of Allowance regarding U.S. Appl. No. 13/767,479, dated Mar. 31, 2015.
Notice of Allowance regarding U.S. Appl. No. 13/770,123, dated Oct. 1, 2015.
Notice of Allowance regarding U.S. Appl. No. 13/835,621, dated Mar. 10, 2015.
Notice of Allowance regarding U.S. Appl. No. 12/261,643, dated Jul. 29, 2015.
Notice of Allowance regarding U.S. Appl. No. 13/369,067, dated Sep. 2, 2015.
Notice of Allowance regarding U.S. Appl. No. 13/407,180, dated Sep. 4, 2015.
Notice of Allowance regarding U.S. Appl. No. 13/770,123, dated Aug. 13, 2015.
Notice of Allowance regarding U.S. Appl. No. 13/835,742, dated Apr. 17, 2015.
Notice of Allowance regarding U.S. Appl. No. 13/836,453, dated Apr. 15, 2015.
Notice of Allowance regarding U.S. Appl. No. 13/932,611, dated Jul. 6, 2015.
Notice of Allowance regarding U.S. Appl. No. 10/061,964, dated Jul. 19, 2004.
Notice of Allowance regarding U.S. Appl. No. 10/940,877, dated Sep. 4, 2009.
Notice of Allowance regarding U.S. Appl. No. 11/776,879, dated Jul. 9, 2012.
Notice of Allowance regarding U.S. Appl. No. 12/261,677, dated Dec. 15, 2011.
Notice of Allowance regarding U.S. Appl. No. 12/685,424, dated Apr. 25, 2011.
Notice of Allowance regarding U.S. Appl. No. 13/303,286, dated Jul. 19, 2012.
Notice of Grounds for Refusal regarding Korean Patent Application No. 10-2009-7000850, dated Oct. 4, 2013. English translation provided by Y.S. Chang & Associates.
Notice of Panel Decision from Pre-Appeal Brief Review regarding U.S. Appl. No. 09/977,552, dated Aug. 4, 2009.
Notification of First Office Action from the State Intellectual Property Office of People's Republic of China regarding Chinese Patent Application No. 200880122964.6, dated Nov. 5, 2012. Translation provided by Unitalen Attorneys at Law.

(56) References Cited

OTHER PUBLICATIONS

Office Action and Interview Summary regarding U.S. Appl. No. 14/244,967, dated Oct. 7, 2015.
Office Action Communication regarding U.S. Appl. No. 09/977,552, dated Apr. 18, 2007.
Office Action dated Apr. 19, 2006 from Related U.S. Appl. No. 10/916,223.
Office Action dated Aug. 17, 2007 from Related U.S. Appl. No. 11/417,609.
Office Action dated Aug. 17, 2007 from Related U.S. Appl. No. 11/417,701.
Office Action dated Aug. 21, 2007 from Related U.S. Appl. No. 11/417,557.
Office Action dated Feb. 1, 2007 from Related U.S. Appl. No. 11/130,562.
Office Action dated Feb. 13, 2009 from Related U.S. Appl. No. 12/033,765.
Office Action dated Feb. 13, 2009 from Related U.S. Appl. No. 12/050,821.
Office Action dated Feb. 15, 2008 from Related U.S. Appl. No. 11/417,557.
Office Action dated Feb. 3, 2009 from Related U.S. Appl. No. 11/866,295.
Office Action dated Jan. 18, 2006 from Related U.S. Appl. No. 11/130,601.
Office Action dated Jan. 18, 2006 from Related U.S. Appl. No. 11/130,871.
Office Action dated Jan. 23, 2007 from Related U.S. Appl. No. 10/916,222.
Office Action dated Jan. 6, 2006 from Related U.S. Appl. No. 11/130,562
Office Action dated Jan. 6, 2006 from Related U.S. Appl. No. 10/916,222.
Office Action dated Jul. 1, 2008 from Related U.S. Appl. No. 11/927,425.
Office Action dated Jul. 11, 2006 from Related U.S. Appl. No. 11/130,562.
Office Action dated Jul. 11, 2006 from Related U.S. Appl. No. 10/916,222.
Office Action dated Jul. 11, 2007 from Related U.S. Appl. No. 11/417,609.
Office Action dated Jul. 11, 2007 from Related U.S. Appl. No. 11/417,701.
Office Action dated Jul. 16, 2008 from Related U.S. Appl. No. 11/417,701.
Office Action dated Jul. 24, 2008 from Related U.S. Appl. No. 11/417,557.
Office Action dated Jul. 27, 2006 from Related U.S. Appl. No. 11/130,871.
Office Action dated Jun. 17, 2009 from Related U.S. Appl. No. 12/033,765.
Office Action dated Jun. 19, 2009 from Related U.S. Appl. No. 11/866,295.
Office Action dated Jun. 22, 2009 from Related U.S. Appl. No. 12/050,821.
Office Action dated Jun. 27, 2007 from Related U.S. Appl. No. 11/417,557.
Office Action dated Mar. 30, 2006 from Related U.S. Appl. No. 11/130,569.
Office Action dated May 4, 2005 from Related U.S. Appl. No. 10/916,223.
Office Action dated May 6, 2009 from Related U.S. Appl. No. 11/830,729.
Office Action dated Nov. 14, 2006 from Related U.S. Appl. No. 11/130,569.
Office Action dated Nov. 16, 2006 from Related U.S. Appl. No. 10/916,223.
Office Action dated Nov. 8, 2005 from Related U.S. Appl. No. 10/916,222.
Office Action dated Nov. 9, 2005 from Related U.S. Appl. No. 11/130,562.
Office Action dated Nov. 9, 2005 from Related U.S. Appl. No. 11/130,601.
Office Action dated Nov. 9, 2005 from Related U.S. Appl. No. 11/130,871.
Office Action dated Oct. 27, 2005 from Related U.S. Appl. No. 10/916,223.
Office Action dated Sep. 18, 2007 from Related U.S. Appl. No. 11/130,562.
Office Action for U.S. Appl. No. 13/269,188 dated Feb. 10, 2015.
Office Action for U.S. Appl. No. 13/767,479 dated Feb. 6, 2015.
Office Action for U.S. Appl. No. 13/835,621 dated Dec. 29, 2014.
Office Action for Canadian Application No. 2,828,740 dated Jan. 12, 2015.
Office Action for related U.S. Appl. No. 13/269,188, dated Oct. 6, 2014.
Office Action for related U.S. Appl. No. 13/767,479, dated Oct. 21, 2014.
Office Action for U.S. Appl. No. 11/394,380, dated Jan. 6, 2009.
Office Action for U.S. Appl. No. 11/497,579, dated Oct. 27, 2009.
Office Action for U.S. Appl. No. 11/497,644, dated Dec. 19, 2008.
Office Action for U.S. Appl. No. 11/497,644, dated Jul. 10, 2009.
Office Action from U.S. Appl. No. 13/369,067 dated Apr. 3, 2015.
Office Action regarding U.S. Appl. No. 13/770,479, dated Mar. 16, 2015.
Office Action regarding U.S. Appl. No. 13/770,123, dated Apr. 2, 2015.
Office Action regarding Australian Patent Application No. 2013323760, dated Sep. 25, 2015.
Office Action regarding Chinese Patent Application No. 201380049458.X, dated Nov. 13, 2015. Translation provided by Unitalen Attorneys at Law.
Office Action regarding Indian Patent Application No. 733/KOLNP/2009, dated Aug. 12, 2015.
Office Action regarding U.S. Appl. No. 10/286,419, dated Jun. 10, 2004.
Office Action regarding U.S. Appl. No. 11/098,575, dated Jan. 29, 2009.
Office Action regarding U.S. Appl. No. 11/098,575, dated Mar. 26, 2008.
Office Action regarding U.S. Appl. No. 11/098,575, dated Jul. 13, 2009.
Office Action regarding U.S. Appl. No. 11/098,575, dated Sep. 9, 2008.
Office Action regarding U.S. Appl. No. 11/120,166, dated Oct. 2, 2006.
Office Action regarding U.S. Appl. No. 11/120,166, dated Oct. 2, 2007.
Office Action regarding U.S. Appl. No. 11/120,166, dated Dec. 15, 2008.
Office Action regarding U.S. Appl. No. 11/120,166, dated Feb. 17, 2010.
Office Action regarding U.S. Appl. No. 11/120,166, dated Apr. 12, 2007.
Office Action regarding U.S. Appl. No. 11/120,166, dated Jun. 5, 2008.
Office Action regarding U.S. Appl. No. 11/120,166, dated Jul. 20, 2009.
Office Action regarding U.S. Appl. No. 11/394,380, dated Sep. 25, 2009.
Office Action regarding U.S. Appl. No. 11/497,644, dated Jan. 29, 2010.
Office Action regarding U.S. Appl. No. 11/497,644, dated Jun. 14, 2010.
Office Action regarding U.S. Appl. No. 14/209,415, dated Sep. 10, 2015.
Office Action regarding U.S. Appl. No. 14/212,632, dated Nov. 19, 2015.
Office Action regarding U.S. Appl. No. 14/255,519, dated Nov. 9, 2015.
Office Action regarding U.S. Appl. No. 09/977,552, dated Jan. 11, 2008.

(56) References Cited

OTHER PUBLICATIONS

Office Action regarding U.S. Appl. No. 09/977,552, dated Jan. 14, 2003.
Office Action regarding U.S. Appl. No. 09/977,552, dated Oct. 18, 2004.
Office Action regarding U.S. Appl. No. 09/977,552, dated Dec. 3, 2003.
Office Action regarding U.S. Appl. No. 09/977,552, dated Jul. 12, 2006.
Office Action regarding U.S. Appl. No. 10/061,964, dated Oct. 3, 2003.
Office Action regarding U.S. Appl. No. 10/675,137, dated Feb. 4, 2005.
Office Action regarding U.S. Appl. No. 10/675,137, dated Jun. 29, 2005.
Office Action regarding U.S. Appl. No. 10/675,137, dated Sep. 7, 2004.
Office Action regarding U.S. Appl. No. 10/698,048, dated Mar. 21, 2005.
Office Action regarding U.S. Appl. No. 10/940,877, dated Oct. 27, 2006.
Office Action regarding U.S. Appl. No. 10/940,877, dated Nov. 14, 2005.
Office Action regarding U.S. Appl. No. 10/940,877, dated Dec. 8, 2008.
Office Action regarding U.S. Appl. No. 10/940,877, dated May 21, 2007.
Office Action regarding U.S. Appl. No. 10/940,877, dated Jun. 5, 2008.
Office Action regarding U.S. Appl. No. 11/098,582 dated Mar. 3, 2010.
Office Action regarding U.S. Appl. No. 11/098,582, dated Jul. 7, 2008.
Office Action regarding U.S. Appl. No. 11/098,582, dated Aug. 4, 2009.
Office Action regarding U.S. Appl. No. 11/098,582, dated Sep. 21, 2007.
Office Action regarding U.S. Appl. No. 11/256,641, dated Apr. 29, 2008.
Office Action regarding U.S. Appl. No. 11/337,918, dated Mar. 25, 2008.
Office Action regarding U.S. Appl. No. 11/337,918, dated Aug. 17, 2009.
Office Action regarding U.S. Appl. No. 11/337,918, dated Oct. 28, 2008.
Office Action regarding U.S. Appl. No. 11/776,879, dated Sep. 17, 2010.
Office Action regarding U.S. Appl. No. 11/850,846, dated Aug. 13, 2010.
Office Action regarding U.S. Appl. No. 12/261,643, dated Nov. 2, 2011.
Office Action regarding U.S. Appl. No. 12/261,643, dated Feb. 15, 2012.
Office Action regarding U.S. Appl. No. 12/261,677, dated Aug. 4, 2011.
Office Action regarding U.S. Appl. No. 13/303,286, dated Mar. 26, 2012.
Office Action regarding U.S. Appl. No. 13/737,566, dated Dec. 20, 2013.
Official Action regarding Australian Patent Application No. 2008325240, dated Jan. 19, 2011.
Palani, M. et al, Monitoring the Performance of a Residential Central Air Conditioner under Degraded Conditions on a Test Bench, ESL-TR-92/05-05, May 1992.
Palani, M. et al, The Effect of Reducted Evaporator Air Flow on the Performance of a Residential Central Air Conditioner, ESL-HH-92-05-04, Energy Systems Laboratory, Mechanical Engineering Department, Texas A&M University, Eighth Symposium on Improving Building System in Hot and Humid Climates, May 13-14, 1992.
Patent Examination Report No. 3 regarding Australian Patent Application No. 2008325240, dated Jul. 19, 2012.
Pin, C. et al., "Predictive Models as Means to Quantify the Interactions of Spoilage Organisms," International Journal of Food Microbiology, vol. 41, No. 1, 1998, pp. 59-72, XP-002285119.
Record of Oral Hearing regarding U.S. Appl. No. 09/977,552, dated Nov. 29, 2012.
Refrigeration Monitor and Case Control Installation and Operation Manual, Computer Process Controls, Aug. 12, 1999.
Reh, F. John, "Cost Benefit Analysis", http://management.about.com/cs/money/a/CostBenefit.htm, Dec. 8, 2003.
Response to Rule 312 Communication regarding U.S. Appl. No. 09/977,552, dated Oct. 31, 2003.
Restriction from related U.S. Appl. No. 13/269,188 dated Apr. 9, 2013; 5 pages.
Restriction Requirement regarding U.S. Appl. No. 14/244,967, dated Jul. 14, 2015.
Restriction Requirement regarding U.S. Appl. No. 10/940,877, dated Jul. 25, 2005.
Restriction Requirement regarding U.S. Appl. No. 11/214,179, dated Feb. 2, 2010.
Search Report regarding European Patent Application No. 08251185.8-1605 / 2040016, dated Dec. 4, 2015.
Search Report regarding European Patent Application No. 13736303.2-1806, dated Sep. 17, 2015.
Second Examination Communication regarding European Application No. EP02729051.9, dated Jul. 3, 2006.
Second Office Action from the State Intellectual Property Office of People's Republic of China regarding Chinese Patent Application No. 201110349785.X, dated Jul. 25, 2014. Translation provided by Unitalen Attorneys at Law.
Second Office action issued by the Chinese Patent Office dated Jun. 19, 2009 regarding Application No. 200510005907.8, translation provided by CCPIT Patent and Trademark Law Office.
Second Office Action issued by the Chinese Patent Office dated Mar. 6, 2009 regarding Application No. 200580013451.8, 7 Pages.
Second Office Action received from the Chinese Patent Office dated Jun. 26, 2009 regarding Application No. 200480011463.2, translated by CCPIT Patent and Trademark Law Office.
Second Office Action regarding Chinese Patent Application No. 200780030810X, dated Aug. 4, 2010. English translation provided by Unitalen Attorneys at Law.
Second Office Action regarding Chinese Patent Application No. 200890100287.3, dated Jan. 27, 2011. English translation provided by Unitalen Attorneys at Law.
Second Office Action regarding Chinese Patent Application No. 200910211779.0, dated Feb. 4, 2013. English translation provided by Unitalen Attorneys at Law.
Second Official Report regarding Australian Patent Application No. 2007214381, dated Oct. 30, 2009.
Supplementary European Search Report for EP 02 73 1544, dated Jun. 18, 2004, 2 Pages.
Supplementary European Search Report regarding Application No. EP 07 81 1712, dated Jan. 7, 2014.
Supplementary European Search Report regarding Application No. PCT/US2006/005917, dated Nov. 23, 2009.
Supplementary European Search Report regarding European Application No. EP06790063, dated Jun. 15, 2010.
Tamarkin, Tom D., "Automatic Meter Reading," Public Power magazine, vol. 50, No. 5, Sep.-Oct. 1992, http://www.energycite.com/news/amr.html, 6 pages.
Texas Instruments, Inc. Mechanical Data for "PT (S-PQFP-G48) Plastic Quad Flatpack," Revised Dec. 1996, 2 pages.
Texas Instruments, Inc., Product catalog for "TRF690 1 Single-Chip RF Transceiver," Copyright 2001-2003, Revised Oct. 2003, 27 pages.
The Honeywell HVAC Service Assistant, A Tool for Reducing Electrical Power Demand and Energy Consumption, Field Diagnostics, 2003.
The International Search Report regarding International Application No. PCT/US2007/019563, dated Jan. 15, 2008.

(56) References Cited

OTHER PUBLICATIONS

The LS2000 Energy Management System, User Guide, http://www.surfnetworks.com/htmlmanuals/IonWorksEnergyManagement-LS2000-Load-Shed - System-by-Surf-Networks,Inc.html, Sep. 2004, 20 pages.
Third Chinese Office Action regarding Application No. 201110349785.X, dated Jan. 30, 2015. Translation provided by Unitalen Attorneys at Law.
Third Office Action issued by the Chinese Patent Office dated Jun. 19, 2009 regarding Application No. 200580013451.8, translated by CCPIT Patent and Trademark Law Office.
Third Office Action regarding Chinese Application No. 2005100059078 from the State Intellectual Property Office of People's Republic of China, dated Aug. 24, 2011. Translation provided by Unitalen Attorneys at Law.
Third Office Action regarding Chinese Patent Application No. 200910211779.0, dated Sep. 4, 2013. English translation provided by Unitalen Attorneys at Law.
Torcellini, P., et al., "Evaluation of the Energy Performance and Design Process of the Thermal Test Facility at the National Renewable Energy Laboratory", dated Feb. 2005.
Trane EarthWise™ CenTra Vac™ Water-Cooled Liquid Chillers 165-3950 Tons 50 and 60 Hz; CTV PRC007-EN; Oct. 2002; 56 pages.
Translation of claims and Abstract of KR Patent Laying-Open No. 2000-0000261.
U.S. Office Action regarding U.S. Appl. No. 13/269,188, dated May 8, 2015.
U.S. Office Action regarding U.S. Appl. No. 14/212,632, dated May 15, 2015.
Udelhoven, Darrell, "Air Conditioner EER, SEER Ratings, BTUH Capacity Ratings, & Evaporator Heat Load," http://www.udarrell.com/air-conditioner-capacity-seer.html, Apr. 3, 2003, 15 pages.
Udelhoven, Darrell, "Air Conditioning System Sizing for Optimal Efficiency," http://www.udarrell.com/ airconditioning-sizing.html, Oct. 6, 2003, 7 pages.
Udelhoven, Darrell, "Optimizing Air Conditioning Efficiency TuneUp Optimizing the Condensor Output, Seer, Air, HVAC Industry," http://www.udarrell.com/air-conditioning-efficiency.html, Jul. 19, 2002, 13 pages.
Ultrasite 32 User's Guide, Computer Process Controls, Sep. 28, 1999.
Ultrasite User's Guide BCU Supplement, Computer Process Controls, Sep. 4, 1997.
Ultrasite User's Guide BEC Supplement, Computer Process Controls, Oct. 6, 1997.
Ultrasite User's Guide RMCC Supplement, Computer Process Controls, Jun. 9, 1997.
UltraSite User's Guide, Computer Process Controls, Apr. 1, 1996.
Vandenbrink et al.,"Design of a Refrigeration Cycle Evaporator Unit," Apr. 18, 2003.
Watt, James; Development of Empirical Temperature and Humidity-Based Degraded-Condition Indicators for Low-Tonnage Air Conditioners; ESL-TH-97/12-03; Dec. 1997.
Written Opinion from related PCT Application No. PCT/US2014/028074 dated Jun. 19, 2014.
Written Opinion of the International Searching Authority for International Application No. PCT/US2008/012364 dated Mar. 12, 2009.
Written Opinion of the International Searching Authority regarding Application No. PCT/US2010/036601, dated Dec. 29, 2010.
Written Opinion of the International Searching Authority regarding Application No. PCT/US2013/021161, dated May 8, 2013.
Written Opinion of the International Searching Authority regarding International Application No. PCT/US2007/019563, dated Jan. 15, 2008.
Written Opinion of the International Searching Authority, Int'l. App. No. PCT/US 06/05917, dated Sep. 26, 2007.
Written Opinion regarding PCT/US02/13459, dated Apr. 23, 2003.
Advisory Action regarding U.S. Appl. No. 14/212,632, dated Feb. 9, 2016.
Advisory Action regarding U.S. Appl. No. 14/212,632, dated Mar. 8, 2016.
Office Action regarding European Patent Application No. 08848538.8-1608, dated Feb. 3, 2016.
Office Action regarding U.S. Appl. No. 14/209,415, dated Mar. 10, 2016.
Office Action regarding U.S. Appl. No. 14/244,967, dated Feb. 12, 2016.
Office Action regarding U.S. Appl. No. 14/212,632, dated Apr. 7, 2016.
Office Action regarding U.S. Appl. No. 12/943,626, dated May 4, 2016.
Office Action regarding Australian Patent Application No. 2014229103, dated Apr. 28, 2016.
Corrected Notice of Allowability regarding U.S. Appl. No. 14/080,473 dated Dec. 27, 2017.
Final Office Action regarding U.S. Appl. No. 15/583,942 dated Apr. 18, 2018.
First Office Action regarding Chinese Application No. 201610422700.4 dated Apr. 2, 2018. Translation provided by Unitalen Attorneys at Law.
Kim, Minsung et al., "Performance of a Residential Heat Pump Operating in the Cooling Mode With Single Faults Imposed", Sep. 2006, U.S. Department of Commerce, NISTIR 7350 (175 pages).
Non-Final Office Action regarding U.S. Appl. No. 15/613,375 dated Aug. 30, 2018.
Notice of Allowance regarding U.S. Appl. No. 14/607,782 dated May 21, 2018.
Notice of Allowance regarding U.S. Appl. No. 15/645,970 dated Jun. 29, 2018.
Notice of Allowance regarding U.S. Appl. No. 14/607,782 dated Jul. 3, 2018.
Notice of Allowance regarding U.S. Appl. No. 14/208,636 dated Jul. 30, 2018.
Notice of Allowance regarding U.S. Appl. No. 15/583,942 dated Aug. 7, 2018.
Notice of Allowance regarding U.S. Appl. No. 14/208,636 dated Sep. 25, 2018.
Office Action regarding Chinese Patent Application No. 201480016177.9, dated Apr. 7, 2017. Translation provided by Unitalen Attorneys at Law.
Office Action regarding Chinese Patent Application No. 201480025776.7, dated Jan. 10, 2018. Translation provided by Unitalen Attorneys at Law. 4.
Office Action regarding U.S. Appl. No. 14/208,636 dated Jan. 3, 2018.
Office Action regarding U.S. Appl. No. 15/645,970 dated Feb. 16, 2018.
Search Report regarding Chinese Patent Application No. 201610244700.4, dated Mar. 25, 2018.
Non Final Office Action for U.S. Appl. No. 15/096,186 dated Sep. 20, 2018, 14 pages.
Non-Final Office Action regarding U.S. Appl. No. 16/113,271 dated Jan. 25, 2019.
Notice of Allowance regarding U.S. Appl. No. 15/645,970 dated Oct. 31, 2018.
First Examination Report issued by the Indian Patent Office regarding Application No. 479/MUMNP/2015 dated Dec. 21, 2018.
First Examination Report issued by the Indian Patent Office regarding Application No. 2574/MUMNP/2015 dated Mar. 20, 2019.
Non-Final Office Action regarding U.S. Appl. No. 15/633,657 dated Feb. 20, 2019.
Notice of Allowance regarding U.S. Appl. No. 15/613,375 dated Feb. 27, 2019.

\* cited by examiner

COMPRESSOR SENSOR MODULE

CROSS-REFERENCE TO RELATED APPLICATIONS

This application is a continuation of U.S. application Ser. No. 13/770,123 (now U.S. Pat. No. 9,194,894), filed Feb. 19, 2013, which is a continuation of U.S. application Ser. No. 12/261,643 (now U.S. Pat. No. 9,140,728), filed on Oct. 30, 2008, which claims the benefit of U.S. Provisional Application No. 60/984,902, filed on Nov. 2, 2007. The entire disclosures of the above applications are incorporated herein by reference.

FIELD

The present disclosure relates to compressors, and more particularly, to a compressor with a sensor module.

BACKGROUND

The statements in this section merely provide background information related to the present disclosure and may not constitute prior art.

Compressors are used in a variety of industrial and residential applications to circulate refrigerant within a refrigeration, heat pump, HVAC, or chiller system (generically "refrigeration systems") to provide a desired heating or cooling effect. Compressors may include an electric motor to provide torque to compress vapor refrigerant. The electric motor may be powered by an alternating current (AC) or direct current (DC) power supply. In the case of an AC power supply, single or poly-phase AC may be delivered to windings of the electric motor. For example, the compressor may include an electric motor configured to operate with three phase AC. The electric motor may include at least one set of windings corresponding to each of the three phases.

In each application, it is desirable for the compressor to provide consistent and efficient operation to ensure that the refrigeration system functions properly. Variations in the supply of electric power to the electric motor of the compressor may disrupt operation of the electric motor, the compressor, and the refrigeration system. Such variations may include, for example, excessive, or deficient, current or voltage conditions. In the case of a poly-phase AC power supply, such variations may include an unbalanced phase condition wherein the current or voltage of at least one phase of AC is excessively varied from the current or voltage of the other phases. Further, such variations may include a loss of phase condition wherein one phase of AC is interrupted while the remaining phases continue to be delivered. Excessive current or voltage conditions may cause the electric motor to overheat which may damage the electric motor or the compressor. Deficient current or voltage conditions, unbalanced phase conditions, and loss of phase conditions may disrupt operation of the electric motor, the compressor, or the refrigeration system and cause unnecessary damage.

The electric motor of a compressor may be equipped with a temperature or current sensor to detect overheating of the electric motor during electrical power disturbances. For example, a bi-metallic switch may trip and deactivate the electric motor when the electric motor is overheated or drawing excessive electrical current. Such a system, however, does not detect variations in the power supply that may not immediately or drastically increase the temperature of the electric motor. In addition, such systems may not detect a variation in electrical power until the condition has increased the temperature of the electric motor or the electric motor windings.

Further, such systems do not provide sufficient data to evaluate electrical efficiency of the electric motor overall. Variations in the supply of electric power may result in inefficient operation of the compressor, the electric motor, or the refrigeration system. Refrigeration systems generally require a significant amount of energy to operate, with energy requirements being a significant cost to retailers. As a result, it is in the best interest of retailers to closely monitor the supply of electric power to their refrigeration systems to maximize efficiency and reduce operational costs.

SUMMARY

In a feature, a sensor module for a compressor having an electric motor connected to a power supply is described. The sensor module includes: a first input connected to a first voltage sensor that generates a voltage signal corresponding to a voltage of the power supply; a second input connected to a first current sensor that generates a current signal corresponding to a current of the power supply; and a processor connected to the first and second inputs. The processor monitors the first and second inputs and, based on voltage measurements from the first input and current measurements from the second input, detects at least one of: (i) an unexpected variation of electric power from the power supply; and (ii) a mechanical malfunction. The processor is disposed within an electrical enclosure of the compressor, the electrical enclosure being configured to house electrical terminals for connecting the power supply to the electric motor.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

Figure 1:
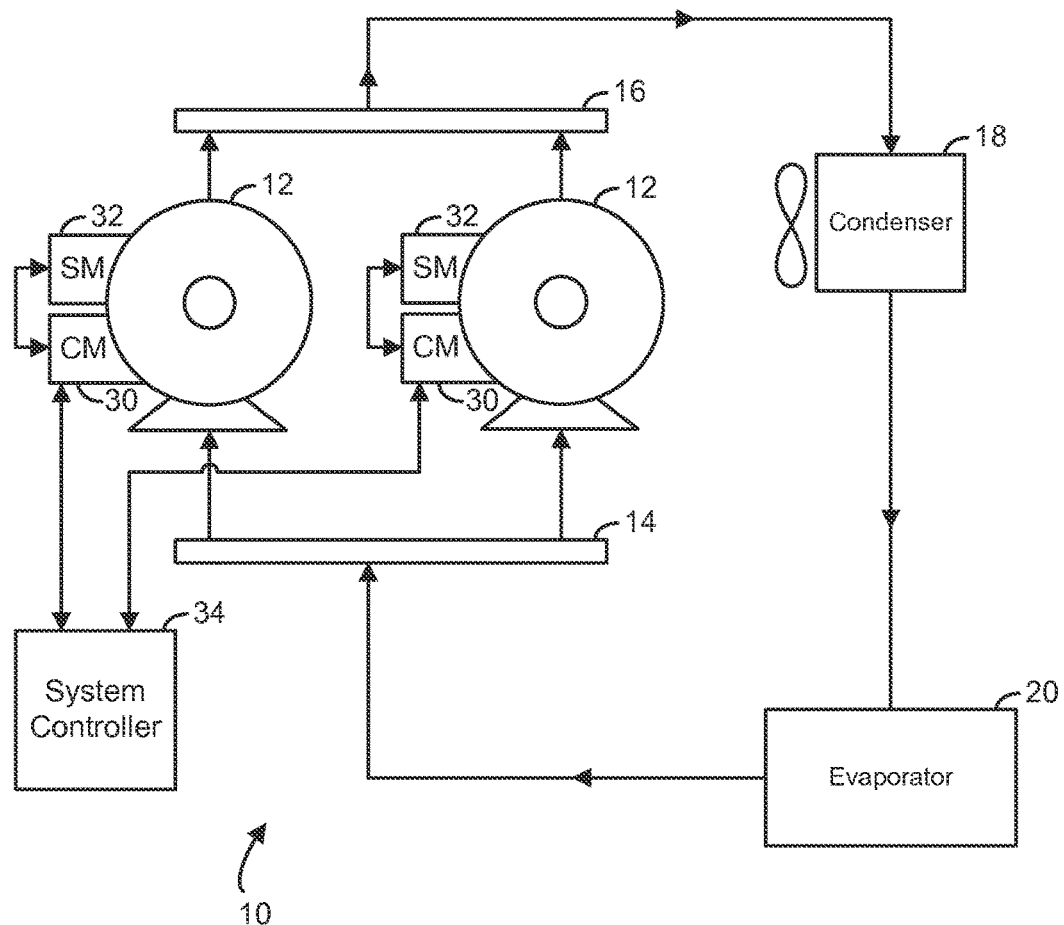
FIG. 1 is a schematic view of a refrigeration system.

The following description is merely exemplary in nature and is not intended to limit the present disclosure, application, or uses. It should be understood that throughout the drawings, corresponding reference numerals indicate like or corresponding parts and features.

As used herein, the terms module, control module, and controller refer to one or more of the following: an application specific integrated circuit (ASIC), an electronic circuit, a processor (shared, dedicated, or group) and memory that execute one or more software or firmware programs, a combinational logic circuit, or other suitable components that provide the described functionality. Further, as used herein, computer-readable medium refers to any medium capable of storing data for a computer. Computer-readable medium may include, but is not limited to, memory, RAM, ROM, PROM, EPROM, EEPROM, flash memory, punch cards, dip switches, CD-ROM, floppy disk, magnetic tape, other magnetic medium, optical medium, or any other device or medium capable of storing data for a computer.

With reference to FIG. 1, an exemplary refrigeration system 10 may include a plurality of compressors 12 piped together with a common suction manifold 14 and a discharge header 16. Compressor 12 may be a reciprocating compressor, a scroll type compressor, or another type of compressor. Compressor 12 may include a crank case. Compressors 12 may be equipped with electric motors to compress refrigerant vapor that is delivered to a condenser 18 where the refrigerant vapor is liquefied at high pressure, thereby rejecting heat to the outside air. The liquid refrigerant exiting the condenser 18 is delivered to an evaporator 20. As hot air moves across the evaporator, the liquid turns into gas, thereby removing heat from the air and cooling a refrigerated space. This low pressure gas is delivered to the compressors 12 and again compressed to a high pressure gas to start the refrigeration cycle again. While a refrigeration system 10 with two compressors 12, a condenser 18, and an evaporator 20 is shown in FIG. 1, a refrigeration system 10 may be configured with any number of compressors 12, condensers 18, evaporators 20, or other refrigeration system components.

Each compressor 12 may be equipped with a control module (CM) 30 and a sensor module (SM) 32. As described herein, SM 32 may be affixed to compressor 12 and may monitor electric power delivered to compressor 12 with one or more voltage sensors and one or more current sensors. Based on electrical power measurements, such as electric current (I) and voltage (V), SM 32 may determine apparent power, actual power, power consumption, and power factor calculations for the electric motor of compressor 12. SM 32 may communicate the electric power measurements and calculations to CM 30. SM 32 may also alert CM 30 of variations in the power supply, or of mechanical failures, based on the measurements and calculations. For example, SM 32 may alert CM 30 of an excessive current or voltage condition, a deficient current or voltage condition, a current or voltage imbalance condition, or a loss of phase or current delay condition (if poly-phase electric power is used). Based on the monitoring of the electric power supply and based on the communication with CM 30, SM 32 may detect and alert CM 30 to a welded contactor condition, or a locked rotor condition.

CM 30 may control operation of compressor 12 based on data received from SM 32, based on other compressor and refrigeration system data received from other compressor or refrigeration system sensors, and based on communication with a system controller 34. CM 30 may be a protection and control system of the type disclosed in assignee's commonly-owned U.S. patent application Ser. No. 11/059,646, Publication No. 2005/0235660, filed Feb. 16, 2005, the disclosure of which is incorporated herein by reference. Other suitable protection and control systems may be used.

In addition to the data received by CM 30 from SM 32, CM 30 may receive compressor and refrigeration system data including discharge pressure, discharge temperature, suction pressure, suction temperature, and other compressor related data from pressure and temperature sensors connected to or, embedded within, compressor 12. In addition, oil level and oil pressure data may be received by SM 32 and communicated to CM 30 and/or received by CM 30 directly. In this way, CM 30 may monitor the various operating parameters of compressor 12 and control operation of compressor 12 based on protection and control algorithms and based on communication with system controller 34. For example, CM 30 may activate and deactivate the compressor 12 according to a set-point, such as a suction pressure, suction temperature, discharge pressure, or discharge temperature set-point. In the case of a discharge pressure set-point, CM 30 may activate compressor 12 when the discharge pressure, as determined by a discharge pressure sensor, falls below the discharge pressure set-point. CM 30 may deactivate compressor 12 when the discharge pressure rises above the discharge pressure set-point.

Further, CM 30 may activate or deactivate compressor 12 based on data and/or alerts received from SM 32. For example, CM 30 may deactivate compressor 12 when alerted of an excessive current or voltage condition, a deficient current or voltage condition, a current or voltage imbalance condition, or a loss of phase or current delay condition (if poly-phase electric power is used). Further, CM 30 may activate compressor 12 when alerted of a welded contactor condition or deactivate compressor 12 when alerted of a locked rotor condition. CM 30 may communicate operating data of compressor 12, including electric power data received from SM 32, to system controller 34.

In this way, SM 32 may be specific to compressor 12 and may be located within an electrical enclosure 72 of compressor 12 for housing electrical connections to compressor 12 (shown in FIGS. 5-12) at the time of manufacture of compressor 12. CM 30 may be installed on compressor 12 after manufacture and at the time compressor 12 is installed at a particular location in a particular refrigeration system, for example. Different control modules may be manufactured by different manufacturers. However, each CM 30 may be designed and configured to communicate with SM 32. In other words, SM 32 for a particular compressor 12 may provide data and signals that can be communicated to any control module appropriately configured to communicate with SM 32. Further, manufacturers of different control modules may configure a control module to receive data and signals from SM 32 without knowledge of the algorithms and computations employed by SM 32 to provide the data and signals.

System controller 34 may be used and configured to control the overall operation of the refrigeration system 10. System controller 34 is preferably an Einstein Area Controller offered by CPC, Inc. of Atlanta, Ga., or any other type of programmable controller that may be programmed to operate refrigeration system 10 and communicate with CM 30. System controller 34 may monitor refrigeration system operating conditions, such as condenser temperatures and pressures, and evaporator temperatures and pressures, as well as environmental conditions, such as ambient temperature, to determine refrigeration system load and demand. System controller 34 may communicate with CM 30 to adjust set-points based on operating conditions to maximize efficiency of refrigeration system 10. System controller 34 may evaluate efficiency based on electric power measurements and calculations made by SM 32 and communicated to system controller 34 from CM 30.

Figure 2:
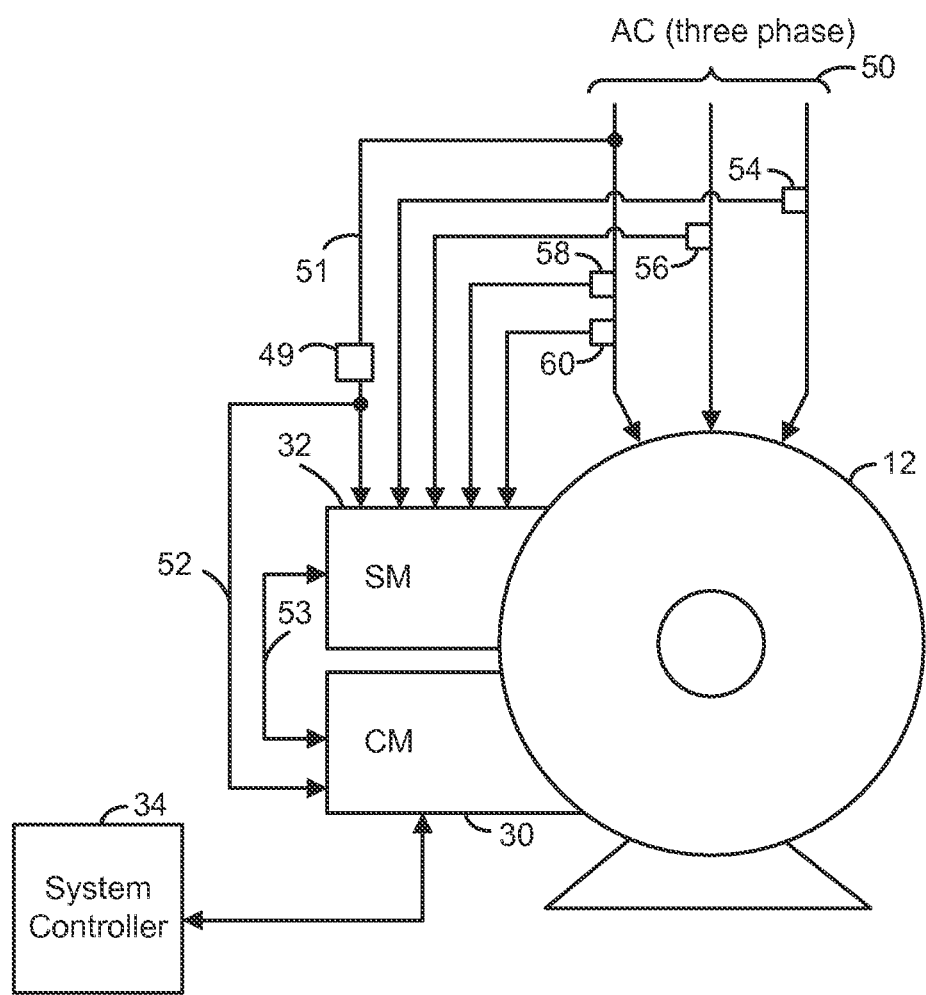
FIG. 2 is a schematic view of a compressor with a sensor module and a control module.

With reference to FIG. 2, three phase AC electric power 50 may be delivered to compressor 12 to operate an electric motor. SM 32 and CM 30 may receive low voltage power from one of the phases of electric power 50 delivered to compressor 12. For example, a transformer 49 may convert electric power 51 from one of the phases to a lower voltage for delivery to SM 32 and CM 30. In this way, SM 32 and CM 30 may operate on single phase AC electric power at a lower voltage than electric power 50 delivered to compressor 12. For example, electric power delivered to SM 32 and CM 30 may be 24V AC. When low voltage power, for example 24 V AC, is used to power CM 30 and SM 32, lower voltage rated components, such as lower voltage wiring connections, may be used.

SM 32 may be connected to three voltage sensors 54, 56, 58, for sensing voltage of each phase of electric power 50 delivered to compressor 12. In addition, SM 32 may be connected to a current sensor 60 for sensing electric current of one of the phases of electric power 50 delivered to compressor 12. Current sensor 60 may be a current transformer or current shunt resistor.

When a single current sensor 60 is used, electric current for the other phases may be estimated based on voltage measurements and based on the current measurement from current sensor 60. Because the load for each winding of the electric motor may be substantially the same as the load for each of the other windings, because the voltage for each phase is known from measurement, and because the current for one phase is known from measurement, current in the remaining phases may be estimated.

Figure 3:
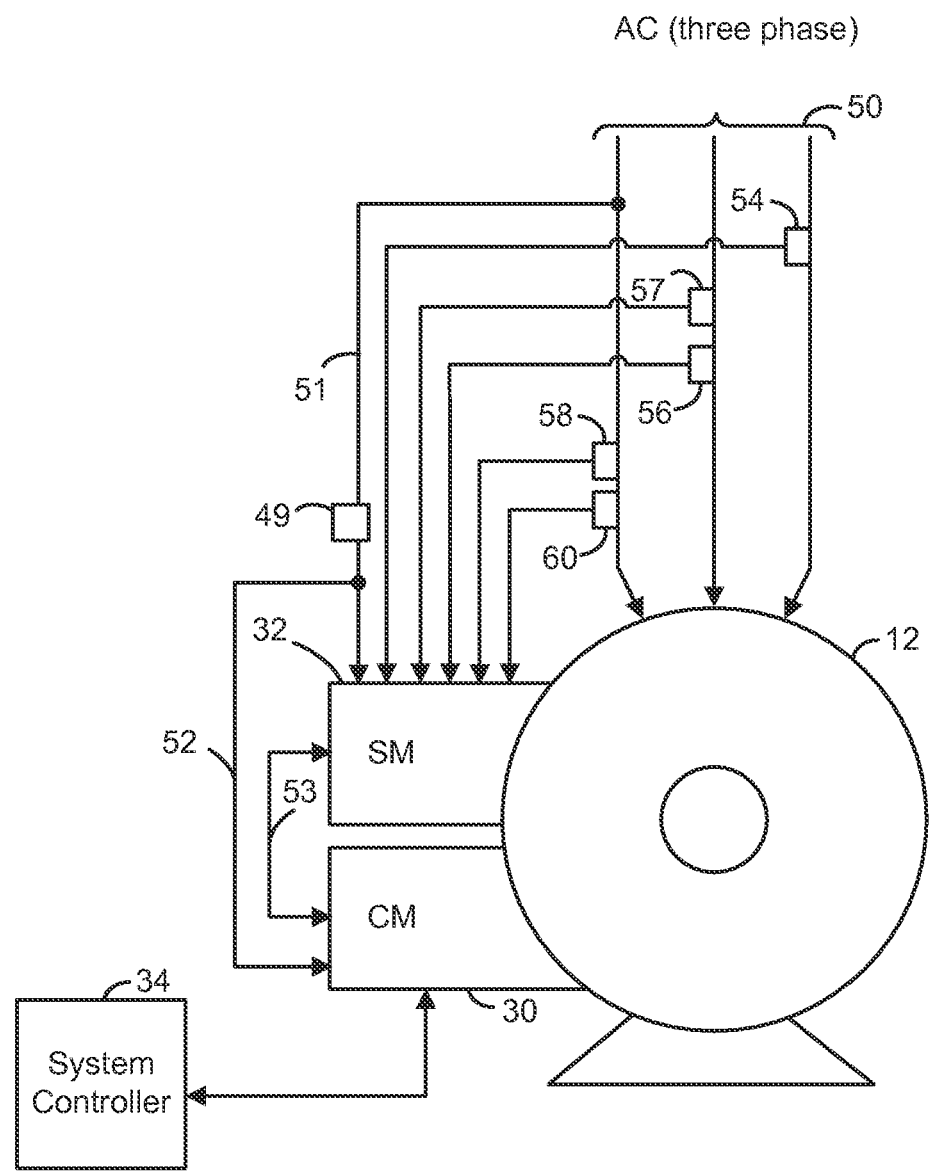
FIG. 3 is a schematic view of a compressor with a sensor module and a control module.
Figure 4:
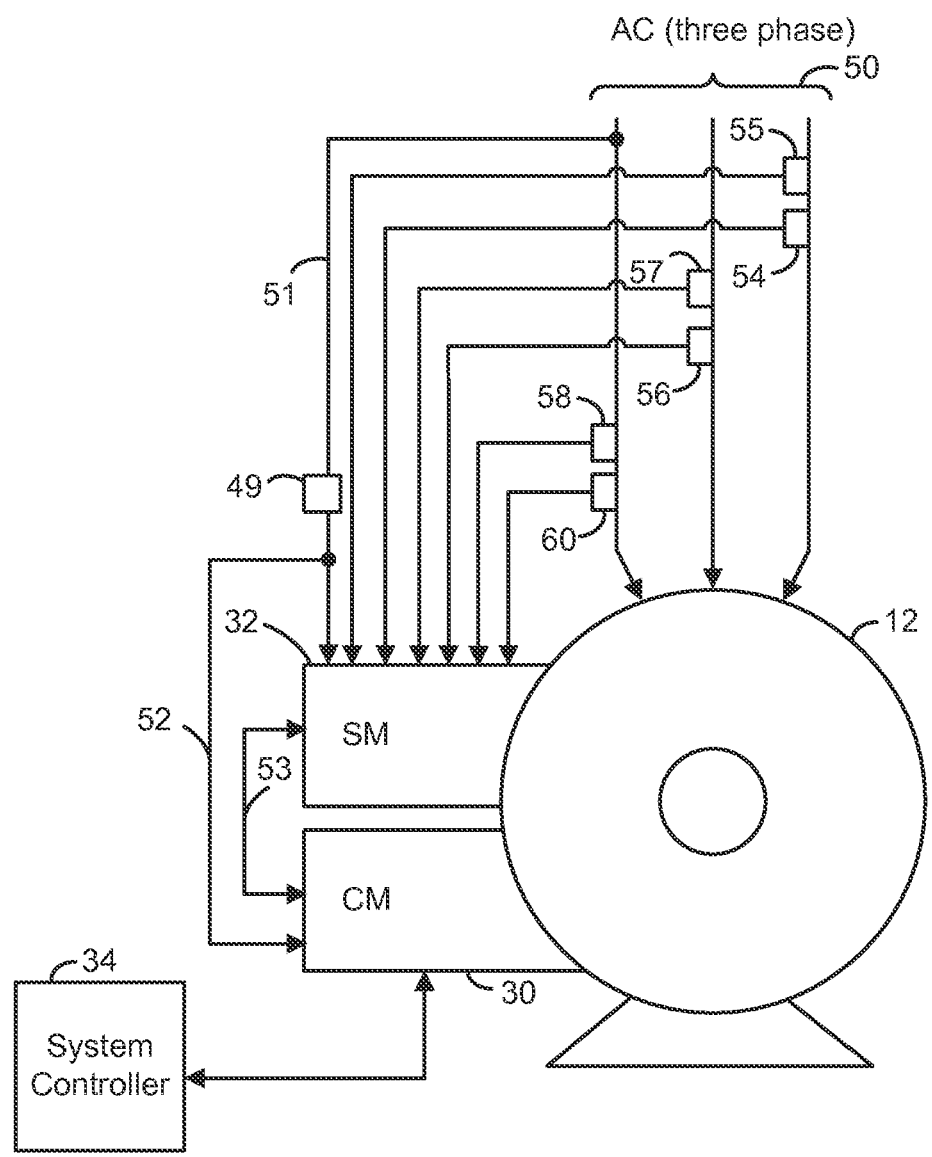
FIG. 4 is a schematic view of a compressor with a sensor module and a control module.

Additional current sensors may also be used and connected to SM 32. With reference to FIG. 3, two current sensors 57, 60 may be used to sense electric current for two phases of electric power 50. When two current sensors 57, 60 are used, electric current for the remaining phase may be estimated based on voltage measurements and based on the current measurements from current sensors 57, 60. With reference to FIG. 4, three current sensors 55, 57, 60 may be used to sense electric current for all three phases of electric power 50.

In the case of a dual winding three phase electric motor, six electrical power terminals may be used, with one terminal for each winding resulting in two terminals for each of the three phases of electric power 50. In such case, a voltage sensor may be included for each of the six terminals, with each of the six voltage sensors being in communication with SM 32. In addition, a current sensor may be included for one or more of the six electrical connections.

Figure 5:
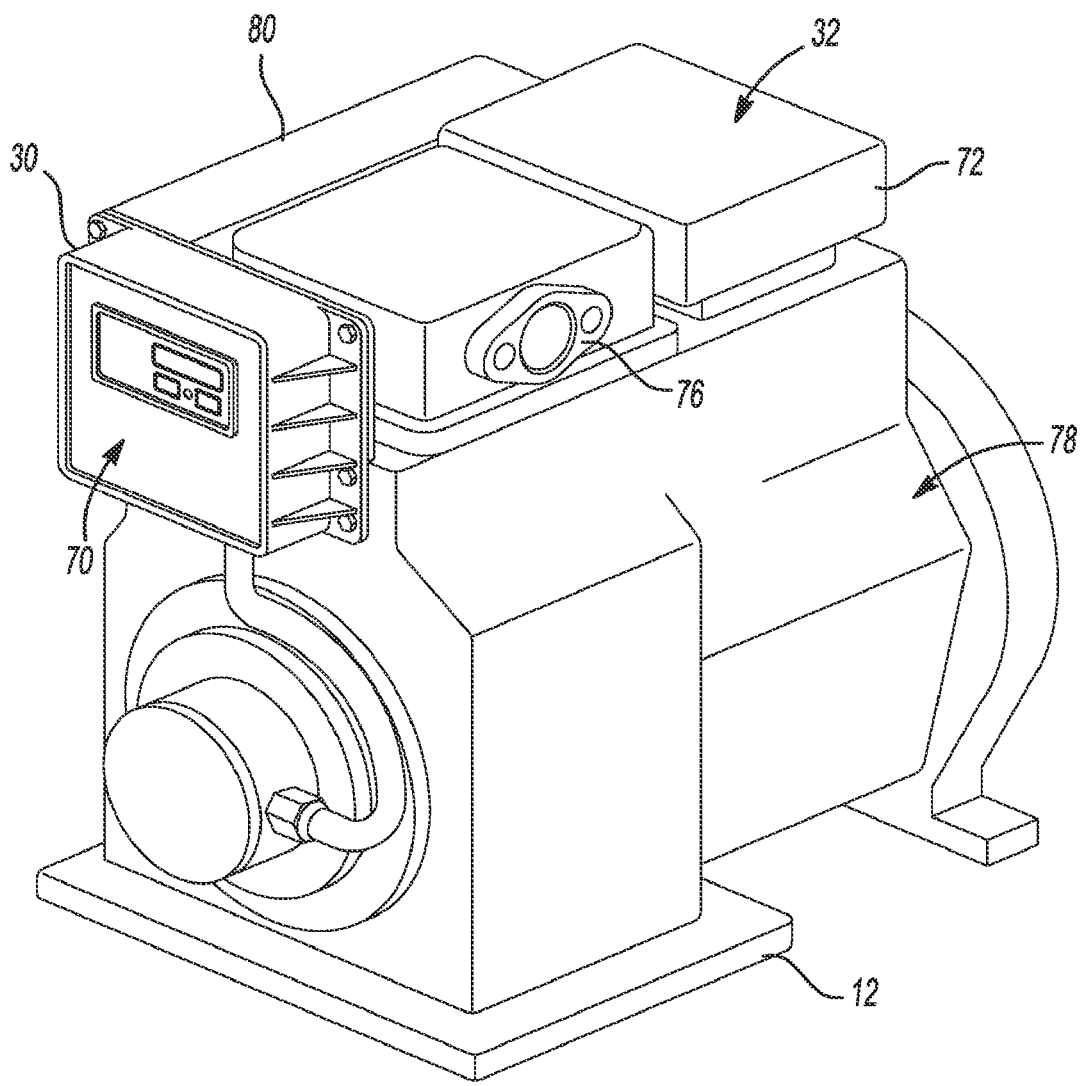
FIG. 5 is a perspective view of a compressor with a sensor module and a control module.
Figure 6:
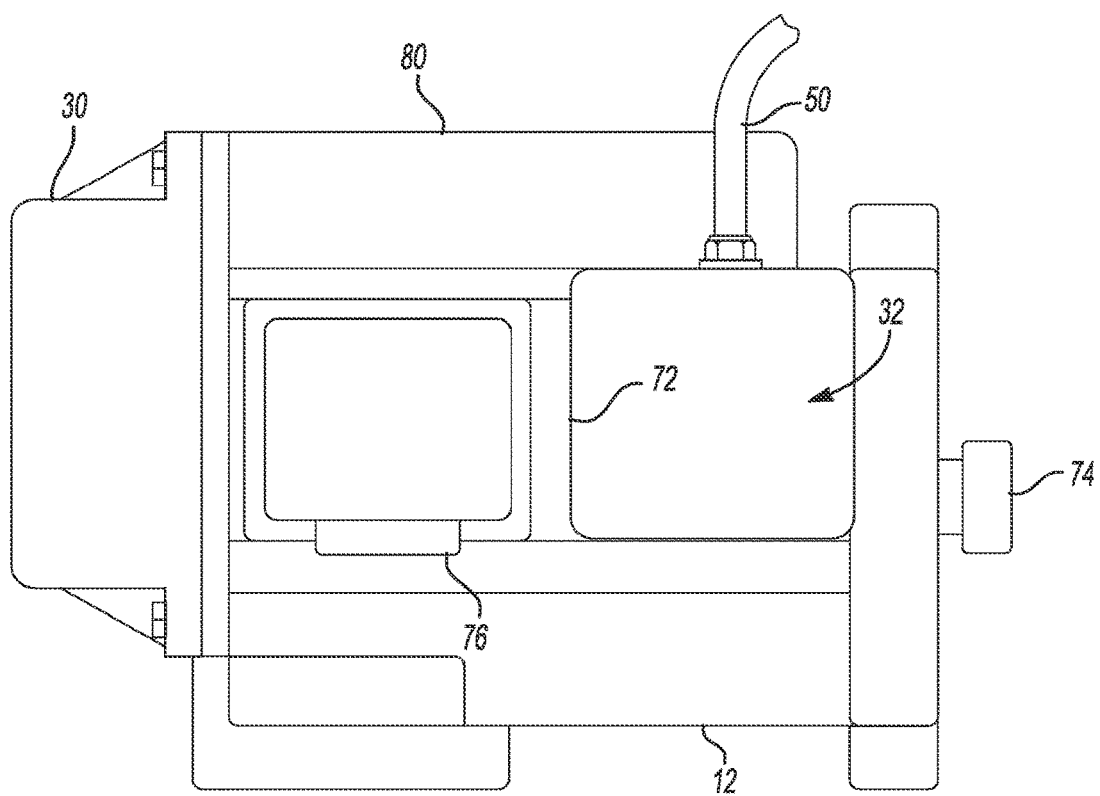
FIG. 6 is a top view of a compressor with a sensor module and a control module.

With reference to FIGS. 5 and 6, CM 30 and SM 32 may be mounted on or within compressor 12. CM 30 may include a display 70 for graphically displaying alerts or messages. As discussed above, SM 32 may be located within electrical enclosure 72 of compressor 12 for housing electrical connections to compressor 12.

Compressor 12 may include a suction nozzle 74, a discharge nozzle 76, and an electric motor disposed within an electric motor housing 78.

Electric power 50 may be received by electrical enclosure 72. CM 30 may be connected to SM 32 through a housing 80. In this way, CM 30 and SM 32 may be located at different locations on or within compressor 12, and may communicate via a communication connection routed on, within, or through compressor 12, such as a communication connection routed through housing 80.

With reference to FIGS. 7 through 12, SM 32 may be located within electrical enclosure 72. In FIGS. 7 through 12, a schematic view of electrical enclosure 72 and SM 32 is shown. SM 32 may include a processor 100 with RAM 102 and ROM 104 disposed on a printed circuit board (PCB) 106. Electrical enclosure 72 may be an enclosure for housing electrical terminals 108 connected to an electric motor of compressor 12. Electrical terminals 108 may connect electric power 50 to the electric motor of compressor 12.

Electrical enclosure 72 may include a transformer 49 for converting electric power 50 to a lower voltage for use by SM 32 and CM 30. For example, electric power 51 may be converted by transformer 49 and delivered to SM 32. SM 32 may receive low voltage electric power from transformer 49 through a power input 110 of PCB 106. Electric power may also be routed through electrical enclosure 72 to CM 30 via electrical connection 52.

Voltage sensors 54, 56, 58 may be located proximate each of electrical terminals 108. Processor 100 may be connected to voltage sensors 54, 56, 58 and may periodically receive or sample voltage measurements. Likewise, current sensor 60 may be located proximate one of electrical power leads 116. Processor 100 may be connected to current sensor 60 and may periodically receive or sample current measurements. Electrical voltage and current measurements from voltage sensors 54, 56, 58 and from current sensor 60 may be suitably scaled for the processor 100.

PCB 106 may include a communication port 118 to allow communication between processor 100 of SM 32 and CM 30. A communication link between SM 32 and CM 30 may include an optical isolator 119 to electrically separate the communication link between SM 32 and CM 30 while allowing communication. Optical isolator 119 may be located within electrical enclosure 72. Although optical isolator 119 is independently shown, optical isolator 119 may also be located on PCB 106. At least one additional communication port 120 may also be provided for communication between SM 32 and other devices. A handheld or portable device may directly access and communicate with SM 32 via communication port 120. For example, communication port 120 may allow for in-circuit programming of SM 32 a device connected to communication port 120. Additionally, communication port 120 may be connected to a network device for communication with SM 32 across a network.

Communication with SM 32 may be made via any suitable communication protocol, such as I2C, serial peripheral interface (SPI), RS232, RS485, universal serial bus (USB), or any other suitable communication protocol.

Processor 100 may access compressor configuration and operating data stored in an embedded ROM 124 disposed in a tamper resistant housing 140 within electrical enclosure 72. Embedded ROM 124 may be a compressor memory system disclosed in assignee's commonly-owned U.S. patent application Ser. No. 11/405,021, filed Apr. 14, 2006, U.S. patent application Ser. No. 11/474,865, filed Jun. 26, 2006, U.S. patent application Ser. No. 11/474,821, filed Jun. 26, 2006, U.S. patent application Ser. No. 11/474,798, filed Jun. 26, 2006, or U.S. Patent Application No. 60/674,781, filed Apr. 26, 2005, the disclosures of which are incorporated herein by reference. In addition, other suitable memory systems may be used.

Embedded ROM 124 may store configuration and operating data for compressor 12. When configuration data for compressor 12 is modified, the modified data may likewise be stored in embedded ROM 124. Configuration data for compressor 12 may be communicated to CM 30 or system controller 34. When compressor and/or SM 32 are replaced, the default configuration data for the new compressor 12 may be communicated to CM 30 and/or system controller 34 upon startup. In addition, configuration data may be downloaded remotely. For example, configuration data in embedded ROM 124 may include operating and diagnostic software that may be upgraded via a network connection. In this way, operating and diagnostic software may be upgraded efficiently over the network connection, for example, via the internet.

Relays 126, 127 may be connected to processor 100. Relay 126 may control activation or deactivation of compressor 12. When SM 32 determines that an undesirable operating condition exists, SM 32 may simply deactivate compressor 12 via relay 126. Alternatively, SM 32 may notify CM 30 of the condition so that CM 30 may deactivate the compressor 12. Relay 127 may be connected to a compressor related component. For example, relay 127 may be connected to a crank case heater. SM 32 may activate or deactivate the crank case heater as necessary, based on operating conditions or instructions from CM 30 or system controller 34. While two relays 126, 127 are shown, SM 32 may, alternatively, be configured to operate one relay, or more than two relays.

Processor 100 and PCB 106 may be mounted within a housing enclosure 130. Housing enclosure 130 may be attached to or embedded within electrical enclosure 72. Electrical enclosure 72 provides an enclosure for housing electrical terminals 108 and transformer 49. Housing enclosure 130 may be tamper-resistant such that a user of compressor 12 may be unable to inadvertently or accidentally access processor 100 and PCB 106. In this way, SM 32 may remain with compressor 12, regardless of whether compressor 12 is moved to a different location, returned to the manufacturer for repair, or used with a different CM 30.

LED's 131, 132 may be located on, or connected to, PCB 106 and controlled by processor 100. LED's 131, 132 may indicate status of SM 32 or an operating condition of compressor 12. LED's 131, 132 may be located on housing enclosure 130 or viewable through housing enclosure 130. For example, LED 131 may be red and LED 132 may be green. SM 32 may light green LED 132 to indicate normal operation. SM 32 may light red LED 131 to indicate a predetermined operating condition. SM 32 may also flash the LED's 131, 132 to indicate other predetermined operating conditions.

Figure 7:
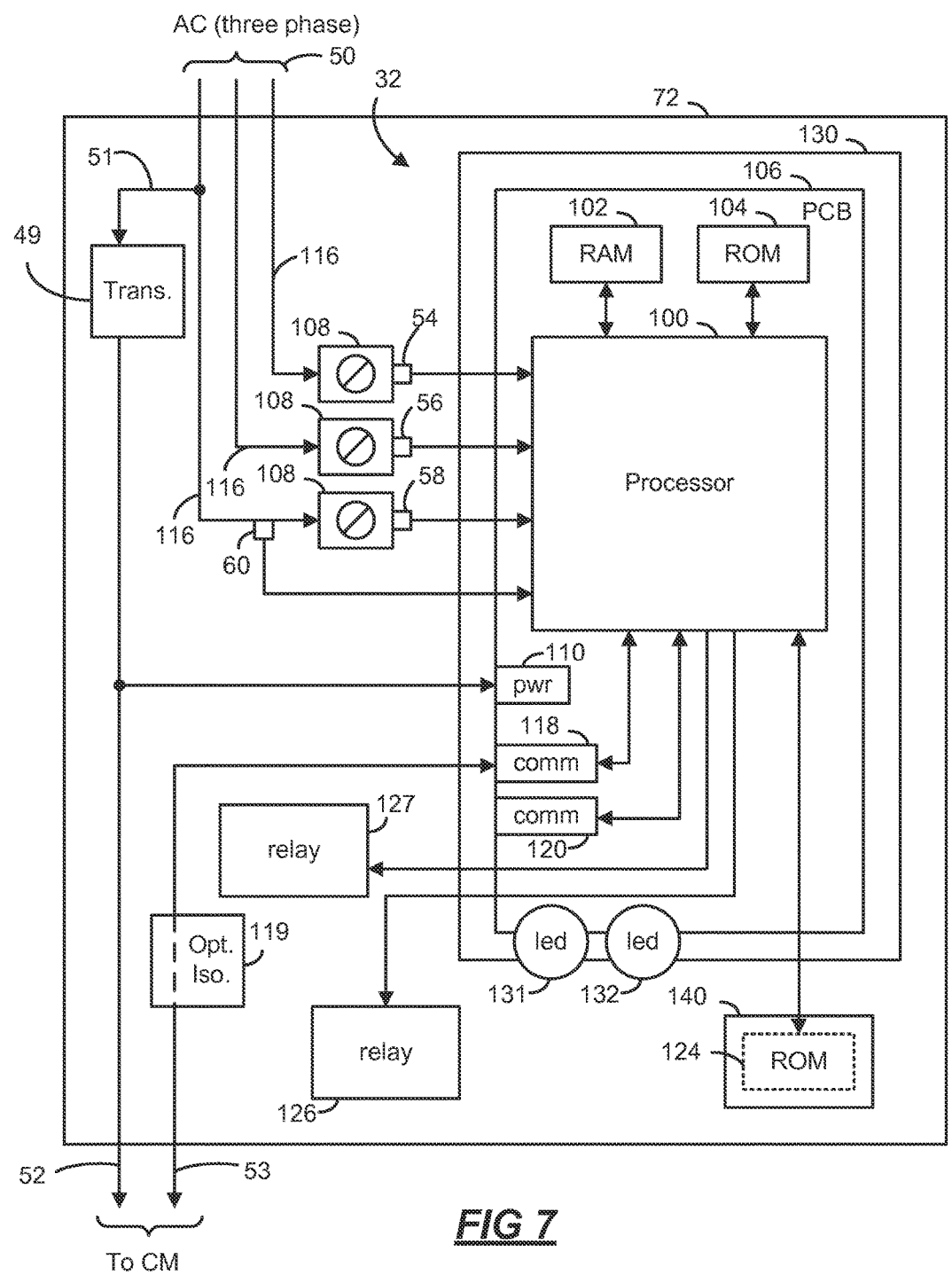
FIG. 7 is a schematic view of an electrical enclosure of a compressor including a sensor module.
Figure 8:
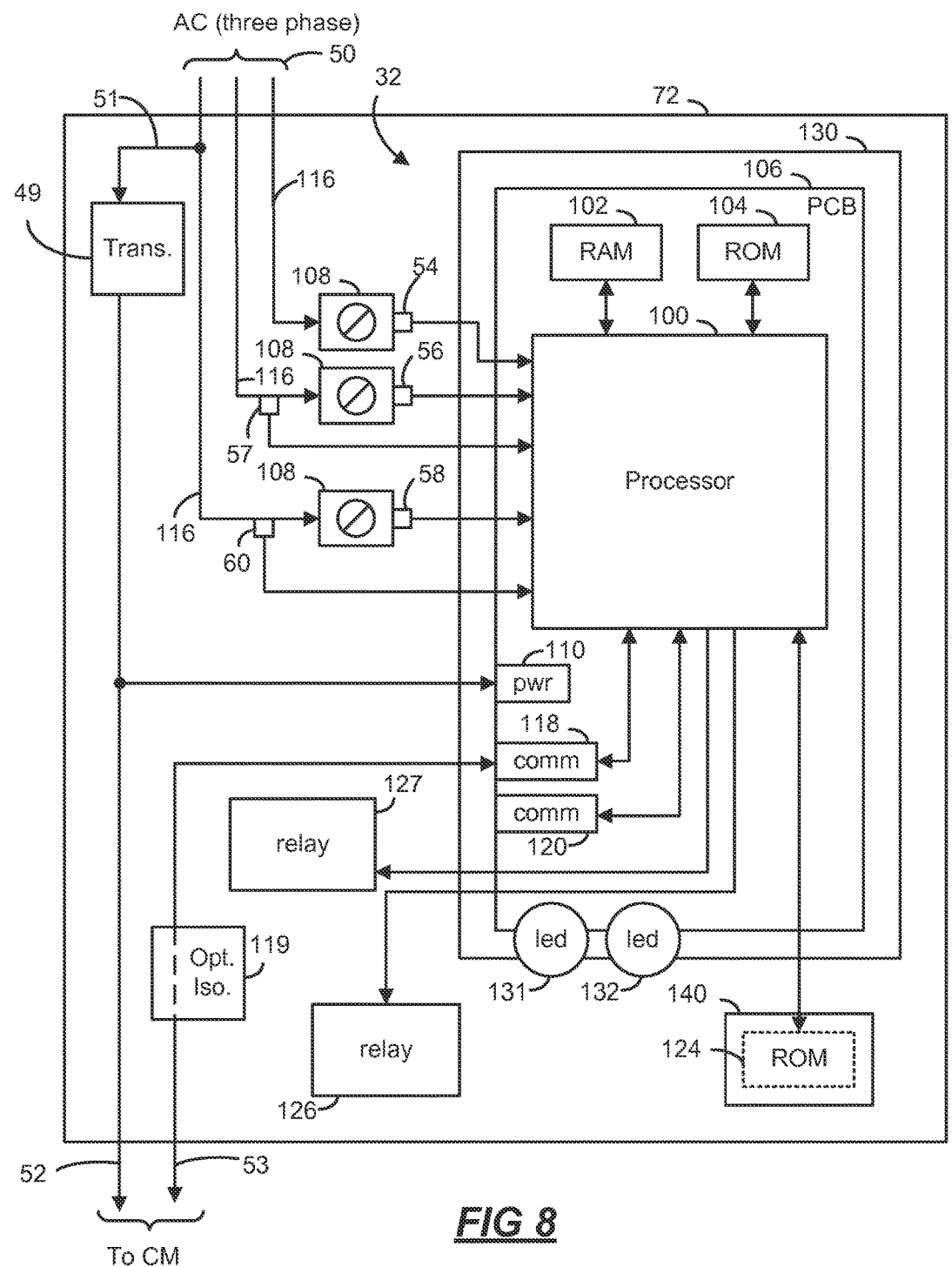
FIG. 8 is a schematic view of an electrical enclosure of a compressor including a sensor module.
Figure 9:
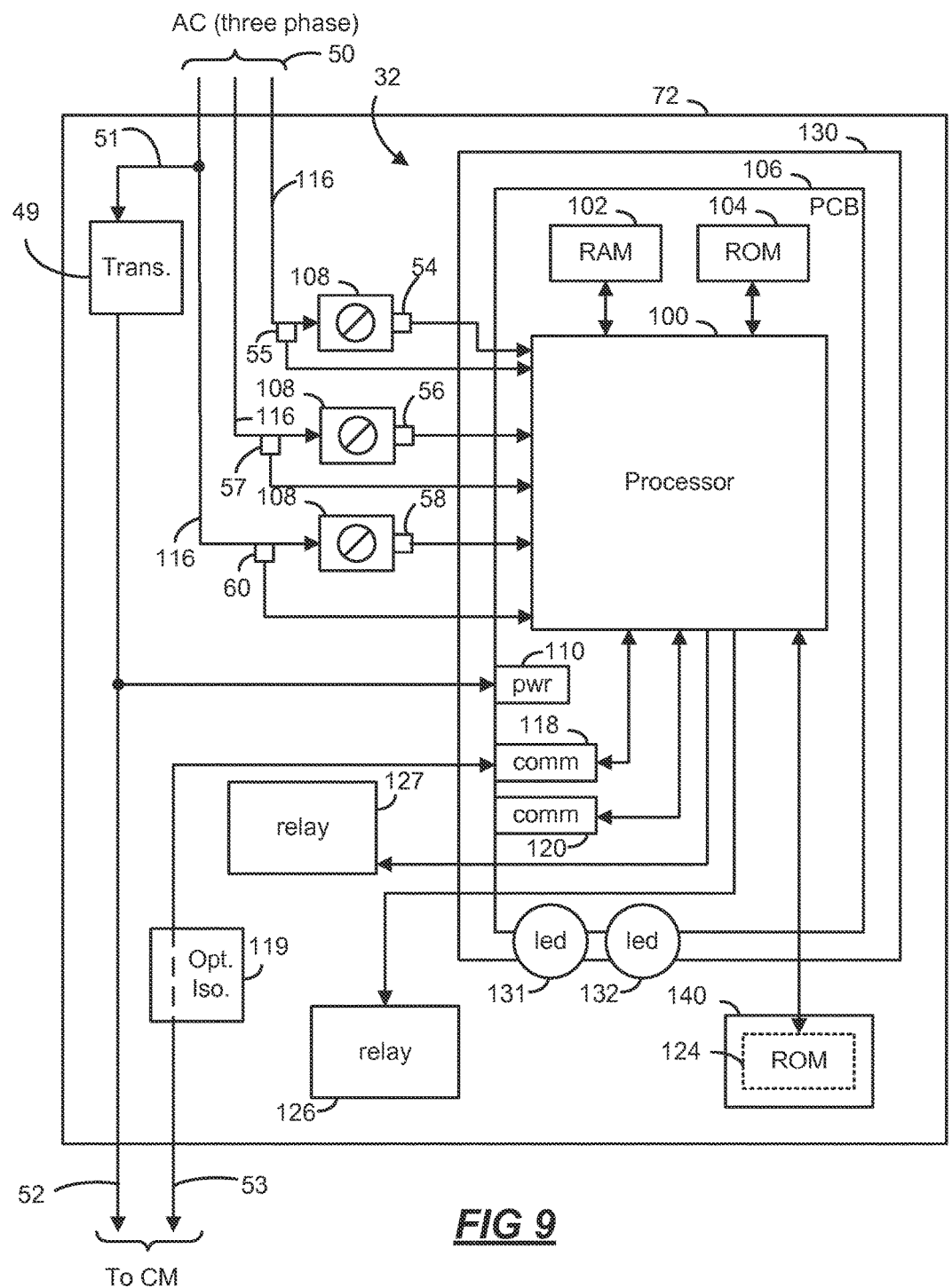
FIG. 9 is a schematic view of an electrical enclosure of a compressor including a sensor module.

In FIG. 7, one current sensor 60 is shown. Additional current sensors may also be used and connected to SM 32. With reference to FIG. 8, two current sensors 57, 60 may be used to sense electric current for two phases of electric power 50. When two current sensors 57, 60 are used, electric current for the remaining phase may be estimated based on voltage measurements and based on the current measurements from current sensors 57, 60. With reference to FIG. 9, three current sensors 55, 57, 60 may be used to sense electric current for all three phases of electric power 50.

Figure 10:
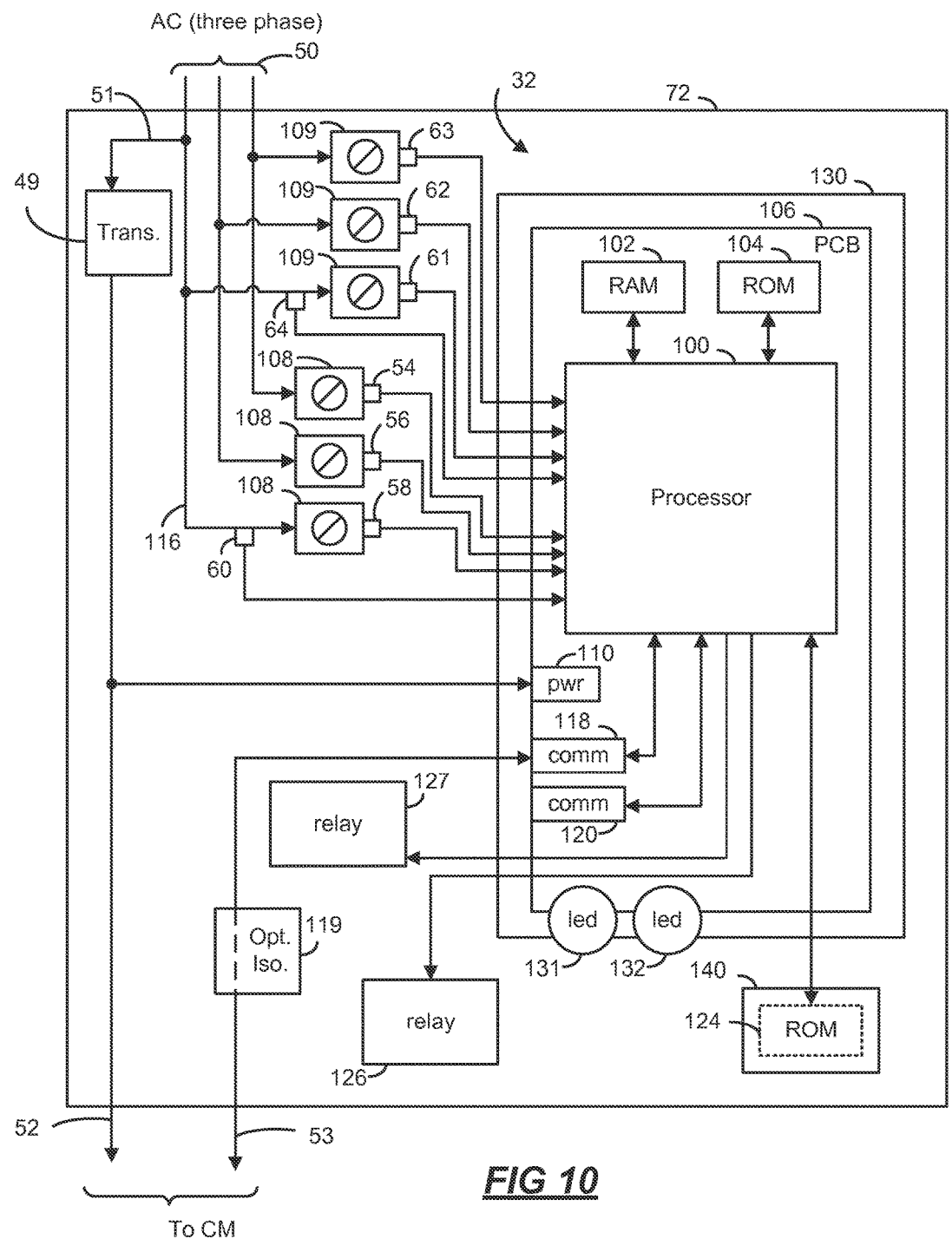
FIG. 10 is a schematic view of an electrical enclosure of a compressor including a sensor module.
Figure 11:
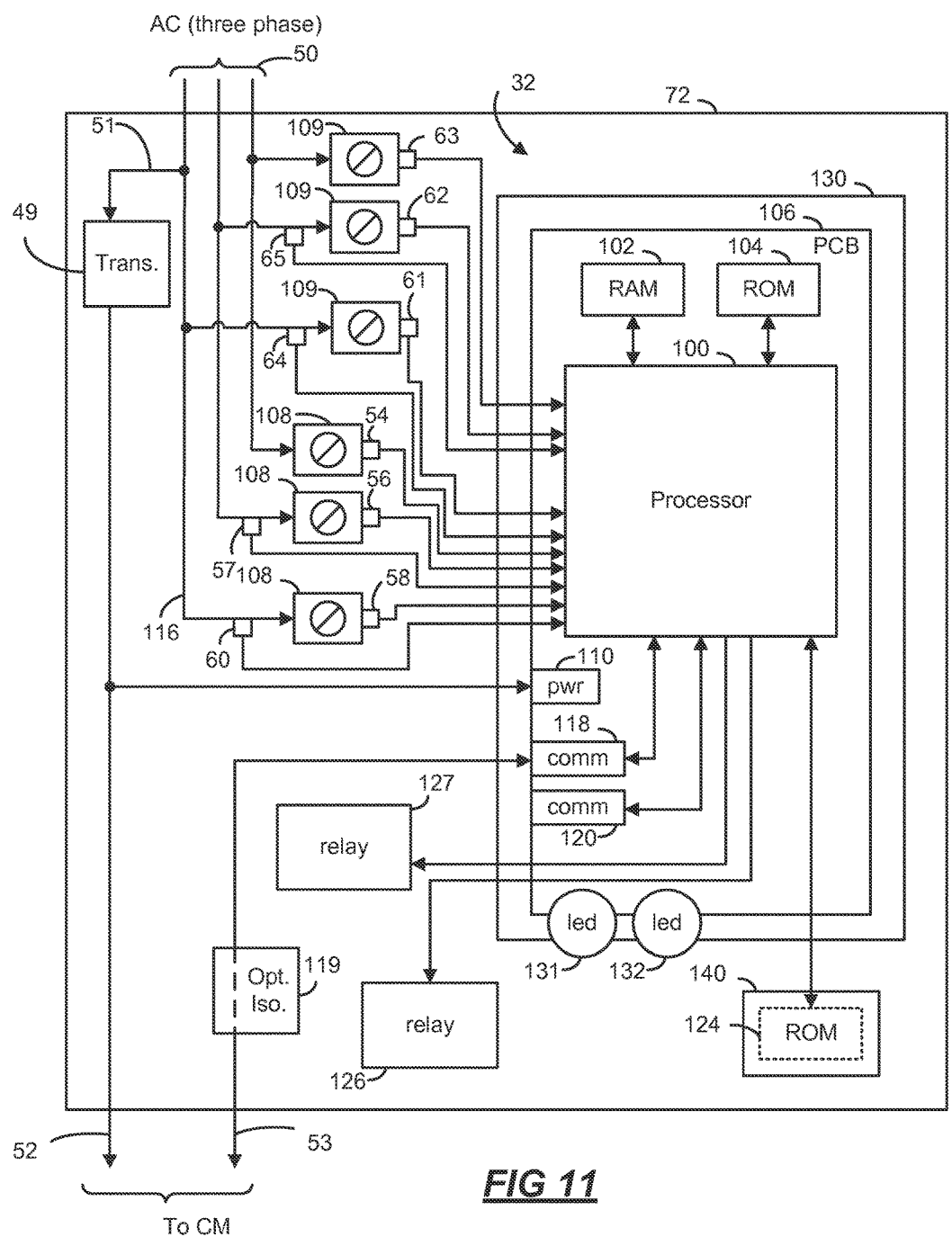
FIG. 11 is a schematic view of an electrical enclosure of a compressor including a sensor module.
Figure 12:
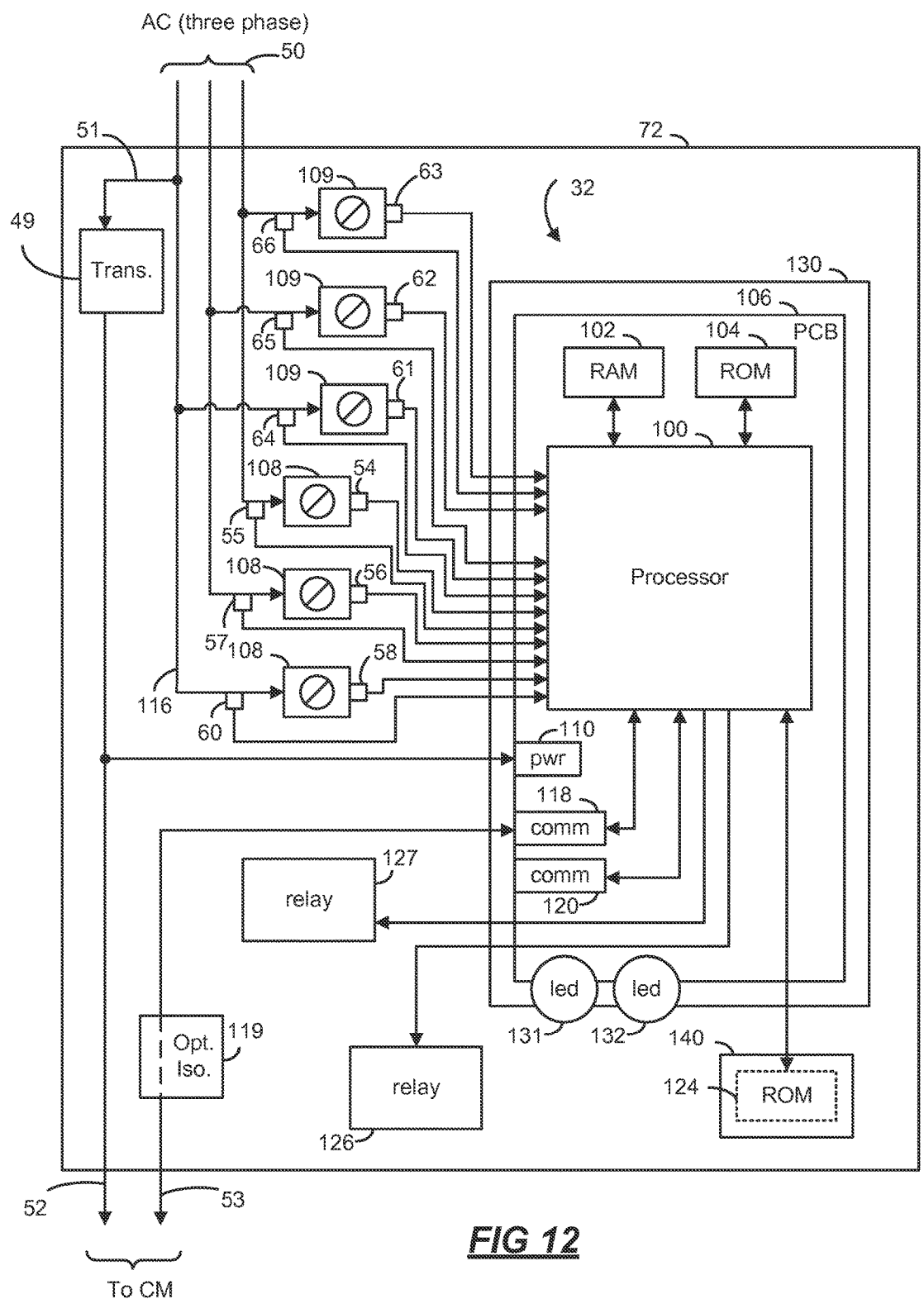
FIG. 12 is a schematic view of an electrical enclosure of a compressor including a sensor module.

With reference to FIGS. 10 to 12, in the case of a dual winding three phase electric motor, electrical enclosure 72 may include additional electrical terminals 109 for additional windings. In such case, six electrical terminals 108, 109 may be located within electrical enclosure 72. Three electrical terminals 108 may be connected to the three phases of electric power 50 for a first set of windings of the electric motor of compressor 12. Three additional electrical terminals 109 may also connected to the three phases of electric power 50 for a second set of windings of the electric motor of compressor 12.

Voltage sensors 61, 62, 63 may be located proximate each of electrical terminals 109. Processor 100 may be connected to voltage sensors 61, 62, 63 and may periodically receive or sample voltage measurements. With reference to FIG. 10, processor 100 may periodically receive or sample current measurements from a current sensor 64 for sensing electrical current flowing to one of the additional electrical terminals 109. Additional current sensors may also be used. With reference to FIG. 11, four current sensors 57, 60, 64, 65 may be connected to processor 100. Two current sensors 57, 60 may be associated with electrical terminals 108 and two current sensors 64, 65 may be associated with electrical terminals 109. With reference to FIG. 12, six current sensors 55, 57, 60, 64, 65, 66 may be connected to processor 100. Three current sensors 55, 57, 60 may be associated with electrical terminals 108 and three current sensors 64, 65, 66 may be associated with electrical terminals 109. With six current sensors 55, 57, 60, 64, 65, 66, processor 100 may receive current measurements for each winding of a dual winding three phase electric motor associated with compressor 12.

Processor 100 may sample current and voltage measurements from the various sensors periodically over each cycle of AC power to determine multiple instantaneous current and voltage measurements. For example, processor 100 may sample current and voltage measurements twenty times per cycle or approximately once every millisecond in the case of alternating current with a frequency of sixty mega-hertz. From these actual current and voltage measurements, processor 100 may calculate additional power related data such as true and apparent power, power consumption over time, and power factor.

Based on actual current and voltage measurements, processor 100 may determine a root mean square (RMS) value for voltage and current for each phase of electric power 50. Processor 100 may calculate an RMS voltage value by squaring each of the sampled voltage measurements, averaging the squared measurements, and calculating the square root of the average. Likewise, processor 100 may calculate an RMS current value by squaring each of the sampled current measurements, averaging the squared measurements, and calculating the square root of the average.

From RMS voltage and RMS current calculations, processor 100 may calculate apparent power (S) according to the following equation:

$$S = V_{RMS} \times I_{RMS}, \quad (1)$$

where $V_{RMS}$ is the calculated RMS of voltage over at least one cycle of AC and where $I_{RMS}$ is the calculated RMS of current over at least one cycle of AC. Apparent power may be calculated in units of Volt-Amps (VA) or kilo-Volt-Amps (kVA)

Processor 100 may calculate apparent power for each phase of electric power 50. When current sensors 55, 57, 60, 64, 65, 66 are available for all three phases of electric power 50, actual current measurements may be used to calculate apparent power. When current sensors are not available for all three phases, current for a missing phase may be estimated by interpolation from known current and voltage measurements.

Processor 100 may calculate total apparent power ($S_{Total}$) for an electric motor of compressor 12 based on apparent power calculations for each of the phases, according to the following equation:

$$S_{Total} = V_{RMS(1)} \times I_{RMS(1)} + V_{RMS(2)} \times I_{RMS(2)} + V_{RMS(3)} \times I_{RMS(3)}, \quad (2)$$

where $V_{RMS(1)}$, $V_{RMS(2)}$, and $V_{RMS(3)}$ are the calculated RMS voltage over a cycle of AC for the first, second, and third phase of AC, respectively, and where $I_{RMS(1)}$, $I_{RMS(2)}$, and $I_{RMS(3)}$ are the calculated RMS current a cycle of AC for the first, second, and third phase of AC, respectively. Apparent power is calculated in units of Volt-Amps (VA) or kilo-Volt-Amps (kVA)

Active power (P), in units of watts (W) or kilo-watts (kW) may be calculated as an integral of the product of instantaneous currents and voltages over a cycle of AC, according to the following equation:

$$P = \frac{1}{T} \int_0^T (v(t)i(t))\,dt, \quad (3)$$

where v(t) is instantaneous voltage at time t, in units of volts; where i(t) is instantaneous current at time t, in units of amps; and where T is the period.

Based on the actual instantaneous electrical current and voltage measurements sampled over a cycle of the AC power, processor 100 may calculate (P) as the sum of the products of instantaneous voltage and current samples for each sample interval (e.g., one millisecond), over one cycle of AC. Thus, P may be calculated by processor 100 according to the following equation:

$$P \cong \frac{1}{T} \sum_{k=1}^{k=\frac{T}{\Delta t}} v(k)i(k)\Delta t, \quad (4)$$

where v(k) is the instantaneous voltage measurement for the kth sample; i(k) is the instantaneous current measurement for the kth sample; T is the period; and $\Delta t$ is the sampling interval (e.g., 1 millisecond).

P may be calculated for each phase of electric power. Processor 100 may calculate a total active power ($P_{Total}$) by adding the active power for each phase, according to the following equation:

$$P_{Total} = P_{(1)} + P_{(2)} + P_{(3)}, \quad (5)$$

Where $P_{(1)}$, $P_{(2)}$, and $P_{(3)}$ are the active power for the first, second, and third phase of AC, respectively.

Based on the active power calculations, processor 100 may calculate energy consumption by calculating an average of active power over time. Energy consumption may be calculated by processor 100 in units of watt-hours (WH) or kilo-watt-hours (kWH).

Further, based on the active power calculation and the apparent power calculation, processor 100 may calculate the power factor (PF) according to the following equation:

$$PF = \frac{P}{S}, \quad (6)$$

where P is active power in units of watts (W) or kilo-watts (kW); and where S is apparent power in units of volt-amps (VA) or kilo-volt-amps (kVA). Generally, PF is the ratio of the power consumed to the power drawn. Processor 100 may calculate PF for each phase of electric power. Processor 100 may also calculate a total PF as a ratio of total actual power to total apparent power, according to the following equation:

$$PF_{Total} = \frac{P_{Total}}{S_{Total}}, \quad (7)$$

where $P_{Total}$ and $S_{Total}$ are calculated according to formulas 2 and 5 above.

Alternatively, processor 100 may calculate power factor by comparing the zero crossings of the voltage and current waveforms. The processor may use the angular difference between the zero crossings as an estimate of PF. Processor 100 may monitor voltage and current measurements to determine voltage and current waveforms for electric power 50. Based on the measurements, processor may determine where each waveform crosses the zero axis. By comparing the two zero crossings, processor 100 may determine an angular difference between the voltage waveform and the current waveform. The current waveform may lag the voltage waveform, and the angular difference may be used by processor 100 as an estimate of PF.

PF may be used as an indication of the efficiency of the electric motor or the compressor. Increased lag between the current waveform and the voltage waveform results in a lower power factor. A power factor near one, i.e., a unity power factor, is more desirable than a lower power factor. An electric motor with a lower power factor may require more energy to operate, thereby resulting in increased power consumption.

SM 32 may provide continually updated power factor calculations, as well as RMS voltage, RMS current, active power, apparent power, and energy consumption calculations, based on continually sampled instantaneous electrical current and voltage measurements, to CM 30 and/or system controller 34. CM 30 and system controller 34 may utilize the electrical electric power measurements and calculations communicated from SM 32 to control and evaluate efficiency of compressor 12 or refrigeration system 10.

Further, electrical measurements and calculations, including PF, may be accessed by a user through system controller 34 or CM 30. Additionally, electrical measurements and calculations may be accessed through direct communication with SM 32 via communication port 120. Electrical measurements and calculations may be stored and periodically updated in embedded ROM 124.

In this way, electrical calculations and measurements, such as RMS voltage, RMS current, active power, apparent power, power factor, and energy calculations may be accurately and efficiently made at the compressor 12 and communicated to other modules or controllers or to a user of the compressor 12 or refrigeration system 10 for purposes of evaluating electrical power usage.

In addition to communicating electrical calculations and measurements to other modules, controllers, or users, SM 32 may use the electrical calculations and measurements diagnostically to detect certain variations in operating conditions. SM 32 may alert CM 30 to certain operating conditions based on the electrical calculations and measurements.

Figure 13:
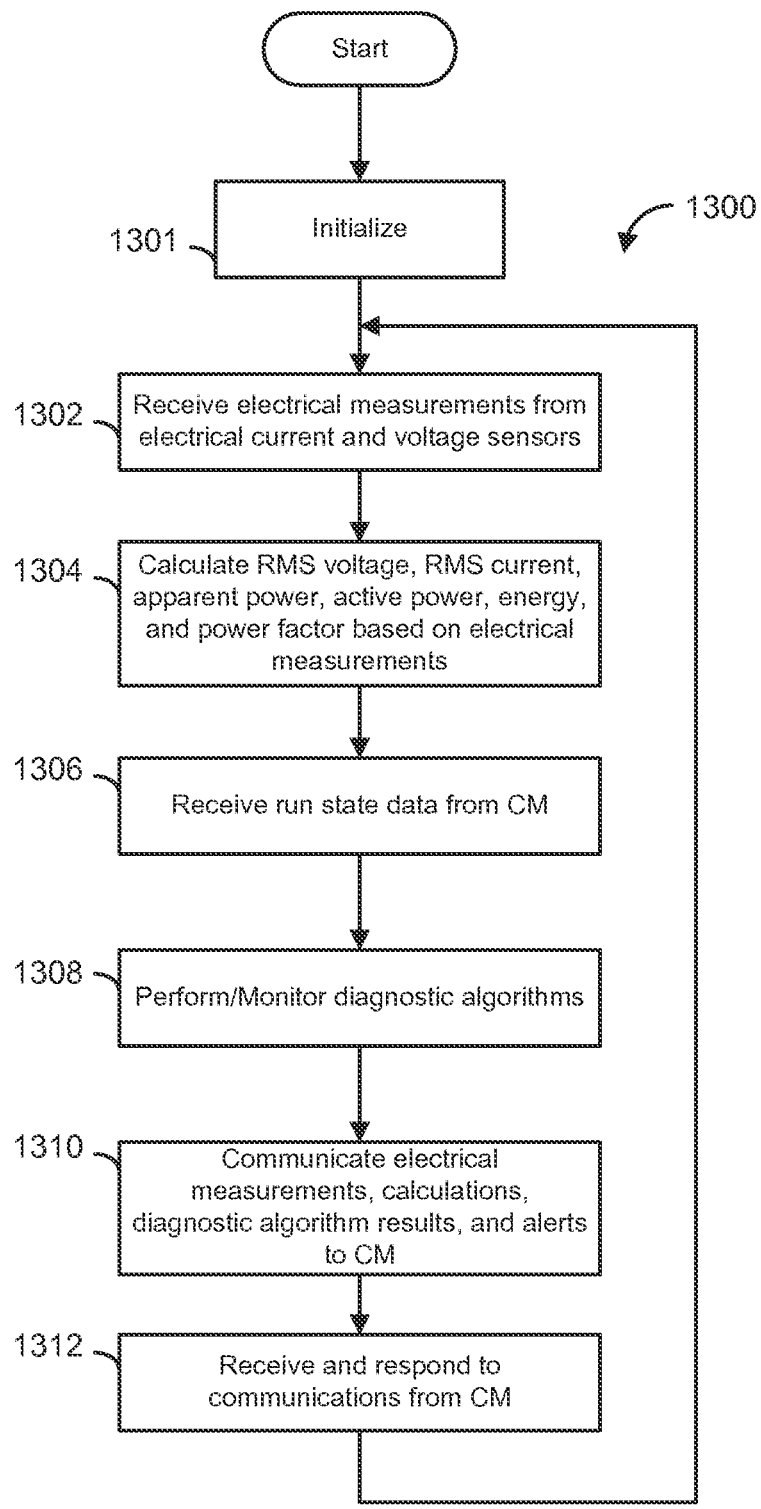
FIG. 13 is a flow chart illustrating an operating algorithm of a sensor module in accordance with the present teachings.

Referring now to FIG. 13, a flow chart illustrating an operating algorithm 1300 for SM 32 is shown. In step 1301, SM 32 may initialize. Initialization may include resetting counters, timers, or flags, checking and initializing RAM 102, initializing ports, including communication ports 118, 120, enabling communication with other devices, including CM 30, checking ROM 104, checking embedded ROM 124, and any other necessary initialization functions. SM 32 may load operating instructions from ROM 104 for execution by processor 100.

In step 1302, SM 32 may receive actual electrical measurements from connected voltage and current sensors. SM 32 may receive a plurality of instantaneous voltage and current measurements over the course of a cycle of the AC electrical power. SM 32 may buffer the voltage and current measurements in RAM 102 for a predetermined time period.

In step 1304, SM 32 may calculate RMS voltage and RMS current based on the instantaneous voltage and current measurements. Based on the RMS voltage and RMS current calculations, SM 32 may calculate apparent power in step 1304. Based on the instantaneous voltage and current measurements, SM 32 may also calculate active power. Based on the apparent power calculation and the active power calculation, SM 32 may calculate the power factor. SM 32 may also calculate the power factor from the instantaneous voltage and current measurements by examining an angular difference between the zero crossings of the electrical current waveform and the voltage waveform.

In step 1306, SM 32 may receive run state data from CM 30. The run state data may include data indicating whether an electric motor of compressor 12 is currently in an activated or deactivated state. The run state data may also include timing data indicating a period of time that the electric motor has been in the current state. If the electric motor is a dual winding three phase electric motor, the run state data may also including data indicating whether one or both of the windings are activated.

In step 1308, based on the electrical measurements and calculations, and based on the data received from CM 30, SM 32 may perform and/or monitor diagnostic algorithms as described in more detail below. Some diagnostic algorithms may be executed once per each iteration of operating algorithm 1300. Some diagnostic algorithms may be executed concurrently with, and monitored by, operating algorithm 1300.

In step 1310, SM 32 may communicate the results of the electrical measurements and calculations to CM 30. SM 32 may also communicate the results of any diagnostic algorithms to CM 30. As described below, SM 32 may set operating flags corresponding to operating conditions according to diagnostic algorithms. SM 32 may communicate any operating flags to CM 30 in step 1310.

In step 1312, SM 32 may receive and respond to communications from CM 30. For example, CM 30 may request particular data from SM 32. CM 30 may also request certain data from embedded ROM 124. CM 30 may update SM 32 with operating parameters or thresholds for use in diagnostic algorithms. CM 30 may direct SM 32 to activate or deactivate any compressor related devices, such as a crank case heater, controlled by SM 32 via relay 127.

After responding to communications from CM 30 in step 1312, SM 32 may loop back to step 1302 and continue operation.

Figure 14:
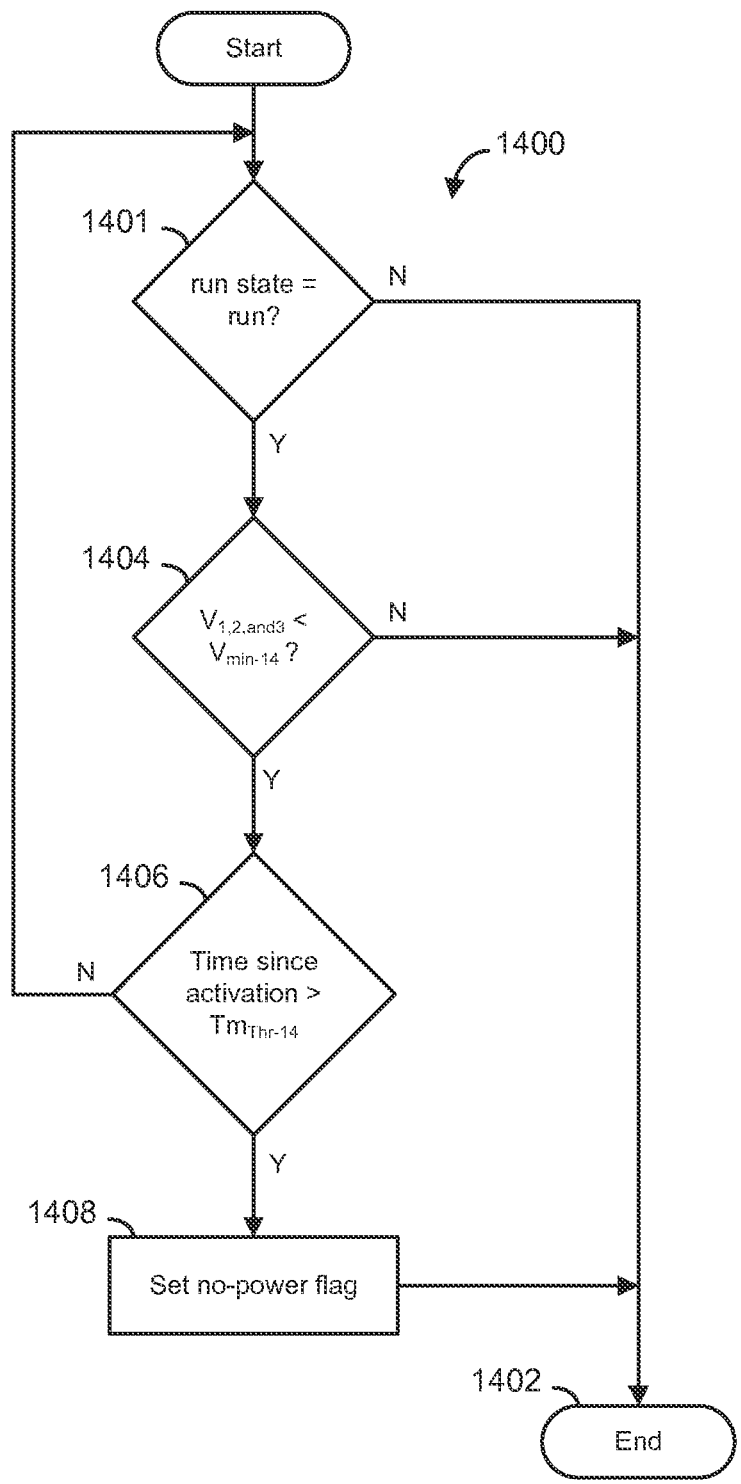
FIG. 14 is a flow chart illustrating a diagnostic algorithm of a sensor module in accordance with the present teachings.

Referring now to FIG. 14, a flow chart illustrating an algorithm 1400 for SM 32 to detect a no-power condition is shown. The algorithm 1400 may be one of the diagnostic algorithms performed/monitored by SM 32, as described with reference to step 1308 of FIG. 13 above. Prior to execution of the algorithm 1400, a no-power flag may have been reset by SM 32.

In step 1401, SM 32 may determine whether the current run state is set to run, based on run state data received from CM 30, as described with reference to step 1306 of FIG. 13 above. When the run state is not set to run, compressor 12 is not activated, and SM 32 may end execution of the algorithm in step 1402.

When the run state is set to run, SM 32 may proceed to step 1404 and check voltage measurements. When three phase power is used, SM 32 may check each of three voltage measurements, $V_1$, $V_2$, and $V_3$. SM 32 may determine whether $V_1$, $V_2$, and $V_3$ are less than a minimum voltage threshold, $V_{min-14}$. In step 1404, when $V_1$, $V_2$, and $V_3$ are greater than or equal to $V_{min-14}$, SM 32 may determine that compressor 12 has sufficient power, and end execution of algorithm 1400 in step 1402.

In step 1404, when SM 32 determines that $V_1$, $V_2$, and $V_3$ are less than $V_{min-14}$, SM 32 may proceed to step 1406. In step 1406, SM 32 may determine whether the time since the compressor 12 was activated is greater than a time threshold, $Tm_{Thr-14}$. For example, $Tm_{Thr-14}$ may be set to two seconds. In this way, SM 32 may allow for any bounce of any contactor coil relays. In step 1406, when the time since compressor activation is not greater than $Tm_{Thr-14}$, SM 32 may return to step 1401.

In step 1406, when the time since compressor activation is greater than $TM_{Thr-14}$, SM 32 may proceed to step 1408. In step 1408, SM 32 may set a no-power flag. By setting the no-power flag, SM 32 may indicate that compressor 12 does not have sufficient electrical power to operate. The no-power flag may be communicated to, or detected by, CM 30 and/or system controller 34. CM 30 and/or system controller 34 may adjust compressor and refrigeration system operation accordingly.

Figure 15:
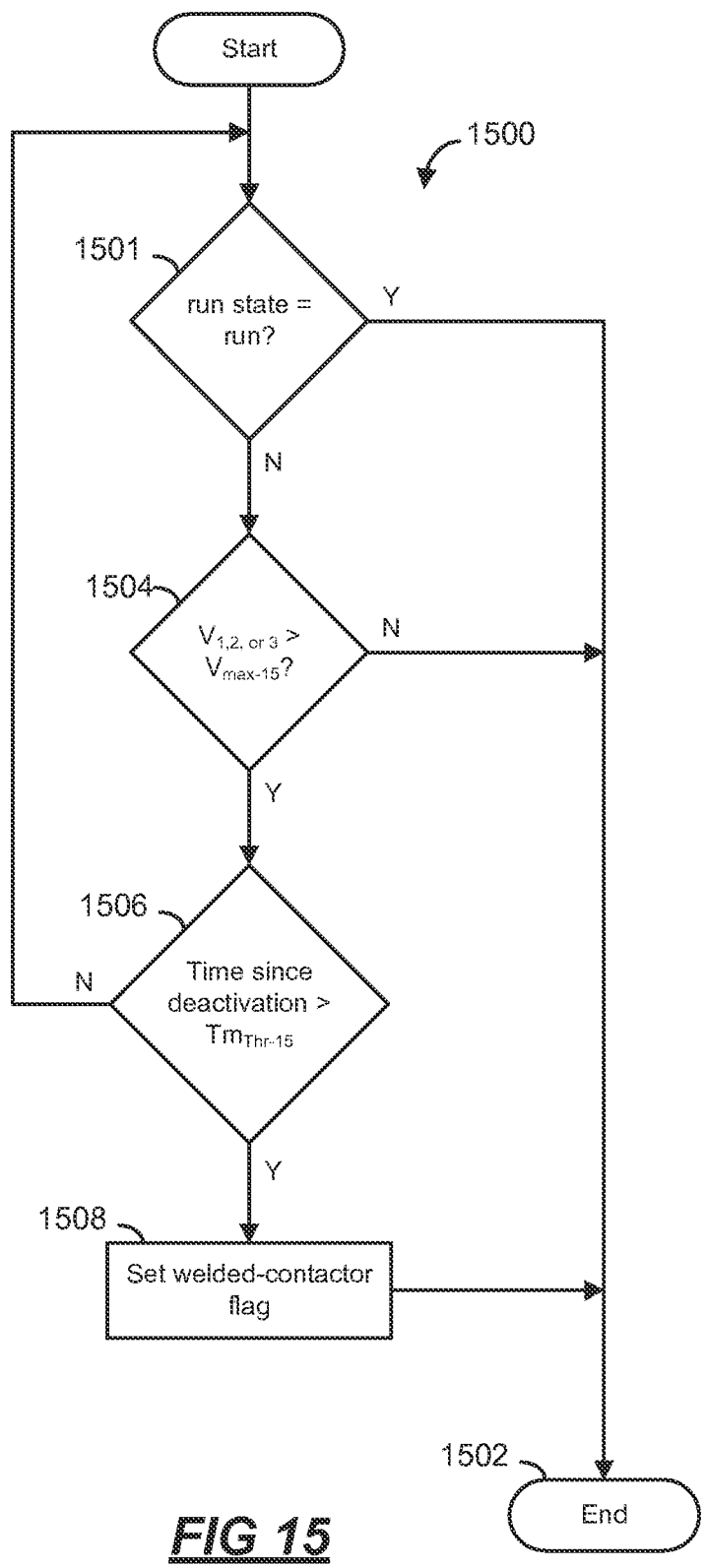
FIG. 15 is a flow chart illustrating a diagnostic algorithm of a sensor module in accordance with the present teachings.

Referring now to FIG. 15, a flow chart illustrating an algorithm 1500 for SM 32 to detect a welded contactor condition is shown. The algorithm 1500 may be one of the diagnostic algorithms performed/monitored by SM 32, as described with reference to step 1308 of FIG. 13 above. Prior to execution of the algorithm 1500, a welded-contactor flag may have been reset by SM 32. A welded contactor may cause compressor 12 to continue to operate, even though SM 32 or CM 30 may have attempted to open a contactor to deactivate the compressor.

In step 1501, SM 32 may determine whether the current run state is set to run, based on run state data previously received from CM 30, as described with reference to step 1306 of FIG. 13 above. When the run state is set to run, the compressor 12 is activated, and SM 32 may end execution of the algorithm in step 1502.

When the run state is not set to run, SM 32 may proceed to step 1504 and check voltage measurements. When three phase power is used, SM 32 may check each of three voltage measurements, $V_1$, $V_2$, and $V_3$. SM 32 may determine whether voltages $V_1$, $V_2$, or $V_3$ are greater than a maximum voltage threshold, $V_{max-15}$. In step 1504, when $V_1$, $V_2$, or $V_3$ are not greater than or equal to $V_{max-15}$, SM 32 may determine that a welded contactor condition does not exist, and end execution of the algorithm in step 1502.

When $V_1$, $V_2$, or $V_3$ are greater than $V_{max-15}$, SM 32 may proceed to step 1506. In step 1506, SM 32 may determine whether the time since compressor 12 was deactivated is greater than a time threshold, $Tm_{Thr-15}$. For example, $Tm_{Thr-15}$ may be set to two seconds. By waiting for the $Tm_{Thr-15}$, SM 32 may allow for any bounce of any contactor coil relays. In step 1506, when the time since compressor deactivation is not greater than $Tm_{Thr-15}$, SM 32 may return to step 1501.

In step 1506, when the time since compressor deactivation is greater than $TM_{Thr-15}$, SM 32 may proceed to step 1508. In step 1508, SM 32 may set a welded-contactor flag. By setting the welded-contactor flag, SM 32 may indicate that compressor 12 may have at least one welded contactor. In such case, power may be delivered to compressor 12, due to the welded contactor, despite the attempt of CM 30 or SM 32 to deactivate compressor 12. The welded-contactor flag may be communicated to, or detected by, CM 30 and/or system controller 34. CM 30 and/or system controller 34 may adjust compressor and refrigeration system operation accordingly. Specifically, CM 30 may activate compressor 12 while it is in the welded-contactor state to avoid a voltage imbalance condition and prevent damage or overheating of compressor 12. Further, CM 30 or system controller 34 may notify a user that compressor 12 is being operated in a welded-contactor state.

Figure 16:
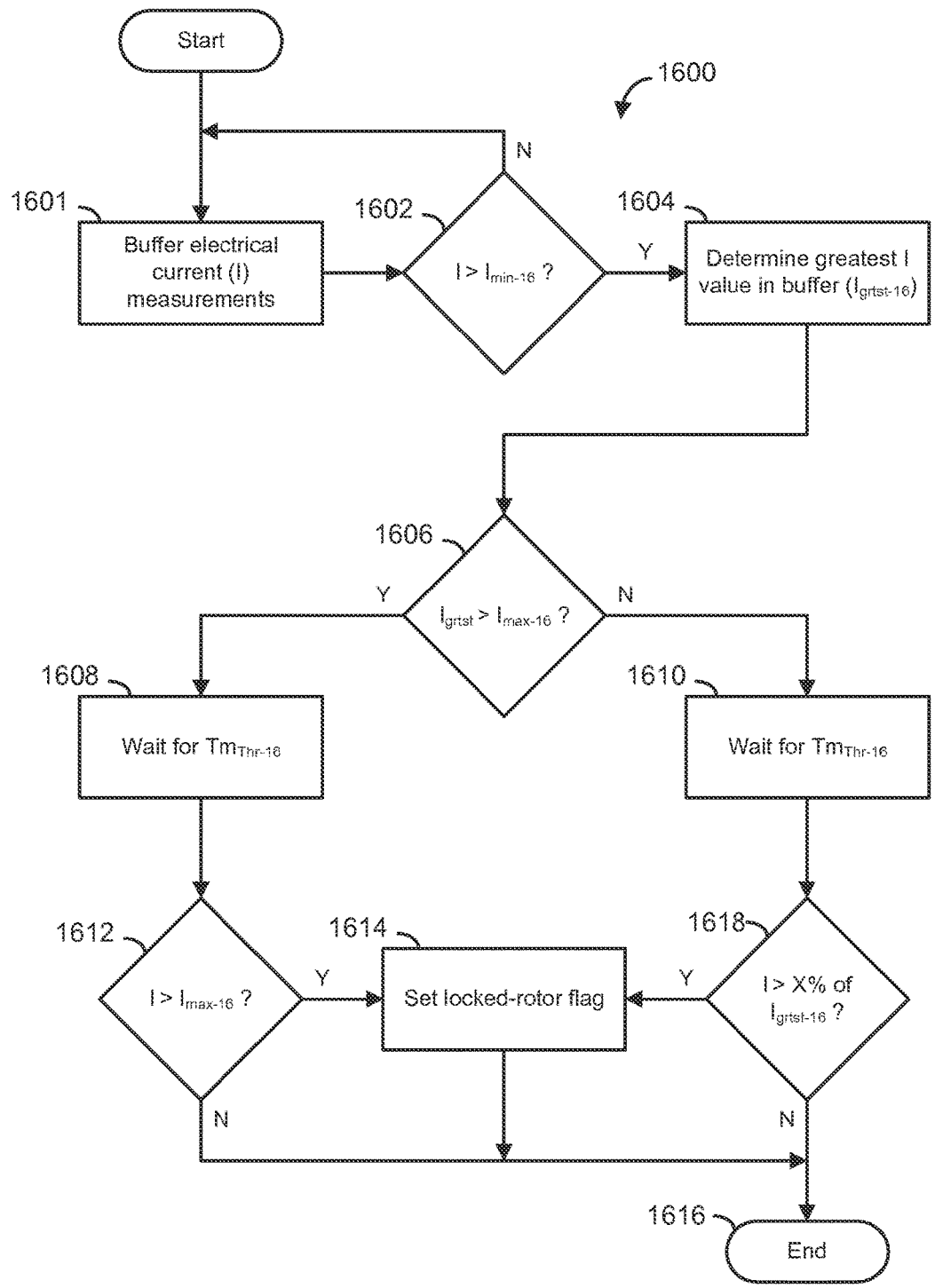
FIG. 16 is a flow chart illustrating a diagnostic algorithm of a sensor module in accordance with the present teachings.

Referring now to FIG. 16, a flow chart illustrating an algorithm 1600 for SM 32 to detect a locked rotor condition is shown. Algorithm 1600 may be one of the diagnostic algorithms performed/monitored by SM 32, as described with reference to step 1308 of FIG. 13 above. In a locked rotor condition, a rotor of the electric motor may be seized. Normally, when an electric motor is activated, electric current of the motor (I) increases for an initial period during startup, and then decreases as the motor reaches operating speed. If, however, the rotor is seized, I will not decrease after the initial period. Prior to execution of the algorithm 1600, a locked-rotor flag may have been reset by SM 32.

In step 1601, SM 32 may buffer electrical current measurements for a predetermined buffer period. For example, SM 32 may buffer electrical current measurements for 200 ms.

In step 1602, SM 32 may determine whether I is greater than a minimum electric current threshold ($I_{min-16}$). When I is not greater than $I_{min-16}$, SM 32 may loop back to step 1601 and continue to buffer I. In step 1602, when SM 32 determines that I is greater than $I_{min-16}$, SM 32 may proceed to step 1604.

In step 1604, SM 32 may determine the greatest I value currently in the buffer ($I_{grtst-16}$). In step 1606, SM 32 may determine whether $I_{grtst}$ is greater than an electric current threshold ($I_{max-16}$). SM 32 may then wait in steps 1608 and 1610 for a time threshold ($TM_{Thr-16}$) to expire. For example, $TM_{Thr-16}$ may be set to two seconds. In this way, SM 32 allows I to settle to a normal operating current if the electric motor does not have a locked rotor.

When $I_{grtst-16}$ is greater than $I_{max-16}$ in step 1606, then in step 1612, SM 32 may use $I_{max-16}$ as the current threshold. In step 1612, when I is greater than $I_{max-16}$, SM 32 may determine that a locked rotor condition exists and may proceed to step 1614 to set the locked-rotor flag. In step 1612, when I is not greater than $I_{max-16}$, SM 32 may end execution of the algorithm in step 1616.

In step 1606, when $I_{grtst-16}$ is not greater than $I_{max-16}$, SM 32 may use a predetermined percentage (X %) of $I_{grtst-16}$ as the current threshold in step 1618. In step 1618, when $I_{mtr-16}$ is greater than X % of $I_{grtst-16}$, SM 32 may determine that a locked rotor condition exists and may set the locked-rotor flag in step 1614. SM 32 may end execution of the algorithm in step 1616. The locked-rotor flag may be communicated to, or detected by, CM 30 and/or system controller 34. CM 30 and/or system controller 34 may adjust compressor and refrigeration system operation accordingly.

If a locked-rotor condition is detected a predetermined number of consecutive times, SM 32 may set a locked rotor lockout flag. SM 32 may cease operation of the compressor until the lockout flag is cleared by a user. For example, SM 32 may set the locked rotor lockout flag when it detects ten consecutive locked rotor conditions.

Figure 17:
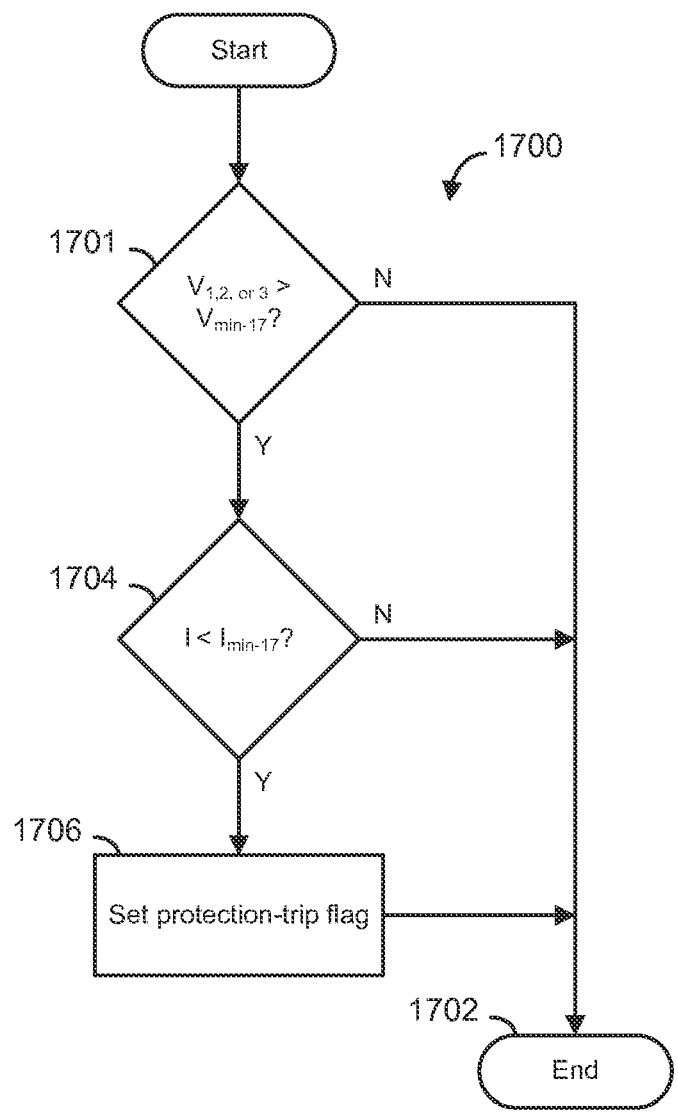
FIG. 17 is a flow chart illustrating a diagnostic algorithm of a sensor module in accordance with the present teachings.

Referring now to FIG. 17, a flow chart illustrating an algorithm 1700 for SM 32 to detect a motor protection trip is shown. Algorithm 1700 may be one of the diagnostic algorithms performed/monitored by SM 32, as described with reference to step 1308 of FIG. 13 above. Compressor 12 may be configured with internal line breaks. The internal line breaks may trip, or deactivate, compressor 12 when electric current is excessive or when compressor 12 is overheating. In such case, SM 32 may detect that an internal line break has occurred and notify CM 30. Prior to execution of the algorithm 1700, a protection-trip flag may have been reset by SM 32.

In step 1701, SM 32 determines whether any voltage, $V_1$, $V_2$, or $V_3$ is greater than a voltage minimum threshold ($V_{min-17}$). When $V_1$, $V_2$, or $V_3$ is not greater than $V_{min-17}$, SM 32 may end execution of algorithm 1700 in step 1702. When $V_1$, $V_2$, or $V_3$ is greater than $V_{min-17}$, SM 32 may proceed to step 1704. In step 1704, SM 32 may determine whether I is less than a current minimum $I_{min-17}$. When I is not less than $I_{min-17}$, SM 32 may end execution of algorithm 1700 in step 1702. When I is less than $I_{min-17}$, SM 32 may proceed to step 1706 and set a protection-trip flag. In this way, when voltage is present, but electric current is not present, SM 32 may determine that an internal line break condition has occurred. The protection-trip flag may be communicated to, or detected by, CM 30 and/or system controller 34. CM 30 and/or system controller 34 may adjust compressor 12 and refrigeration system 10 operation accordingly.

Figure 18:
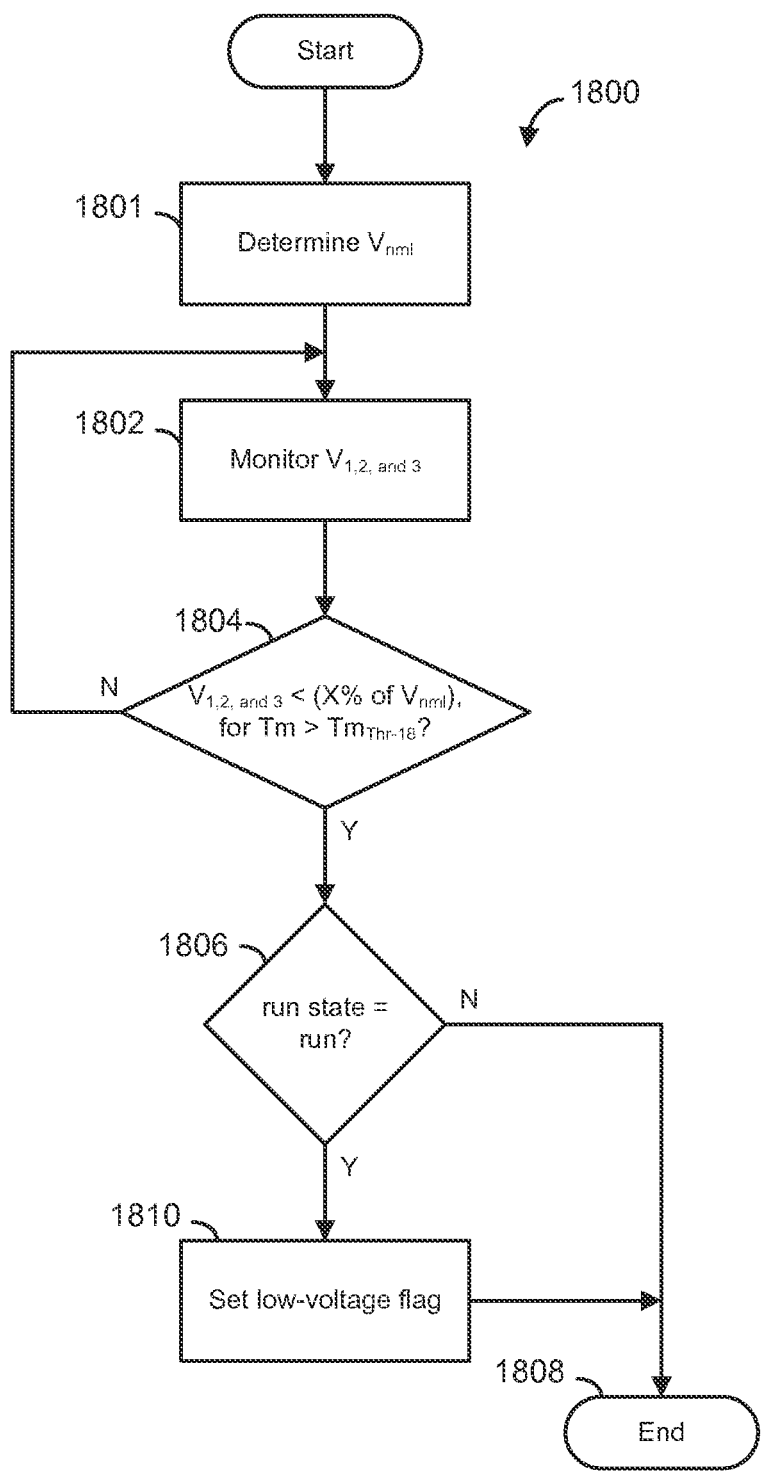
FIG. 18 is a flow chart illustrating a diagnostic algorithm of a sensor module in accordance with the present teachings.

Referring now to FIG. 18, a flow chart illustrating an algorithm 1800 for SM 32 to detect a low voltage condition is shown. Algorithm 1800 may be one of the diagnostic algorithms performed/monitored by SM 32, as described with reference to step 1308 of FIG. 13 above. Prior to execution of the algorithm 1800, a low-voltage flag may have been reset by SM 32.

In step 1801, SM 32 may determine the normal operating voltage of compressor ($V_{nml}$). SM 32 may determine $V_{nml}$ based on historical data of previous compressor operating voltages. For example, $V_{nml}$ may be calculated by averaging the voltage over the first five electrical cycles of power during the first normal run. $V_{nml}$ may alternatively be predetermined and stored in ROM 104, 124, or calculated based on an average voltage over the operating life of the compressor.

In step 1802, SM 32 may monitor $V_{1, 2, \text{ and } 3}$ for a predetermined time period $TM_{thr-18}$. For example, $Tm_{Thr-18}$ may be set to two seconds. The time threshold may or may not be the same as the time threshold used in other diagnostic algorithms. In step 1804, SM 32 may determine whether $V_{1, 2, \text{ and } 3}$ are less than a predetermined percentage (X %) of $V_{nml}$ for more than $TM_{thr-18}$. For example, the predetermined percentage may be 75 percent. In step 1804, when $V_{1, 2, \text{ and } 3}$ are not less than X % of $V_{nml}$ for more than $TM_{thr-18}$, SM 32 loops back to step 1802. In step 1804, when $V_{1, 2, \text{ and } 3}$ are less than X % of $V_{nml}$ for more than $TM_{thr-18}$, SM 32 may proceed to step 1806.

In step 1806, SM 32 may determine whether the run state is set to run. When the run state is not set to run in step 1806, SM 32 ends execution of algorithm 1800 in step 1808. When the run state is set to run, SM 32 may determine that a low-voltage condition exists and may set a low-voltage flag in step 1810. The low-voltage flag may be communicated to, or detected by, CM 30 and/or system controller 34. CM 30 and/or system controller 34 may adjust compressor 12 and refrigeration system 10 operation accordingly.

Figure 19:
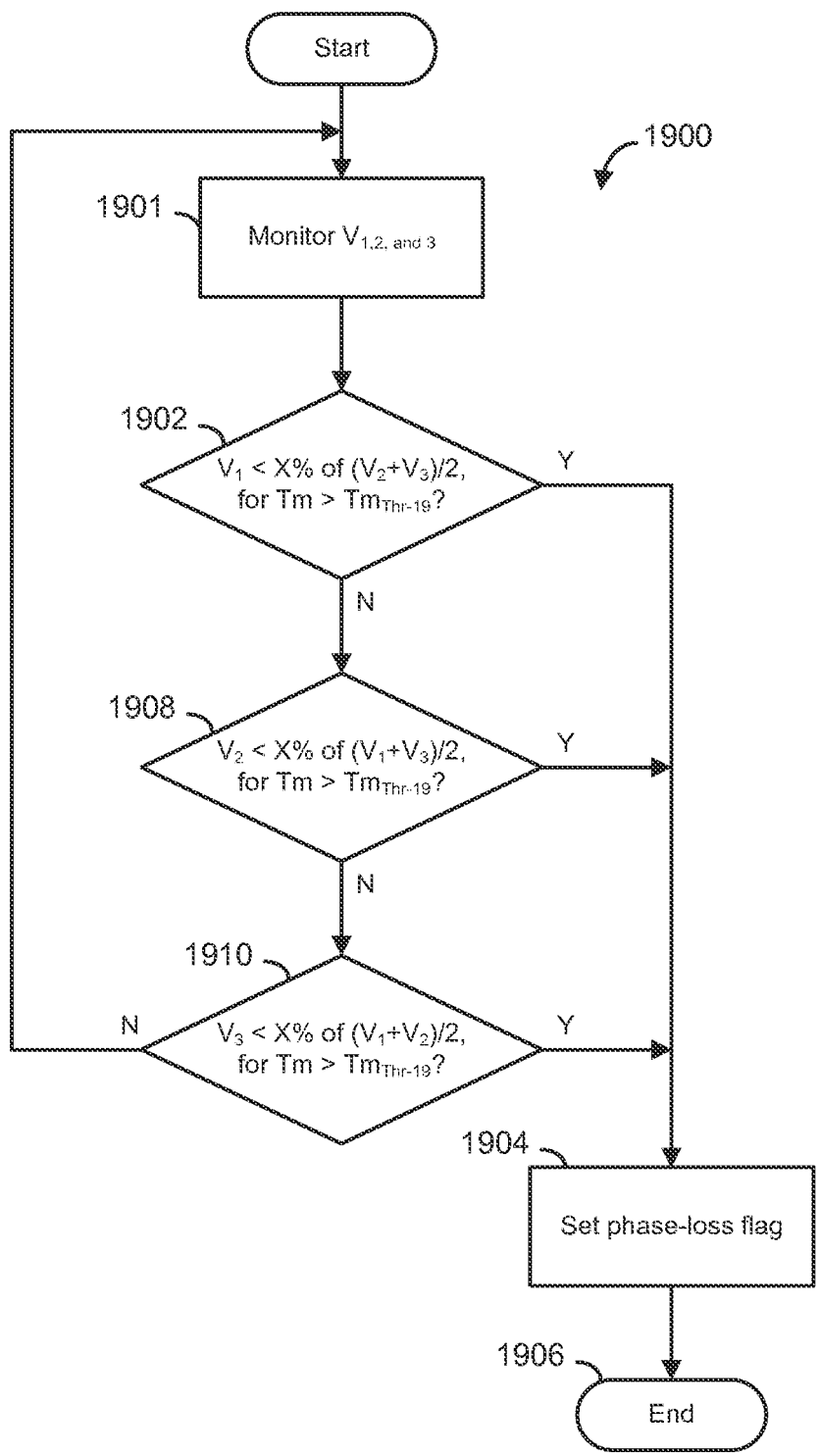
FIG. 19 is a flow chart illustrating a diagnostic algorithm of a sensor module in accordance with the present teachings.

Referring now to FIG. 19, a flow chart illustrating an algorithm 1900 for SM 32 to detect a phase loss condition for compressor 12, when three phase electric power 50 is used. Algorithm 1900 may be one of the diagnostic algorithms performed/monitored by SM 32, as described with reference to step 1308 of FIG. 13 above. SM 32 may compare each voltage, $V_1$, $V_2$, and $V_3$, to determine whether any particular voltage is lower than a predetermined percentage of the average of the other two voltages. Prior to execution of the algorithm 1900, a phase-loss flag may have been reset by SM 32

In step 1901, SM 32 may monitor $V_1$, $V_2$, and $V_3$. In step 1902, SM 32 may determine whether $V_1$ is less than a predetermined percentage, X %, of the average of $V_2$ and $V_3$, for a time (Tm) greater than a time threshold, $Tm_{Thr-19}$. When $V_1$ is less than X % of the average of $V_2$ and $V_3$, SM 32 may set the phase-loss flag in step 1904 and end execution of algorithm 1900 in step 1906. When $V_1$ is not less than X % of the average of $V_2$ and $V_3$, SM 32 may proceed to step 1908.

In step 1908, SM 32 may determine whether $V_2$ is less than X % of the average of $V_1$ and $V_3$, for Tm greater than $Tm_{Thr-19}$. When $V_2$ is less than X %, of the average of $V_1$ and $V_3$, SM 32 may set the phase-loss flag in step 1904 and end execution of algorithm 1900 in step 1906. When $V_2$ is not less than X % of the average of $V_1$ and $V_3$, SM may proceed to step 1910.

In step 1910, SM 32 may determine whether $V_3$ is less than X % of the average of $V_1$ and $V_2$, for Tm greater than $Tm_{Thr-19}$. When $V_3$ is less than X %, of the average of $V_1$ and $V_2$, SM 32 may set the phase-loss flag in step 1904 and end execution of algorithm 1900 in step 1906. When $V_3$ is not less than X % of the average of $V_1$ and $V_2$, SM 32 may loop back to step 1901. In this way, algorithm 1900 may operate concurrently with algorithm 1300. The phase-loss flag may be communicated to, or detected by, CM 30 and/or system controller 34. CM 30 and/or system controller 34 may adjust compressor 12 and refrigeration system 10 operation accordingly.

If a phase-loss condition is detected a predetermined number of consecutive times, SM 32 may set a phase-loss lockout flag. SM 32 may cease operation of the compressor until the lockout flag is cleared by a user. For example, SM 32 may set the phase-loss lockout flag when it detects ten consecutive phase-loss conditions.

Figure 20:
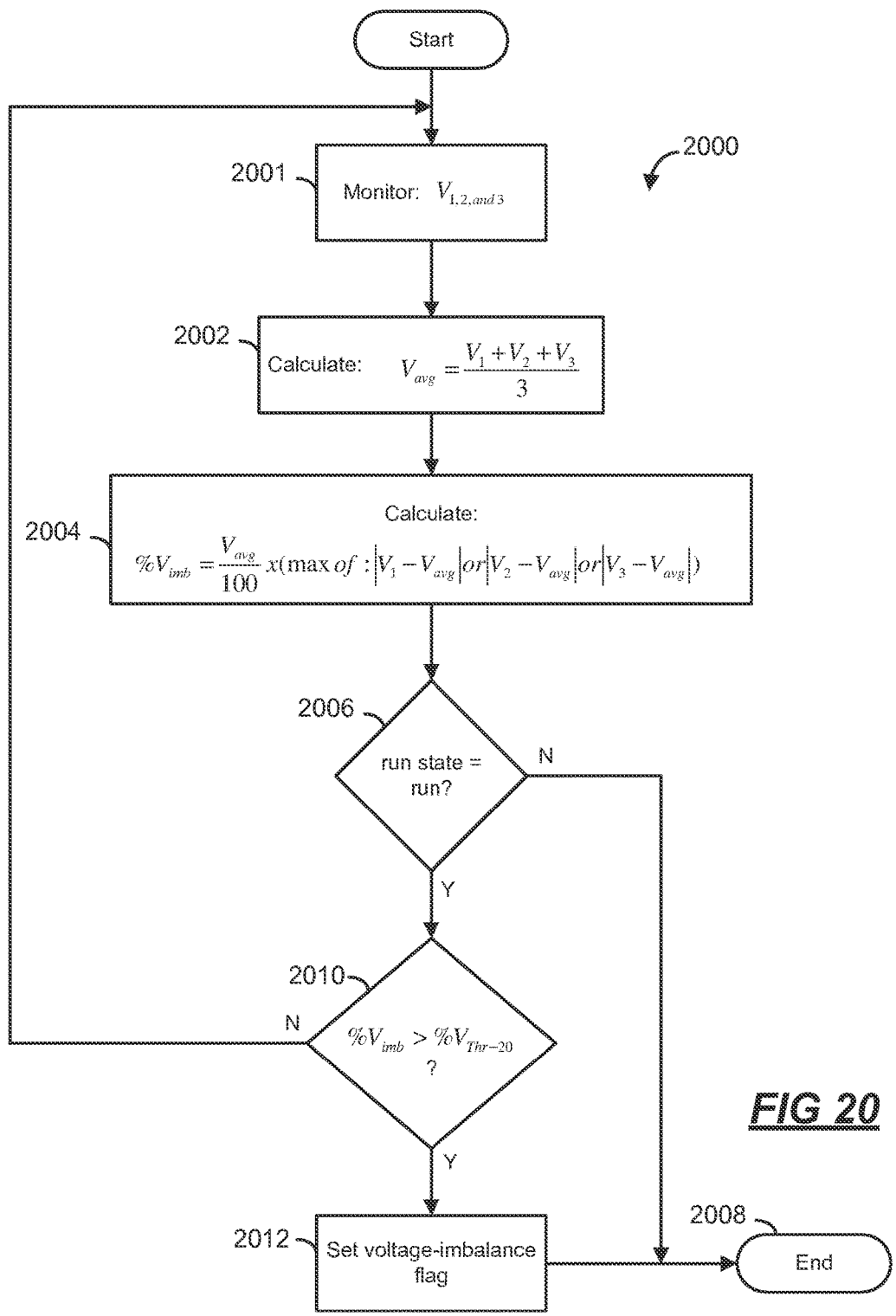
FIG. 20 is a flow chart illustrating a diagnostic algorithm of a sensor module in accordance with the present teachings.

Referring now to FIG. 20, a flow chart illustrating an algorithm 2000 for SM 32 to detect a voltage imbalance condition for compressor 12, when three phase electric power 50 is used. Algorithm 2000 may be one of the diagnostic algorithms performed/monitored by SM 32, as described with reference to step 1308 of FIG. 13 above. SM 32 may determine whether the difference between any of voltages $V_1$, $V_2$, or $V_3$ is greater than a predetermined percentage of the average of $V_1$, $V_2$, and $V_3$. When the difference between any of voltages $V_1$, $V_2$, or $V_3$ is greater than a predetermined percentage of the average of $V_1$, $V_2$, and $V_3$, SM 32 may determine that a voltage imbalance condition exists. Prior to execution of the algorithm 2000, a voltage-imbalance flag may have been reset by SM 32

In step 2001, SM 32 may monitor $V_1$, $V_2$, and $V_3$. In step 2002, SM 32 may calculate the average ($V_{avg}$) of $V_1$, $V_2$, and $V_3$. In step 2004, SM 32 may calculate the percentage of voltage imbalance (% $V_{imb}$) by determining the maximum of the absolute value of the difference between each of $V_1$ and $V_{avg}$, $V_2$ and $V_{avg}$, and $V_3$ and $V_{avg}$ The maximum difference is then multiplied by $V_{avg}/100$.

In step 2006, SM 32 determines whether the run state is set to run. In step 2006, when the run state is not set to run, SM 32 may end execution of algorithm 2000 in step 2008. In step 2006, when the run state is set to run, SM 32 may proceed to step 2010.

In step 2010, SM 32 may determine whether % $V_{imb}$ is greater than a voltage imbalance threshold (% $V_{Thr-20}$). When % $V_{imb}$ is not greater than % $V_{Thr-20}$, SM 32 loops back to step 2001. In this way, algorithm 2000 may execute concurrently with operating algorithm 1300. When % $V_{imb}$ is greater than % $V_{Thr-20}$, a voltage imbalance condition exists, and SM 32 may set the voltage-imbalance flag in step 2012. SM 32 may end execution of algorithm 2000 in step 2008. The voltage-imbalance flag may be communicated to, or detected by, CM 30 and/or system controller 34. CM 30 and/or system controller 34 may adjust compressor 12 and refrigeration system 10 operation accordingly.

Figure 21:
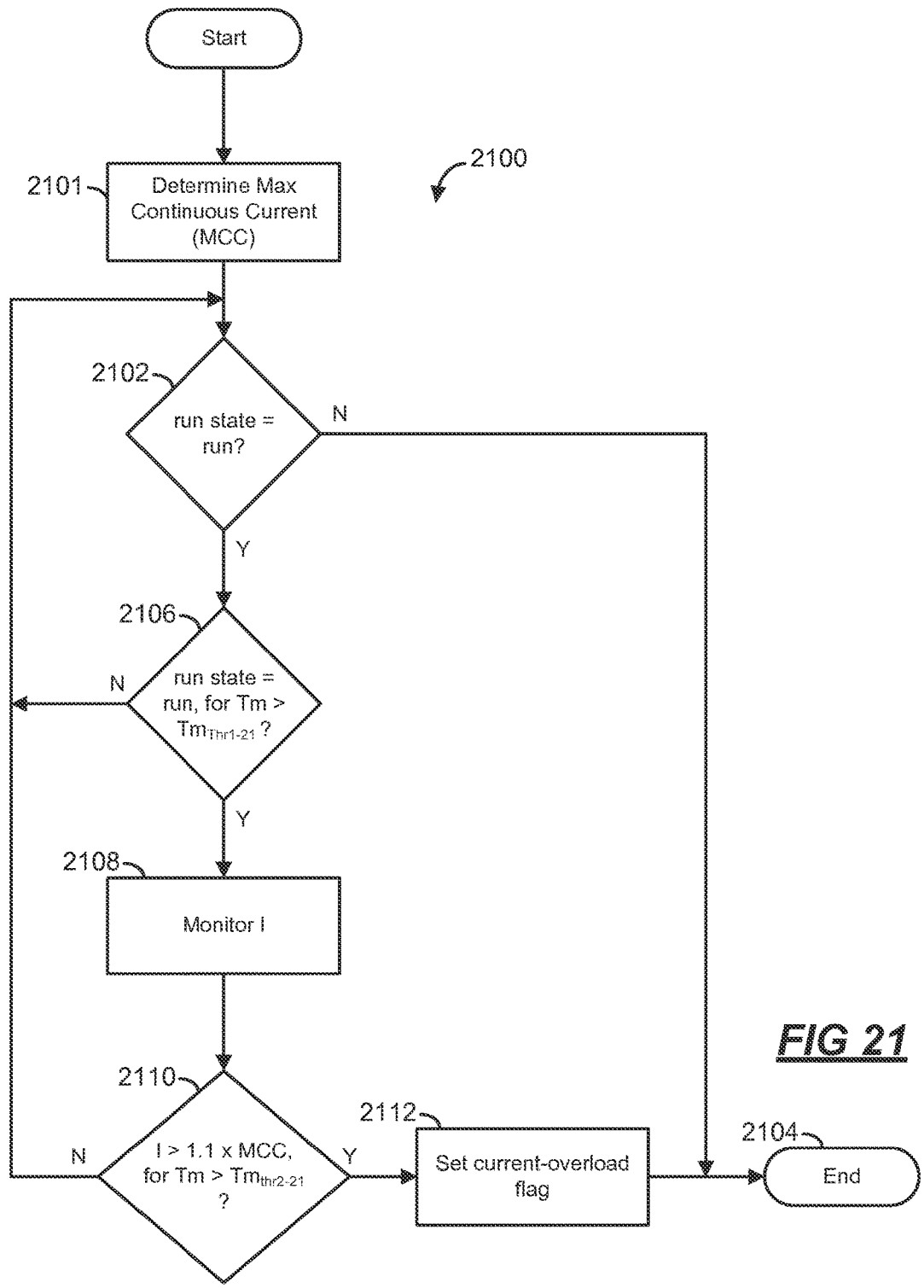
FIG. 21 is a flow chart illustrating a diagnostic algorithm of a sensor module in accordance with the present teachings.

Referring now to FIG. 21, a flow chart illustrating an algorithm 2100 for SM 32 to detect a current overload condition is shown. Algorithm 2100 may be one of the diagnostic algorithms performed/monitored by SM 32, as described with reference to step 1308 of FIG. 13 above. Prior to execution of the algorithm 2100, a current-overload flag may have been reset by SM 32

In step 2101, SM 32 may determine the maximum continuous current (MCC) for the electric motor of compressor 12. MCC may be predetermined and set during the manufacture of compressor 12. MCC may be stored in ROM 104 and/or embedded ROM 124. In addition, MCC may be user configurable. MCC may vary based on the type of refrigerant used. Thus, a user of compressor 12 may modify the default MCC value to conform to actual refrigeration system conditions.

In step 2102, SM 32 may determine whether the run state is set to run. When the run state is not set to run, SM 32 ends execution of algorithm 2100 in step 2104. In step 2102, when the run state is set to run, SM 32 may proceed to step 2106. In step 2106, when run state has not been set to run for a time period greater than a first time threshold ($TM_{Thr1-21}$), SM 32 loops back to step 2102. In step 2106, when run state has been set to run for a time period greater than $TM_{Thr1-21}$, SM 32 may proceed to step 2108.

In step 2108, SM 32 monitors I. In step 2110, SM 32 may determine whether I is greater than MCC multiplied by 1.1. In other words, SM 32 may determine whether I is greater than 110% of MCC for a time greater than a second time threshold ($TM_{Thr2-21}$). When SM 32 determines that I is not greater than 110% of MCC for a time greater than $TM_{Thr2-21}$, SM 32 may loop back to step 2102. In this way, algorithm 2100 may execute concurrently with operating algorithm 1300. When SM 32 determines that I is greater than 110% of MCC for a time greater than $TM_{Thr2-21}$, SM 32 may determine that a current-overload condition exists and may set the current-overload flag in step 2112. SM 32 may end execution of the algorithm 2100 in step 2104. The current-overload flag may be communicated to, or detected by, CM 30 and/or system controller 34. CM 30 and/or system controller 34 may adjust compressor and refrigeration system operation accordingly.

Figure 22:
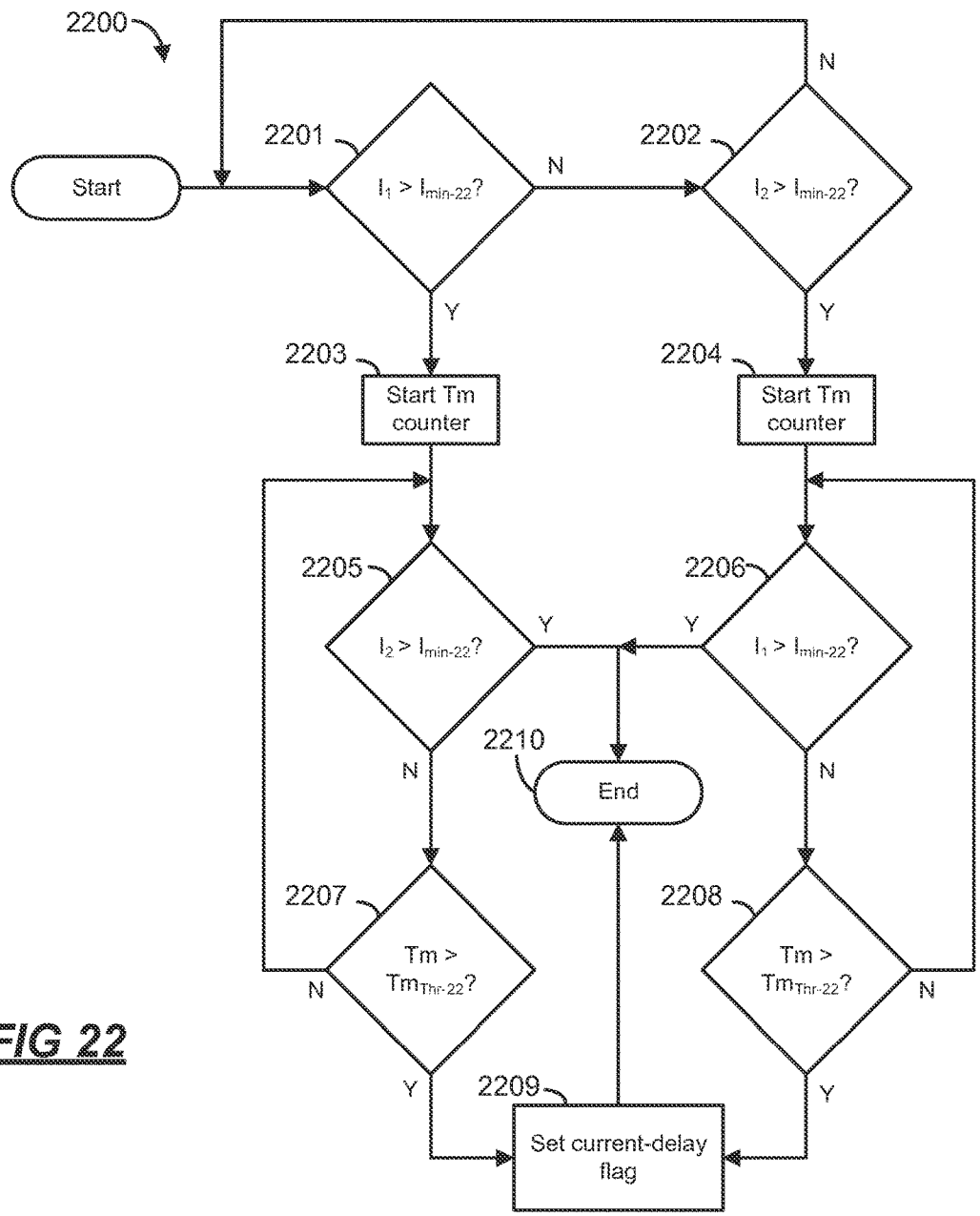
FIG. 22 is a flow chart illustrating a diagnostic algorithm of a sensor module in accordance with the present teachings.

Referring now to FIG. 22, a flow chart illustrating an algorithm 2200 for SM 32 to detect a current delay condition, in a two current sensor system, to detect a lag between two electrical currents $I_1$ and $I_2$. Algorithm 2200 may be one of the diagnostic algorithms performed/monitored by SM 32, as described with reference to step 1308 of FIG. 13 above. Prior to execution of the algorithm, a current-delay flag may have been reset by SM 32.

When SM 32 detects current greater than a current threshold ($I_{min-22}$) from one of the two current sensors, SM 32 may determine whether current indicated by the other current sensor becomes greater than $I_{min-22}$ within a time period threshold ($Tm_{Thr-22}$). In step 2201, SM 32 may determine whether is greater than a current threshold $I_{min-22}$. When $I_1$ is greater than $I_{min-22}$, SM 32 may proceed to step 2203 and start a time counter (Tm). SM 32 may proceed to step 2205 to determine whether $I_2$ is greater than $I_{min-22}$. In step 2205, when $I_2$ is greater than $I_{min-22}$, SM 32 may determine that a current-delay condition does not exist, and end execution of the algorithm in step 2210. In step 2205, when $I_2$ is not greater than $I_{min-22}$, SM 32 may proceed to step 2207 and determine whether Tm is greater than $Tm_{Thr-22}$. In step 2207, when TM is not greater than $TM_{Thr-22}$, SM 32 may loop back to step 2205 to compare $I_2$ with $I_{min-22}$. In step 2207, when Tm is greater than $Tm_{Thr-22}$, the time period has expired and a current-delay condition exists. SM 32 may proceed to step 2209 to set a current-delay flag. SM 32 may end execution of the algorithm 2200 in step 2210. The current-delay flag may be communicated to, or detected by, CM 30 and/or system controller 34. CM 30 and/or system controller 34 may adjust compressor and refrigeration system operation accordingly.

When $I_1$ is not greater than $I_{min-22}$, SM 32 may proceed to step 2202 and determine whether $I_2$ is greater than $I_{min-22}$. When $I_2$ is not greater than $I_{min-22}$, SM 32 loops back to step 2201. When $I_2$ is greater than $I_{min-22}$, SM 32 may proceed to step 2204 to start time Tm counter. SM 32 may proceed to step 2206 to determine whether $I_1$ is greater than $I_{min-22}$. In step 2206, when $I_1$ is greater than $I_{min-22}$, SM 32 may determine that a current-delay condition does not exist, and end execution of the algorithm in step 2210. In step 2206, when $I_1$ is not greater than $I_{min-22}$, SM 32 may proceed to step 2208 and determine whether Tm is greater than $Tm_{Thr-22}$. In step 2208, when TM is not greater than $TM_{Thr-22}$, SM 32 may loop back to step 2206 to compare $I_1$ with $I_{min-22}$. In step 2208, when Tm is greater than $Tm_{Thr-22}$, the time period has expired and a current-delay condition exists. SM 32 may proceed to step 2209 to set the current-delay flag. SM 32 may end execution of the algorithm 2200 in step 2210. As noted above, the current-delay flag may be communicated to, or detected by, CM 30 and/or system controller 34, which may adjust compressor and refrigeration system operation accordingly.

Figure 23:
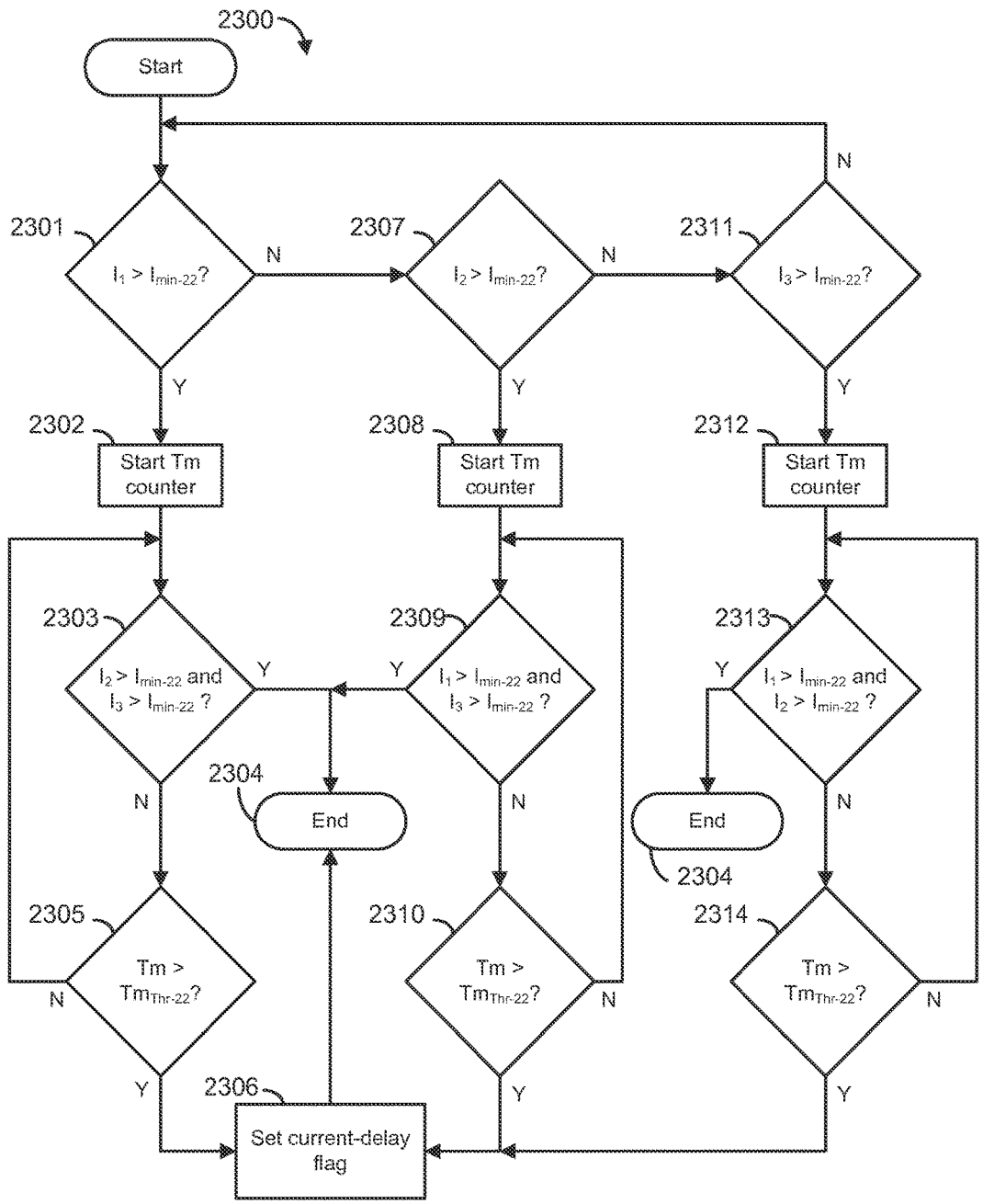
FIG. 23 is a flow chart illustrating a diagnostic algorithm of a sensor module in accordance with the present teachings.

Referring now to FIG. 23, a flow chart illustrating an algorithm 2300 for SM 32 to detect a current delay condition is shown, in a three current sensor system, to detect a lag between three electrical currents $I_1$, $I_2$, and $I_3$. Algorithm 2300 may be one of the diagnostic algorithms performed/monitored by SM 32, as described with reference to step 1308 of FIG. 13 above. Prior to execution of the algorithm, a current-delay flag may have been reset by SM 32.

When SM 32 detects current greater than a current threshold ($I_{min-22}$) from one of the three current sensors, SM 32 may determine whether current indicated by the other current sensors becomes greater than $I_{min-22}$ within a predetermined time period ($Tm_{Thr-22}$). In step 2301, SM 32 may determine whether $I_1$ is greater than a current threshold $I_{min-22}$. When $I_1$ is greater than $I_{min-22}$, SM 32 may proceed to step 2302 and start a time counter (Tm). SM 32 may proceed to step 2303 to determine whether $I_2$ and $I_3$ are greater than $I_{min-22}$. In step 2303, when $I_2$ and $I_3$ are greater than $I_{min-22}$, SM 32 may determine that a current-delay condition does not exist, and end execution of the algorithm in step 2304. In step 2303, when $I_2$ and $I_3$ are not greater than $I_{min-22}$, SM 32 may proceed to step 2305 and determine whether Tm is greater than $Tm_{Thr-22}$. In step 2305, when TM is not greater than $TM_{Thr-22}$, SM 32 may loop back to step 2303 to compare $I_2$ and $I_3$ with $I_{min-22}$. In step 2305, when Tm is greater than $Tm_{Thr-22}$, the time period has expired and a current-delay condition exists. SM 32 may proceed to step 2306 to set a current-delay flag. SM 32 may end execution of the algorithm 2300 in step 2304. The current-delay flag may be communicated to, or detected by, CM 30 and/or system controller 34. CM 30 and/or system controller 34 may adjust compressor and refrigeration system operation accordingly.

In step 2301, when $I_1$ is not greater than $I_{min-22}$, SM 32 may proceed to step 2307 and determine whether $I_2$ is greater than $I_{min-22}$. When $I_2$ is greater than $I_{min-22}$, SM 32 may proceed to step 2308 to start Tm counter. SM 32 may proceed to step 2309 to determine whether $I_1$ and $I_3$ are greater than $I_{min-22}$. In step 2309, when $I_1$ and $I_3$ are greater than $I_{min-22}$, SM 32 may determine that a current-delay condition does not exist, and end execution of the algorithm in step 2304. In step 2309, when $I_1$ and $I_3$ are not greater than $I_{min-22}$, SM 32 may proceed to step 2310 and determine whether Tm is greater than $Tm_{Thr-22}$. In step 2310, when TM is not greater than $TM_{Thr-22}$, SM 32 may loop back to step 2309 to compare $I_1$ and $I_3$ with $I_{min-22}$. In step 2310, when Tm is greater than $Tm_{Thr-22}$, the time period has expired and a current-delay condition exists. SM 32 may proceed to step 2306 to set the current-delay flag. SM 32 may end execution of the algorithm 2300 in step 2304. As noted above, the current-delay flag may be communicated to, or detected by, CM 30 and/or system controller 34, which may adjust compressor and refrigeration system operation accordingly.

In step 2307, when $I_2$ is not greater than $I_{min-22}$, SM 32 may proceed to step 2311 and determine whether $I_3$ is greater than $I_{min-22}$. When $I_3$ is not greater than $I_{min-22}$, SM 32 may loop back to step 2301. When $I_3$ is greater than $I_{min-22}$, SM 32 may proceed to step 2312 to start Tm counter. SM 32 may proceed to step 2313 to determine whether $I_1$ and $I_2$ are greater than $I_{min-22}$. In step 2313, when $I_1$ and $I_2$ are greater than $I_{min-22}$, SM 32 may determine that a current-delay condition does not exist, and end execution of the algorithm in step 2304. In step 2313, when $I_1$ and $I_2$ are not greater than $I_{min-22}$, SM 32 may proceed to step 2314 and determine whether Tm is greater than $Tm_{Thr-22}$. In step 2314, when TM is not greater than $TM_{Thr-22}$, SM 32 may loop back to step 2313 to compare $I_1$ and $I_2$ with $I_{min-22}$. In step 2314, when Tm is greater than $Tm_{Thr-22}$, the time period has expired and a current-delay condition exists. SM 32 may proceed to step 2306 to set the current-delay flag. SM 32 may end execution of the algorithm 2300 in step 2304. As noted above, the current-delay flag may be communicated to, or detected by, CM 30 and/or system controller 34, which may adjust compressor and refrigeration system operation accordingly.

With respect to each of the diagnostic algorithms described above with reference to FIGS. 14 to 23, SM 32 may selectively execute the diagnostic algorithms as needed and as data for the diagnostic algorithms is available. When a communication link is not available, or when data from a connected sensor is not available, due to malfunction or otherwise, SM 32 may disable those portions of the diagnostic algorithms that require the missing communication link or data. In this way, SM 32 may execute those portions of the diagnostic algorithms that are executable, based on the data and communication link(s) available to SM 32.

In this way, SM 32 may monitor electrical current and voltage measurements, make data calculations based on the electrical current and voltage measurements, and execute diagnostic algorithms based on the measurements and based on the calculations. SM 32 may communicate the measurements, the calculations, and the results of the diagnostic algorithms to CM 30 or system controller 34. SM 32 may thereby be able to provide efficient and accurate electrical power measurements and calculations to be utilized by other modules and by users to evaluate operating conditions, power consumption, and efficiency.

What is claimed is:

1. A sensor module for a compressor having an electric motor connected to a power supply, the sensor module comprising:
   a first input connected to a first voltage sensor that generates a voltage signal corresponding to a voltage of said power supply;
   a second input connected to a first current sensor that generates a current signal corresponding to a current of said power supply; and
   a processor connected to said first and second inputs that monitors said first and second inputs and that, based on voltage measurements from said first input and current measurements from said second input, detects an unexpected variation of electric power from said power supply;
   wherein said processor is disposed within an electrical enclosure of said compressor, said electrical enclosure being configured to house electrical terminals for connecting said power supply to said electric motor,
   wherein said power supply includes first, second, and third phases, wherein said voltage signal generated by said first voltage sensor corresponds to said first phase, and wherein said current signal generated by said first current sensor corresponds to said first phase, said sensor module further comprising:
   a third input connected to a second voltage sensor that generates a voltage signal corresponding to a voltage of said second phase; and
   a fourth input connected to a third voltage sensor that generates a voltage signal corresponding to a voltage of said third phase;
   wherein said processor is connected to said third and fourth inputs and detects said unexpected variation of electric power from said power supply based on voltage measurements received from said third and fourth inputs,
   wherein said unexpected variation of electric power includes a phase-loss condition, and
   wherein said processor compares voltage measurements received from said first, third, and fourth inputs and determines that said phase-loss condition exists when voltage measurements from said first input are less than a predetermined percentage of an average of voltage measurements from said third and fourth inputs.

2. The sensor module of claim 1 wherein said processor is disposed within a tamper-resistant enclosure within said electrical enclosure.

3. The sensor module of claim 1 further comprising a communication port for communicating a notification corresponding to said unexpected variation to at least one of a control module for said compressor, a system controller for a system associated with said compressor, a portable computing device, and a network device.

4. The sensor module of claim 1 wherein said processor further detects a no-power condition.

5. The sensor module of claim 4 wherein said processor compares said voltage measurements from said first input with a predetermined voltage threshold and determines that said no-power condition exists when said voltage measurements remain less than said predetermined voltage threshold for a predetermined time period.

6. The sensor module of claim 1 wherein said processor further detects a current-overload condition.

7. The sensor module of claim 6 wherein said processor determines a current maximum threshold, compares said current measurements from said second input with said current maximum threshold, and determines that said current-overload condition exists based on said comparison.

8. The sensor module of claim 1 wherein said processor further detects a voltage-imbalance condition.

9. The sensor module of claim 8 wherein said processor calculates an average of voltage measurements received from said first, third, and fourth inputs and determines that said voltage-imbalance condition based on the greatest of: a difference between voltage measurements from said first input and said average; a difference between voltage measurements from said third input and said average; and a difference between voltage measurements from said fourth input and said average.

10. The sensor module of claim 1 further comprising:
    a fifth input connected to a second current sensor that generates a current signal corresponding to a current of said second phase;
    wherein said processor is connected to said fifth input and detects said unexpected variation of electric power from said power supply further based on current measurements received from said fifth input.

11. The sensor module of claim 10 wherein said processor further detects a current-delay condition.

12. The sensor module of claim 11 wherein said processor determines that said current-delay condition exists when a current measurement from said second input is greater than a predetermined current threshold and a current measurement from said fifth input is not greater than said predetermined current threshold within a predetermined time period.

13. The sensor module of claim 1 wherein said processor further detects a mechanical malfunction including a welded-contactor condition.

14. The sensor module of claim 13 wherein said processor receives run-state data corresponding to a current run-state of said compressor, compares said voltage measurements from said first input with a voltage threshold, and determines that said welded-contactor condition exists based on said current run-state and said comparison.

15. The sensor module of claim 1 wherein said processor further detects a mechanical malfunction including a locked-rotor condition.

16. The sensor module of claim 15 wherein said processor compares said current measurements from said second input with a current threshold and determines that said locked-rotor condition exists when said current measurements are greater than said current threshold.

17. The sensor module of claim 15 wherein said processor generates a buffer of said current measurements from said second input, determines a greatest current value from said buffer, compares said current measurements with said greatest current value from said buffer, and determines that said locked-rotor condition exists when said current measurements are greater than a predetermined percentage of said greatest current value.

18. The sensor module of claim 1 wherein said processor further detects a mechanical malfunction including a protection-trip condition.

19. The sensor module of claim 18 wherein said processor compares said voltage measurements with a voltage threshold and said current measurements with a current threshold and determines that said protection-trip condition exists when said voltage measurements are greater than said voltage threshold and said current measurements are less than said current threshold.

20. A sensor module for a compressor having an electric motor connected to a power supply, the sensor module comprising:
   a first input connected to a first voltage sensor that generates a voltage signal corresponding to a voltage of said power supply;
   a second input connected to a first current sensor that generates a current signal corresponding to a current of said power supply; and
   a processor connected to said first and second inputs that monitors said first and second inputs and that, based on voltage measurements from said first input and current measurements from said second input, detects an unexpected variation of electric power from said power supply;
   wherein said processor is disposed within an electrical enclosure of said compressor, said electrical enclosure being configured to house electrical terminals for connecting said power supply to said electric motor,
   wherein said power supply includes first, second, and third phases, wherein said voltage signal generated by said first voltage sensor corresponds to said first phase, and wherein said current signal generated by said first current sensor corresponds to said first phase, said sensor module further comprising:
      a third input connected to a second voltage sensor that generates a voltage signal corresponding to a voltage of said second phase; and
      a fourth input connected to a third voltage sensor that generates a voltage signal corresponding to a voltage of said third phase,
   wherein said processor is connected to said third and fourth inputs and detects said unexpected variation of electric power from said power supply based on voltage measurements received from said third and fourth inputs,
   wherein said unexpected variation of electric power includes a voltage-imbalance condition, and
   wherein said processor calculates an average of voltage measurements received from said first, third, and fourth inputs and determines that said voltage-imbalance condition based on the greatest of: a difference between voltage measurements from said first input and said average; a difference between voltage measurements from said third input and said average; and a difference between voltage measurements from said fourth input and said average.

21. A sensor module for a compressor having an electric motor connected to a power supply, the sensor module comprising:
   a first input connected to a first voltage sensor that generates a voltage signal corresponding to a voltage of said power supply;
   a second input connected to a first current sensor that generates a current signal corresponding to a current of said power supply; and
   a processor connected to said first and second inputs that monitors said first and second inputs and that, based on voltage measurements from said first input and current measurements from said second input, detects an unexpected variation of electric power from said power supply;
   wherein said processor is disposed within an electrical enclosure of said compressor, said electrical enclosure being configured to house electrical terminals for connecting said power supply to said electric motor,
   wherein said power supply includes first, second, and third phases, wherein said voltage signal generated by said first voltage sensor corresponds to said first phase, and wherein said current signal generated by said first current sensor corresponds to said first phase, said sensor module further comprising:
      a third input connected to a second voltage sensor that generates a voltage signal corresponding to a voltage of said second phase;
      a fourth input connected to a third voltage sensor that generates a voltage signal corresponding to a voltage of said third phase; and
      a fifth input connected to a second current sensor that generates a current signal corresponding to a current of said second phase,
   wherein said processor is connected to said third, fourth, and fifth inputs and detects said unexpected variation of electric power from said power supply based on voltage measurements received from said third and fourth inputs and current measurements received from said fifth input,
   wherein said unexpected variation of electric power includes a current-delay condition, and
   wherein said processor determines that said current-delay condition exists when a current measurement from said second input is greater than a predetermined current threshold and a current measurement from said fifth input is not greater than said predetermined current threshold within a predetermined time period.

22. A sensor module for a compressor having an electric motor connected to a power supply, the sensor module comprising:
   a first input connected to a first voltage sensor that generates a voltage signal corresponding to a voltage of said power supply;

a second input connected to a first current sensor that generates a current signal corresponding to a current of said power supply; and a processor connected to said first and second inputs that monitors said first and second inputs and that, based on voltage measurements from said first input and current measurements from said second input, detects a mechanical malfunction;

wherein said processor is disposed within an electrical enclosure of said compressor, said electrical enclosure being configured to house electrical terminals for connecting said power supply to said electric motor, wherein said mechanical malfunction includes a welded-contactor condition, and wherein said processor receives run-state data corresponding to a current run-state of said compressor, compares said voltage measurements from said first input with a voltage threshold, and determines that said welded-contactor condition exists based on said current run-state and said comparison.

23. A sensor module for a compressor having an electric motor connected to a power supply, the sensor module comprising:

a first input connected to a first voltage sensor that generates a voltage signal corresponding to a voltage of said power supply;

a second input connected to a first current sensor that generates a current signal corresponding to a current of said power supply; and a processor connected to said first and second inputs that monitors said first and second inputs and that, based on voltage measurements from said first input and current measurements from said second input, detects a mechanical malfunction;

wherein said processor is disposed within an electrical enclosure of said compressor, said electrical enclosure being configured to house electrical terminals for connecting said power supply to said electric motor, wherein said mechanical malfunction includes a locked-rotor condition, and wherein said processor compares said current measurements from said second input with a current threshold and determines that said locked-rotor condition exists when said current measurements are greater than said current threshold.

24. A sensor module for a compressor having an electric motor connected to a power supply, the sensor module comprising:

a first input connected to a first voltage sensor that generates a voltage signal corresponding to a voltage of said power supply;

a second input connected to a first current sensor that generates a current signal corresponding to a current of said power supply; and a processor connected to said first and second inputs that monitors said first and second inputs and that, based on voltage measurements from said first input and current measurements from said second input, detects a mechanical malfunction;

wherein said processor is disposed within an electrical enclosure of said compressor, said electrical enclosure being configured to house electrical terminals for connecting said power supply to said electric motor, wherein said mechanical malfunction includes a locked-rotor condition, and wherein said processor generates a buffer of said current measurements from said second input, determines a greatest current value from said buffer, compares said current measurements with said greatest current value from said buffer, and determines that said locked-rotor condition exists when said current measurements are greater than a predetermined percentage of said greatest current value.

25. A sensor module for a compressor having an electric motor connected to a power supply, the sensor module comprising:

a first input connected to a first voltage sensor that generates a voltage signal corresponding to a voltage of said power supply;

a second input connected to a first current sensor that generates a current signal corresponding to a current of said power supply; and a processor connected to said first and second inputs that monitors said first and second inputs and that, based on voltage measurements from said first input and current measurements from said second input, detects a mechanical malfunction;

wherein said processor is disposed within an electrical enclosure of said compressor, said electrical enclosure being configured to house electrical terminals for connecting said power supply to said electric motor, wherein said mechanical malfunction includes a protection-trip condition, and wherein said processor compares said voltage measurements with a voltage threshold and said current measurements with a current threshold and determines that said protection-trip condition exists when said voltage measurements are greater than said voltage threshold and said current measurements are less than said current threshold.

* * * * *